(12) United States Patent
Chang et al.

(10) Patent No.: US 12,349,408 B2
(45) Date of Patent: Jul. 1, 2025

(54) TRANSISTOR GATE CONTACTS AND METHODS OF FORMING THE SAME

(71) Applicant: Taiwan Semiconductor Manufacturing Co., Ltd., Hsinchu (TW)

(72) Inventors: Cheng-Wei Chang, Taipei (TW); Shahaji B. More, Hsinchu (TW); Yi-Ying Liu, Hsinchu (TW); Shuen-Shin Liang, Hsinchu (TW); Sung-Li Wang, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 425 days.

(21) Appl. No.: 17/686,055

(22) Filed: Mar. 3, 2022

(65) Prior Publication Data

US 2023/0231025 A1    Jul. 20, 2023

Related U.S. Application Data

(60) Provisional application No. 63/256,186, filed on Oct. 15, 2021.

(51) Int. Cl.
| | |
|---|---|
| *H10D 30/67* | (2025.01) |
| *H01L 21/762* | (2006.01) |
| *H10D 30/01* | (2025.01) |
| *H10D 62/10* | (2025.01) |
| *H10D 84/83* | (2025.01) |
| *H10D 84/01* | (2025.01) |
| *H10D 84/03* | (2025.01) |

(52) U.S. Cl.
CPC ....... *H10D 30/6735* (2025.01); *H01L 21/762* (2013.01); *H10D 30/021* (2025.01); *H10D 30/6757* (2025.01); *H10D 62/121* (2025.01); *H10D 84/83* (2025.01); *H10D 84/0158* (2025.01); *H10D 84/038* (2025.01)

(58) Field of Classification Search
CPC ....... H01L 21/823431; H01L 29/42392; H01L 29/78696; H01L 29/0673; B28Y 10/00
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |

(Continued)

FOREIGN PATENT DOCUMENTS

TW    202109629 A    3/2021

*Primary Examiner* — Hsien Ming Lee
(74) *Attorney, Agent, or Firm* — Slater Matsil, LLP

(57) ABSTRACT

In an embodiment, a device includes: a first insulating fin; a second insulating fin; a nanostructure between the first insulating fin and the second insulating fin; and a gate structure wrapping around the nanostructure, a top surface of the gate structure disposed above a top surface of the first insulating fin, the top surface of the gate structure disposed below a top surface of the second insulating fin.

20 Claims, 48 Drawing Sheets

(56) References Cited

U.S. PATENT DOCUMENTS

| | | |
|---|---|---|
| 9,576,814 B2 | 2/2017 | Wu et al. |
| 9,608,116 B2 | 3/2017 | Ching et al. |
| 11,114,529 B2 | 9/2021 | Chiang et al. |
| 2019/0067120 A1 | 2/2019 | Ching et al. |
| 2020/0343377 A1* | 10/2020 | Chiang ........... H01L 21/823814 |
| 2023/0029354 A1* | 1/2023 | Liaw .................. H01L 29/6681 |

* cited by examiner

TRANSISTOR GATE CONTACTS AND METHODS OF FORMING THE SAME

PRIORITY CLAIM AND CROSS-REFERENCE

This application claims the benefit of U.S. Provisional Application No. 63/256,186, filed on Oct. 15, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
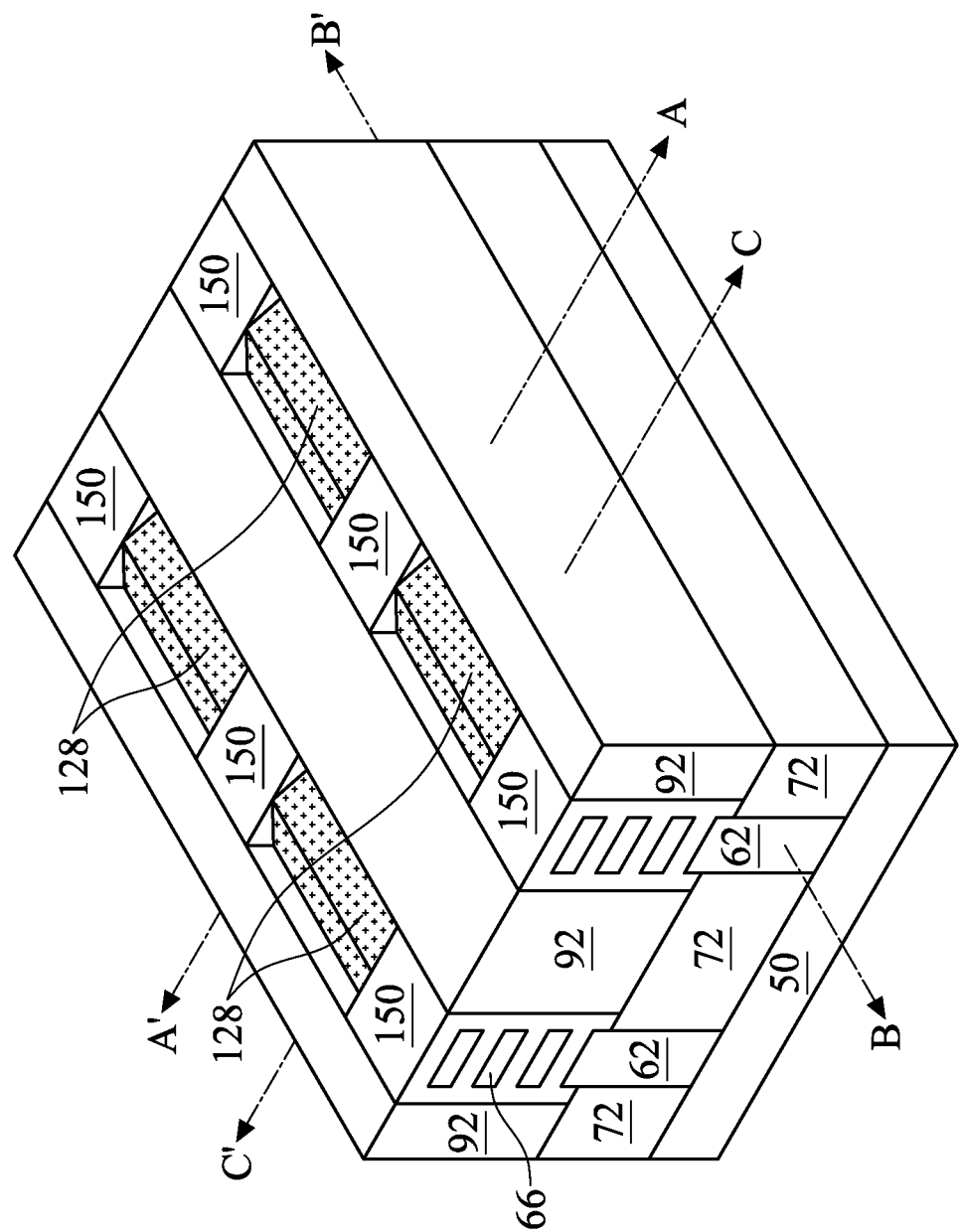
FIG. 1 illustrates an example of nanostructure field-effect transistors (nano-FETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a first insulating fin (also referred to as hybrid fins or dielectric fins) and a second insulating fin of different heights are formed. As such, a gate structure for transistors may be formed to extend over the first insulating fin, but not over the second insulating fin. The gate structure may thus be shared between some transistors (e.g., those separated by the first insulating fin), but not other transistors (e.g., those separated by the second insulating fin). Sharing the gate structures in such a manner may be particularly advantages for some types of devices, such as static random-access memory (SRAM) cells.

Embodiments are described in a particular context, a die including nano-FETs. Various embodiments may be applied, however, to dies including other types of transistors (e.g., fin field-effect transistors (finFETs), planar transistors, or the like) in lieu of or in combination with the nano-FETs.

FIG. 1 illustrates an example of nano-FETs (e.g., nanowire FETs, nanosheet FETs, or the like), in accordance with some embodiments. FIG. 1 is a three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 66 (e.g., nanosheets, nanowires, or the like) over semiconductor fins 62 on a substrate 50 (e.g., a semiconductor substrate), with the nanostructures 66 acting as channel regions for the nano-FETs. The nanostructures 66 may include p-type nanostructures, n-type nanostructures, or a combination thereof. Isolation regions 72, such as shallow trench isolation (STI) regions, are disposed between adjacent semiconductor fins 62, which may protrude above and from between adjacent isolation regions 72. Although the isolation regions 72 are described/illustrated as being separate from the substrate 50, as used herein, the term "substrate" may refer to the semiconductor substrate alone or a combination of the semiconductor substrate and the isolation regions. Additionally, although the bottom portions of the semiconductor fins 62 are illustrated as being separate from the substrate 50, the bottom portions of the semiconductor fins 62 may be single, continuous materials with the substrate 50. In this context, the semiconductor fins 62 refer to the portion extending above and from between the adjacent isolation regions 72.

Gate structures 150 are over top surfaces of the semiconductor fins 62 and along top surfaces, sidewalls, and bottom surfaces of the nanostructures 66. Epitaxial source/drain regions 128 are disposed on the semiconductor fins 62 at opposing sides of the gate structures 150. Insulating fins 92, also referred to as hybrid fins or dielectric fins, are disposed over the isolation regions 72, and are between adjacent epitaxial source/drain regions 128. The insulating fins 92 block epitaxial growth to prevent coalescing of some of the epitaxial source/drain regions 128 during epitaxial growth. For example, the insulating fins 92 may be formed at cell boundaries to separate the epitaxial source/drain regions 128 of adjacent cells.

FIG. 1 further illustrates reference cross-sections that are used in later figures. Cross-section A-A' is along a longitudinal axis of a gate structure 150 and in a direction, for example, perpendicular to a direction of current flow between the epitaxial source/drain regions 128 of a nano-FET. Cross-section B-B' is along a longitudinal axis of a semiconductor fin 62 and in a direction of, for example, a current flow between the epitaxial source/drain regions 128 of the nano-FET. Cross-section C-C' is parallel to cross-section A-A' and extends through epitaxial source/drain regions 128 of the nano-FETs. Subsequent figures refer to these reference cross-sections for clarity.

Figure 2:
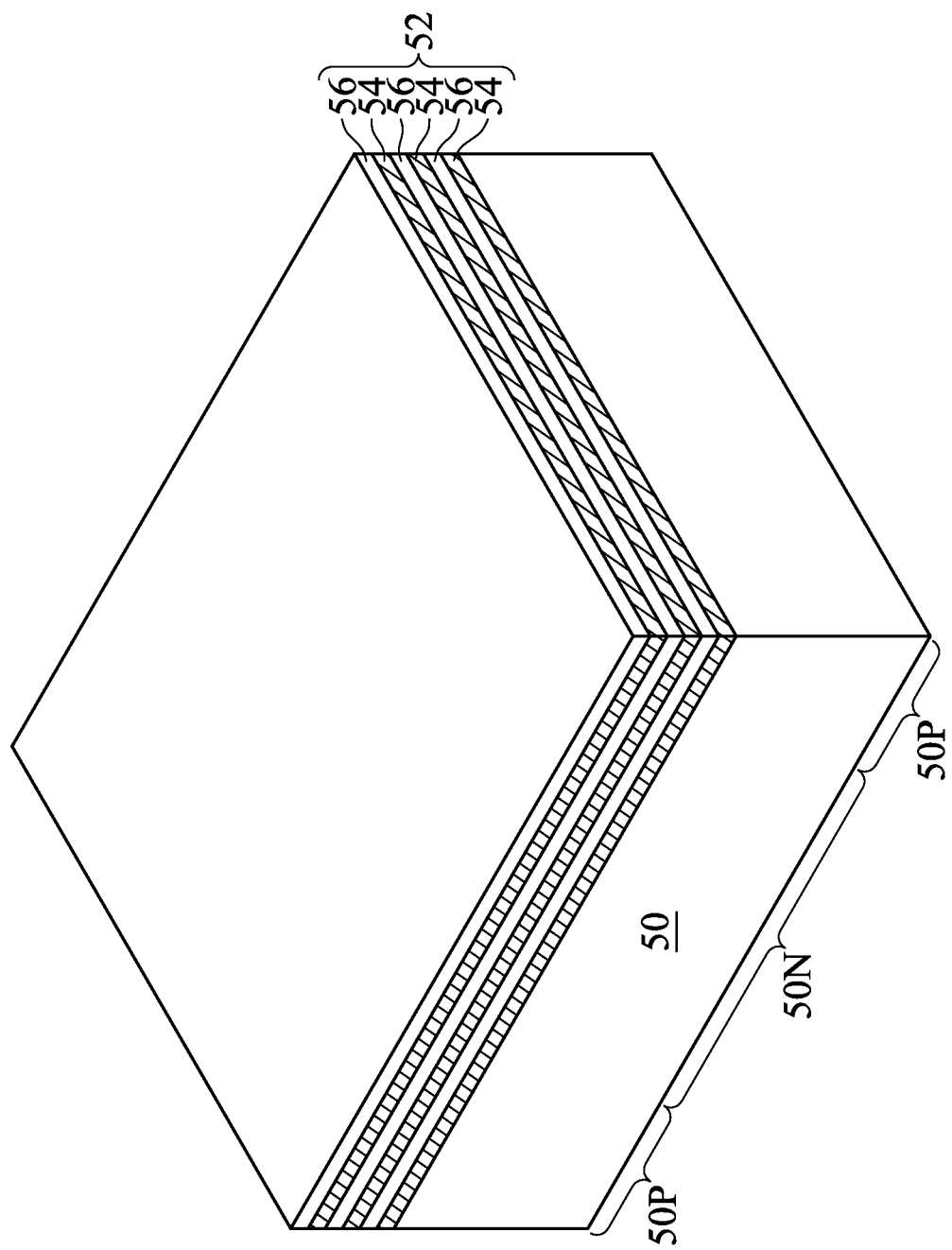
FIGS. 2, 3, 4, 5, 6, 7, 8, 9, 10, 11, 12, 13, 14, 15, 16, 17A, 17B, 18A, 18B, 19A, 19B, 20A, 20B, 20C, 21A, 21B, 22A, 22B, 23A, 23B, 24A, 24B, 25A, 25B, 26A, 26B, 27A, 27B, 28A, 28B, 29A, and 29B, are views of intermediate stages in the manufacturing of nano-FETs, in accordance with some embodiments.
Figure 3:
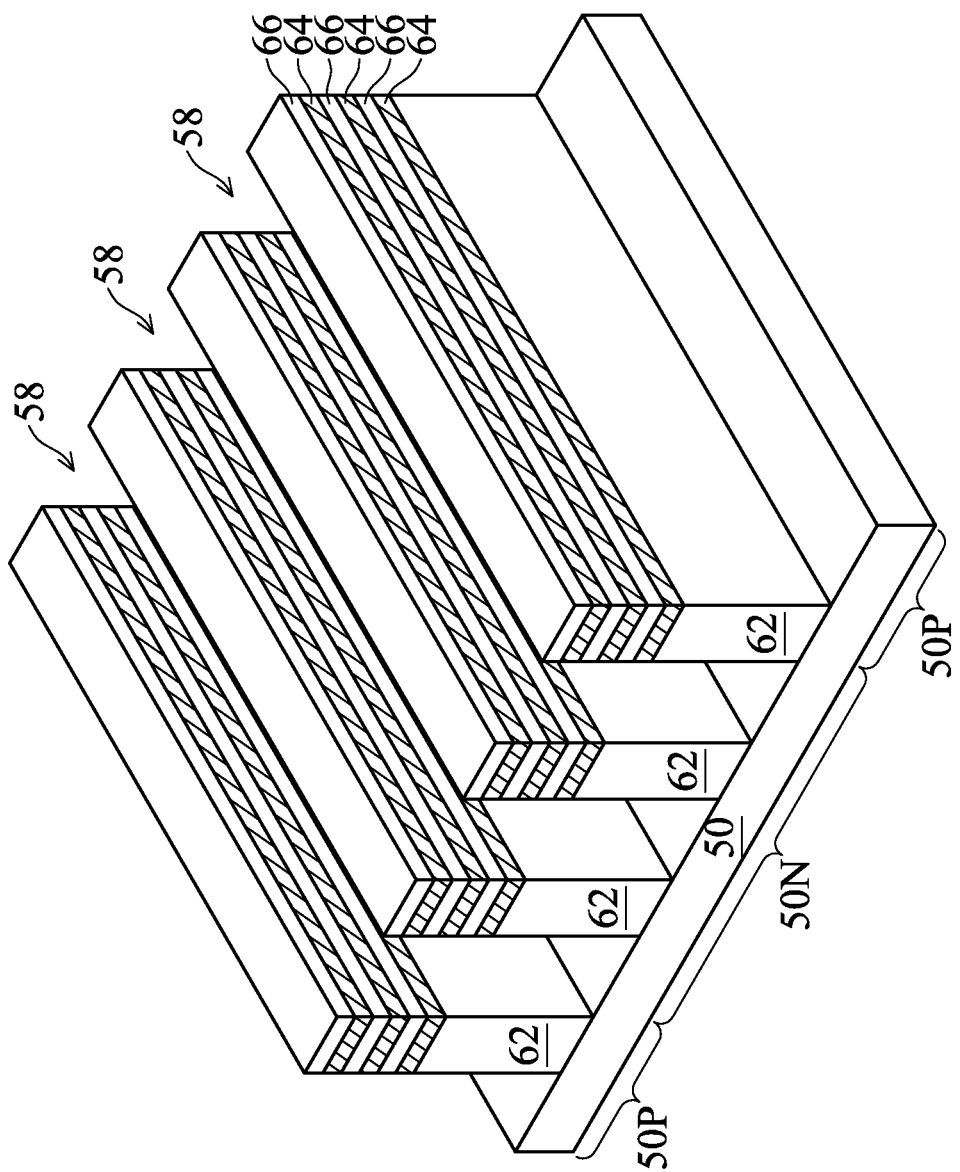
Figure 4:
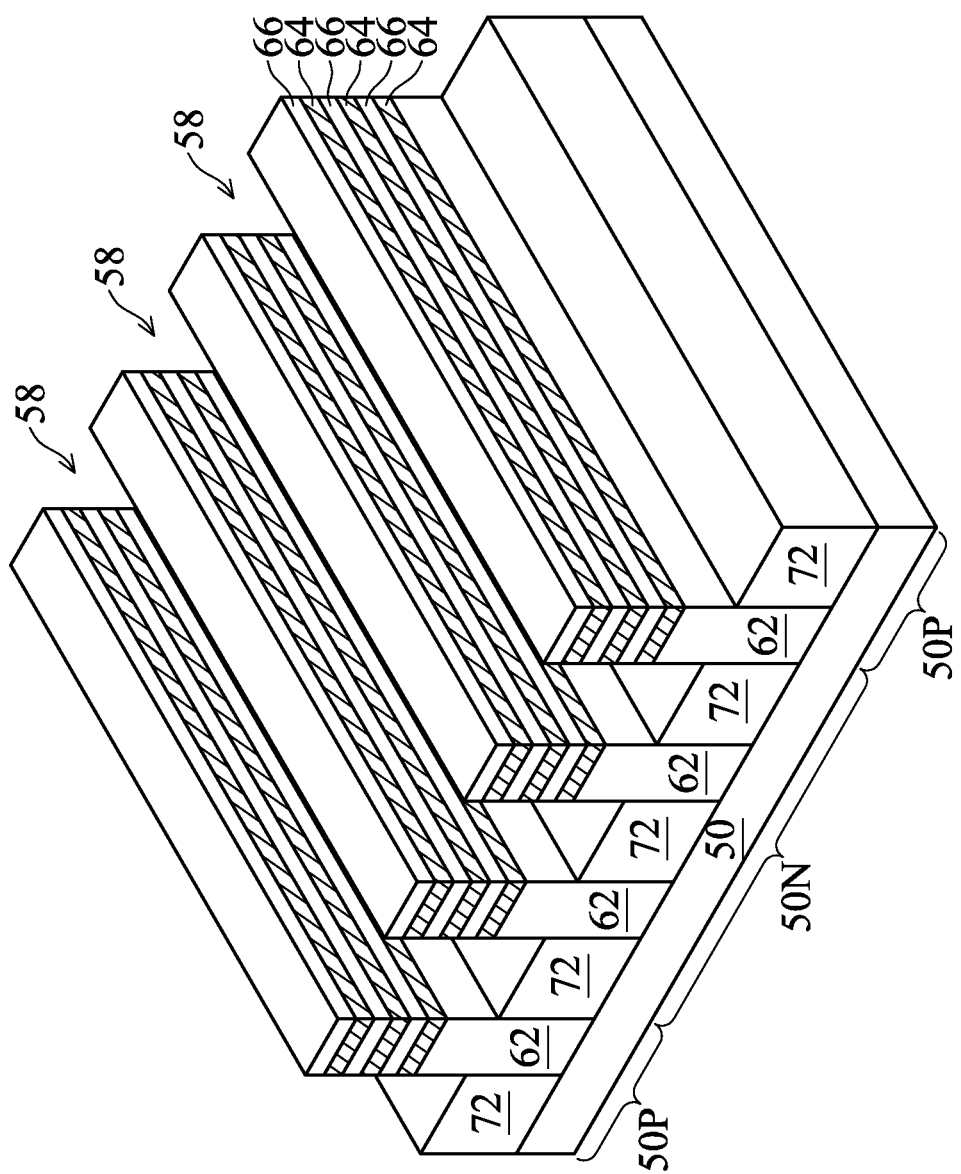

FIGS. 2-29B are views of intermediate stages in the manufacturing of nano-FETs, in accordance with some embodiments. FIGS. 2, 3, and 4 are three-dimensional views. FIGS. 5, 6, 7, 8, 9, 10, 11, 12, 13, 14, 15, and 16 are cross-sectional views illustrated along a similar cross-section as either of reference cross-sections A-A' or C-C' in FIG. 1. FIGS. 17A, 18A, 19A, 20A, 21A, 22A, 23A, 24A, 25A, 26A, 27A, 28A, and 29A are cross-sectional views illustrated along a similar cross-section as reference cross-section A-A' in FIG. 1. FIGS. 17B, 18B, 19B, 20B, 21B, 22B, 23B, 24B, 25B, 26B, 27B, 28B, and 29B are cross-sectional views illustrated along a similar cross-section as reference cross-section B-B' in FIG. 1. FIG. 20C is a cross-sectional view illustrated along a similar cross-section as reference cross-section C-C' in FIG. 1.

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has one or more n-type regions 50N and one or more p-type regions 50P. The n-type regions 50N can be for forming n-type devices, such as NMOS transistors, e.g., n-type nano-FETs, and the p-type regions 50P can be for forming p-type devices, such as PMOS transistors, e.g., p-type nano-FETs. The n-type regions 50N may be physically separated from the p-type regions 50P, and any number of device features (e.g., other active devices, doped regions, isolation structures, etc.) may be disposed between the n-type regions 50N and the p-type regions 50P. Although one n-type region 50N and two p-type regions 50P are illustrated, any number of n-type regions 50N and p-type regions 50P may be provided.

The devices in the n-type regions 50N and the p-type regions 50P may be subsequently interconnected by metallization layers in an overlying interconnect structure to form integrated circuits. The overlying interconnect structure can be formed in a back end of line (BEOL) process. The integrated circuits may be logic devices, memory devices, or the like. In some embodiments, the integrated circuits are memory devices such as SRAM cells. In such embodiments, respective one of the n-type regions 50N are disposed between respective pairs of the p-type regions 50P. Other acceptable integrated circuits may be formed, and the n-type regions 50N and the p-type regions 50P may be provided in any acceptable manner for the integrated circuits.

The substrate 50 may be lightly doped with a p-type or an n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in each of the n-type regions 50N and the p-type regions 50P. The APT region may extend under the source/drain regions in the nano-FETs. The APT region may be used to reduce the leakage from the source/drain regions to the substrate 50. In some embodiments, the doping concentration in the APT region is in the range of $10^{18}$ cm$^{-3}$ to $10^{19}$ cm$^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three of the first semiconductor layers 54 and three of the second semiconductor layers 56. It should be appreciated that the multi-layer stack 52 may include any number of the first semiconductor layers 54 and the second semiconductor layers 56. For example, the multi-layer stack 52 may include from one to ten layers of each of the first semiconductor layers 54 and the second semiconductor layers 56. Each of the layers may have a small thickness, such as a thickness in the range of 4 nm to 6 nm. In some embodiments, the multi-layer stack 52 has an overall height in the range of 20 nm to 90 nm.

In the illustrated embodiment, and as will be subsequently described in greater detail, the first semiconductor layers 54 will be removed and the second semiconductor layers 56 will patterned to form channel regions for the nano-FETs in both the n-type regions 50N and the p-type regions 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nano-FETs in one type of region (e.g., the p-type regions 50P), and the second semiconductor layers 56 will be patterned to form channel regions for nano-FETs in another type of region (e.g., the n-type regions 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type regions 50N, and the second semiconductor layers 56 may be removed without removing the first semiconductor layers 54 in the p-type regions 50P.

In FIG. 3, trenches 58 are patterned in the substrate 50 and the multi-layer stack 52 to form semiconductor fins 62, nanostructures 64, and nanostructures 66. The semiconductor fins 62 are semiconductor strips patterned in the substrate 50. The nanostructures 64 and the nanostructures 66 include the remaining portions of the first semiconductor layers 54 and the second semiconductor layers 56, respectively. The trenches 58 may be patterned by any acceptable etching process, such as a reactive ion etch (RIE), neutral beam etch (NBE), the like, or a combination thereof. The etching may be anisotropic.

The semiconductor fins 62 and the nanostructures 64, 66 may be patterned by any suitable method. For example, the semiconductor fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask to pattern the semiconductor fins 62 and the nanostructures 64, 66.

In the illustrated embodiment, the semiconductor fins 62 and the nanostructures 64, 66 have substantially equal widths in the n-type regions 50N and the p-type regions 50P. The semiconductor fins 62 and the nanostructures 64, 66 in one type of region (e.g., the n-type regions 50N) may be wider or narrower than the semiconductor fins 62 and the nanostructures 64, 66 in another type of region (e.g., the p-type regions 50P). In some embodiments, the nanostructures 64, 66 in the n-type regions 50N each have a width in the range of 40 nm to 50 nm, and the nanostructures 64, 66 in the p-type regions 50P each have a width in the range of 20 nm to 30 nm, with the nanostructures 64, 66 in the n-type regions 50N being wider than the nanostructures 64, 66 in the p-type regions 50P.

Further, while each of the semiconductor fins 62 and the nanostructures 64, 66 are illustrated as having a consistent width throughout, in other embodiments, the semiconductor fins 62 and/or the nanostructures 64, 66 may have tapered sidewalls such that a width of each of the semiconductor fins 62 and/or the nanostructures 64, 66 continuously increases in a direction towards the substrate 50. In such embodiments, each of the nanostructures 64, 66 may have a different width and be trapezoidal in shape.

In FIG. 4, STI regions 72 are formed over the substrate 50 and between adjacent semiconductor fins 62. The STI regions 72 are disposed around at least a portion of the semiconductor fins 62 such that at least portions of the nanostructures 64, 66 protrude from between adjacent STI regions 72. In the illustrated embodiment, the top surfaces of the STI regions 72 are below the top surfaces of the semiconductor fins 62. In some embodiments, the top surfaces of the STI regions 72 are above or coplanar (within process variations) with the top surfaces of the semiconductor fins 62.

The STI regions 72 may be formed by any suitable method. For example, an insulation material can be formed over the substrate 50 and the nanostructures 64, 66, and in the trenches 58 such that the insulation material is between adjacent semiconductor fins 62. The insulation material may be an oxide, such as silicon oxide, a nitride, such as silicon nitride, the like, or a combination thereof, which may be formed by a chemical vapor deposition (CVD) process, such as high-density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI regions 72 are each illustrated as a single layer, some embodiments may utilize multiple layers. For example, in some embodiments a liner (not separately illustrated) may first be formed along surfaces of the substrate 50, the semiconductor fins 62, and the nanostructures 64, 66. Thereafter, an insulation material, such as those previously described may be formed over the liner.

A removal process is then applied to the insulation material to remove excess portions of the insulation material outside of the trenches 58, which excess portions are over the nanostructures 64, 66. In some embodiments, a planarization process such as a chemical mechanical polish (CMP), an etching process, combinations thereof, or the like may be utilized. In some embodiments in which a mask remains on the nanostructures 64, 66, the planarization process may expose the mask or remove the mask. After the planarization process, the top surfaces of the insulation material and the mask (if present) or the nanostructures 64, 66 are coplanar (within process variations). Accordingly, the top surfaces of the mask (if present) or the nanostructures 64, 66 are exposed through the insulation material. In the illustrated embodiment, the mask is removed from the nanostructures 64, 66. The insulation material is then recessed to form the STI regions 72. The insulation material is recessed such that at least portions of the nanostructures 64, 66 protrude from between adjacent portions of the insulation material. Further, the top surfaces of the STI regions 72 may have a flat surface as illustrated, a convex surface, a concave surface (such as dishing), or a combination thereof by applying an appropriate etch. The insulation material may be recessed using any acceptable etching process, such as one that is selective to the material of the insulation material (e.g., selectively etches the insulation material of the STI regions 72 at a faster rate than the materials of the semiconductor fins 62 and the nanostructures 64, 66). For example, an oxide removal may be performed using dilute hydrofluoric (dHF) acid as an etchant.

The process previously described is just one example of how the semiconductor fins 62 and the nanostructures 64, 66 may be formed. In some embodiments, the semiconductor fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the semiconductor fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the nanostructures 64, 66, the semiconductor fins 62, and/or the substrate 50. The wells may have a conductivity type opposite from a conductivity type of source/drain regions that will be subsequently formed in each of the n-type regions 50N and the p-type regions 50P. In some embodiments, p-type wells are formed in the n-type regions 50N, and n-type wells are formed in the p-type regions 50P. In some embodiments, p-type wells or n-type wells are formed in both the n-type regions 50N and the p-type regions 50P.

In embodiments with different well types, different implant steps for the n-type regions 50N and the p-type regions 50P may be achieved using a mask (not separately illustrated) such as a photoresist. For example, a photoresist may be formed over the semiconductor fins 62, the nanostructures 64, 66, and the STI regions 72 in the n-type regions 50N. The photoresist is patterned to expose the p-type regions 50P. The photoresist can be formed by using a spin-on technique and can be patterned using acceptable photolithography techniques. Once the photoresist is patterned, an n-type impurity implant is performed in the p-type regions 50P, and the photoresist may act as a mask to substantially prevent n-type impurities from being implanted into the n-type regions 50N. The n-type impurities may be phosphorus, arsenic, antimony, or the like implanted in the regions to a concentration in the range of $10^{13}$ cm$^{-3}$ to $10^{14}$ cm$^{-3}$. After the implant, the photoresist may be removed, such as by any acceptable ashing process.

Following or prior to the implanting of the p-type regions 50P, a mask (not separately illustrated) such as a photoresist is formed over the semiconductor fins 62, the nanostructures 64, 66, and the STI regions 72 in the p-type regions 50P. The photoresist is patterned to expose the n-type regions 50N. The photoresist can be formed by using a spin-on technique and can be patterned using acceptable photolithography techniques. Once the photoresist is patterned, a p-type impurity implant is performed in the n-type regions 50N, and the photoresist may act as a mask to substantially prevent p-type impurities from being implanted into the p-type regions 50P. The p-type impurities may be boron, boron fluoride, indium, or the like implanted in the regions to a concentration in the range of $10^{13}$ cm$^{-3}$ to $10^{14}$ cm$^{-3}$. After the implant, the photoresist may be removed, such as by any acceptable ashing process.

After the implants of the n-type regions 50N and the p-type regions 50P, an anneal may be performed to repair implant damage and to activate the p-type and/or n-type impurities that were implanted. In some embodiments where epitaxial structures are epitaxially grown for the semiconductor fins 62 and/or the nanostructures 64, 66, the grown materials may be in situ doped during growth, which may obviate the implantations, although in situ and implantation doping may be used together.

FIGS. 5-29B illustrate various additional steps in the manufacturing of embodiment devices. As will be subsequently described in greater detail, insulating fins 92 (see FIG. 11) will be formed between the semiconductor fins 62. FIGS. 5, 6, 7, 8, 9, 10, 11, 12, 13, 14, 15, 16, 17A, 18A, 19A, 20A, 20C, 21A, 22A, 23A, 24A, 25A, 26A, 27A, 28A, and 29A each illustrate four semiconductor fins 62 and portions of the insulating fins 92 and the STI regions 72 that are disposed between the four semiconductor fins 62 in the respective cross-sections. FIGS. 17B, 18B, 19B, 20B, 21B, 22B, 23B, 24B, 25B, 26B, 27B, 28B, and 29B illustrate a semiconductor fin 62 and structures formed on it in either of the n-type regions 50N and the p-type regions 50P. For example, the structures illustrated may be applicable to both the n-type regions 50N and the p-type regions 50P. Differences (if any) in the structures of the n-type regions 50N and the p-type regions 50P are described in the text accompanying each figure.

Figure 5:
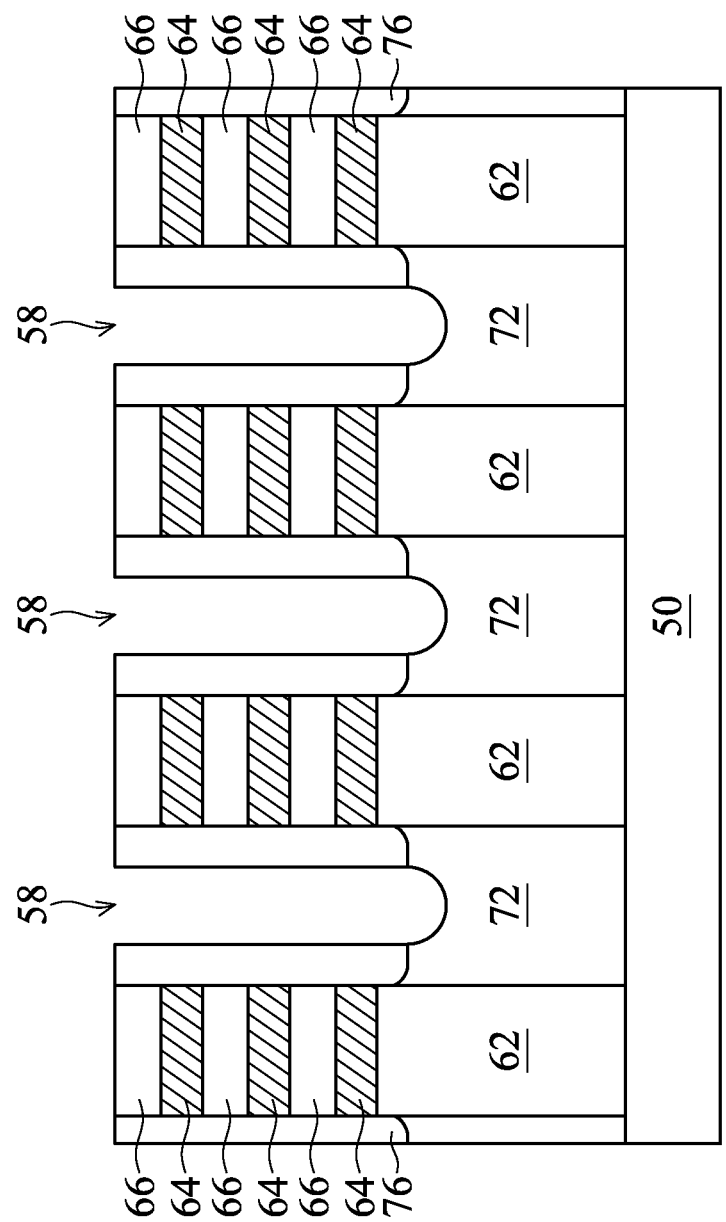

In FIG. 5, sacrificial spacers 76 are formed on the sidewalls of the semiconductor fins 62 and the nanostructures 64, 66, and further on the top surface of the STI regions 72. The sacrificial spacers 76 may be formed by conformally forming a sacrificial material in the trenches 58 and patterning the sacrificial material. The sacrificial material may be one selected from the candidate semiconductor materials of the substrate 50, which may be grown by a process such as vapor phase epitaxy (VPE) or molecular beam epitaxy (MBE), deposited by a process such as chemical vapor deposition (CVD) or atomic layer deposition (ALD), or the like. For example, the sacrificial material may be silicon or silicon germanium. The sacrificial material may be patterned using an etching process, such as a dry etch, a wet etch, or a combination thereof. The etching process may be anisotropic. As a result of the etching process, the portions of the sacrificial material over the nanostructures 64, 66 are removed, and the STI regions 72 between the nanostructures 64, 66 are partially exposed. The sacrificial spacers 76 include the remaining portions of the sacrificial material in the trenches 58. The etching process may also extend the trenches 58 into upper portions of the STI regions 72, which allows the subsequently formed insulating fins to extend into the upper portions of the STI regions 72, thereby grounding the subsequently formed insulating fins and increasing the stability of the subsequently formed insulating fins.

In subsequent process steps, a dummy gate layer 102 is deposited over portions of the sacrificial spacers 76 (see below, FIGS. 17A-17B), and the dummy gate layer 102 is patterned to form dummy gates 112 (see below, FIGS. 18A-18B). The dummy gates 112, the underlying portions of the sacrificial spacers 76, and the nanostructures 64 are then collectively replaced with functional gate structures. Specifically, the sacrificial spacers 76 are used as temporary spacers during processing to delineate boundaries of insulating fins, and the sacrificial spacers 76 and the nanostructures 64 will be subsequently removed and replaced with gate structures that are wrapped around the nanostructures 66. The sacrificial spacers 76 are formed of a material that has a high etching selectivity from the etching of the material of the nanostructures 66. For example, the sacrificial spacers 76 may be formed of the same semiconductor material as the nanostructures 64 so that the sacrificial spacers 76 and the nanostructures 64 may be removed in a single process step. Alternatively, the sacrificial spacers 76 may be formed of a different material from the nanostructures 66.

FIGS. 6-11 illustrate a formation of insulating fins 92 (also referred to as hybrid fins or dielectric fins) between the sacrificial spacers 76 adjacent to the semiconductor fins 62 and nanostructures 64, 66. The insulating fins 92 may insulate and physically separate subsequently formed source/drain regions (see below, FIG. 20C) from each other.

Figure 6:
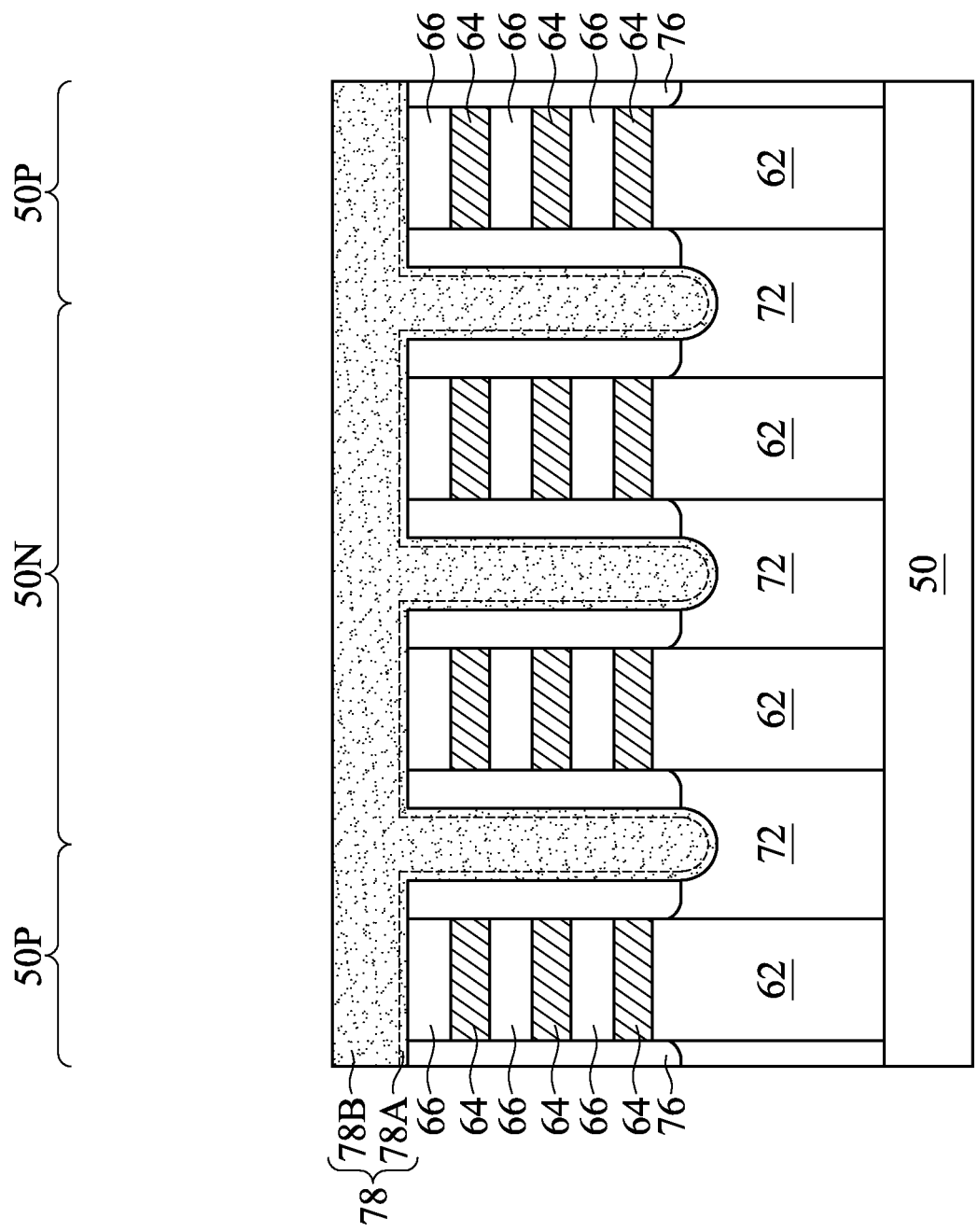

In FIG. 6, one or more insulating layer(s) 78 for lower portions of insulating fins are formed in the trenches 58. As will be subsequently described, the insulating layer(s) 78 may be formed of one or more dielectric material(s) having a high etching selectivity from the etching of the semiconductor fins 62, the nanostructures 64, 66, and the sacrificial spacers 76. For example, the insulating layer(s) 78 may be formed of low-k dielectric materials. In some embodiments, the insulating layer(s) 78 include a liner 78A and a fill material 78B over the liner 78A.

The liner 78A is conformally formed over exposed surfaces of the semiconductor fins 62, the nanostructures 64, 66, the STI regions 72, and the sacrificial spacers 76. In some embodiments, the liner 78A is formed of a nitride such as silicon nitride, silicon carbonitride, silicon oxycarbonitride, or the like, which may be formed by any acceptable deposition process such as atomic layer deposition (ALD), chemical vapor deposition (CVD), physical vapor deposition (PVD), or the like. In some embodiments, the liner 78A is formed of silicon carbonitride by ALD, and the silicon carbonitride may have a high carbon concentration (such as in the range of 4 at % to 15 at %) and may have a high nitrogen concentration (such as in the range of 4 at % to 25 at %). The liner 78A may reduce oxidation of the sacrificial spacers 76 during the subsequent formation of the fill material 78B, which may be useful for a subsequent removal of the sacrificial spacers 76.

The fill material 78B is conformally formed over the liner 78A, and fills the remaining portions of the trenches 58 which are not filled by the sacrificial spacers 76 or the liner 78A. In some embodiments, the fill material 78B is formed of an oxide such as silicon oxide, silicon oxynitride, silicon oxycarbonitride, silicon oxycarbide, or the like, which may be formed by any acceptable deposition process such as ALD, CVD, PVD, or the like. The fill material 78B may form the bulk of the lower portions of the insulating fins 92 (see FIG. 11) to insulate subsequently formed source/drain regions (see FIG. 20C) from each other.

Figure 7:
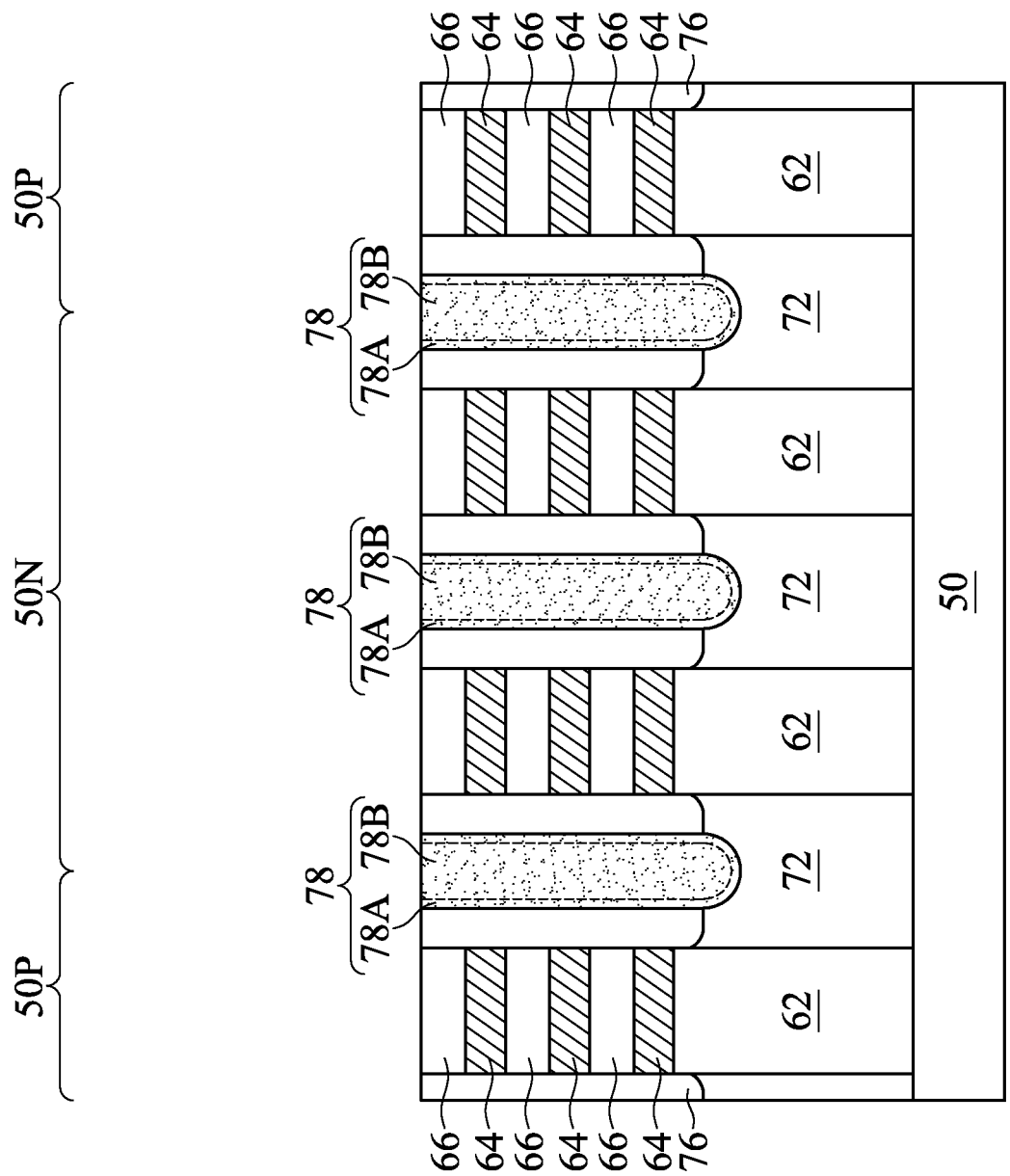

In FIG. 7, a removal process is applied to the insulating layer(s) 78 to remove excess portions of the insulating layer(s) 78 outside of the trenches 58, which excess portions are over the nanostructures 64, 66 and the sacrificial spacers 76. A planarization process such as a chemical mechanical polish (CMP), an etching process, combinations thereof, or the like may be utilized. After the planarization process, top surfaces of the sacrificial spacers 76 and the insulating layer(s) 78 (e.g., the liner 78A and the fill material 78B) may be coplanar (within process variations).

Figure 8:
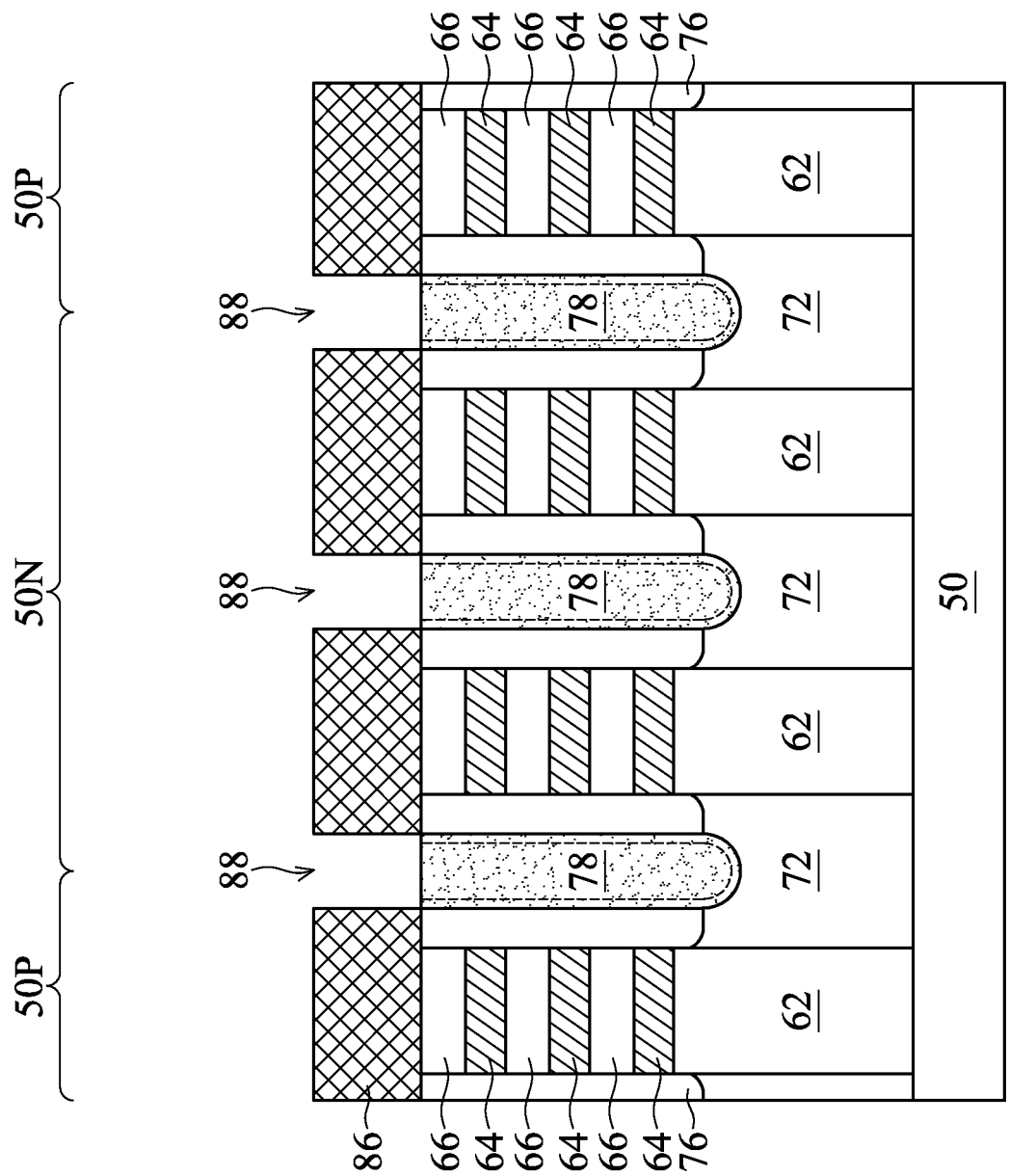

In FIG. 8, a mask 86 is formed over the nanostructures 64, 66, the sacrificial spacers 76, and the insulating layer(s) 78. The mask 86 has a pattern of openings 88 exposing the insulating layer(s) 78. The mask 86 can be formed of a photoresist, such as a single layer photoresist, a bi-layer photoresist, a tri-layer photoresist, or the like. In some embodiments, the mask 86 is a tri-layer mask including a bottom layer (e.g., a bottom anti-reflective coating (BARC) layer), a middle layer (e.g., a nitride, an oxide, an oxynitride, or the like), and a top layer (e.g., a photoresist). The type of mask used (e.g., single layer mask, bilayer mask, tri-layer mask, etc.) may depend on the photolithography process used to subsequently pattern the mask 86. For example, in extreme ultraviolet (EUV) lithography processes, the mask 86 may be a single layer mask or a bilayer mask. The mask 86 may be formed by spin coating, a deposition process such as CVD, combinations thereof, or the like.

The openings 88 can be patterned in the mask 86 using acceptable photolithography techniques. In embodiments where the mask 86 is a photoresist, the photoresist can be patterned by exposing the photoresist to a patterned energy source (e.g., a patterned light source) so as to induce a chemical reaction, thus inducing a physical change in those portions of the photoresist exposed to the patterned light source. The photoresist can then be developed by applying a developer to the exposed photoresist to take advantage of the physical changes and selectively remove either the exposed portion of the photoresist or the unexposed portion of the photoresist, depending upon the desired pattern.

Figure 9:
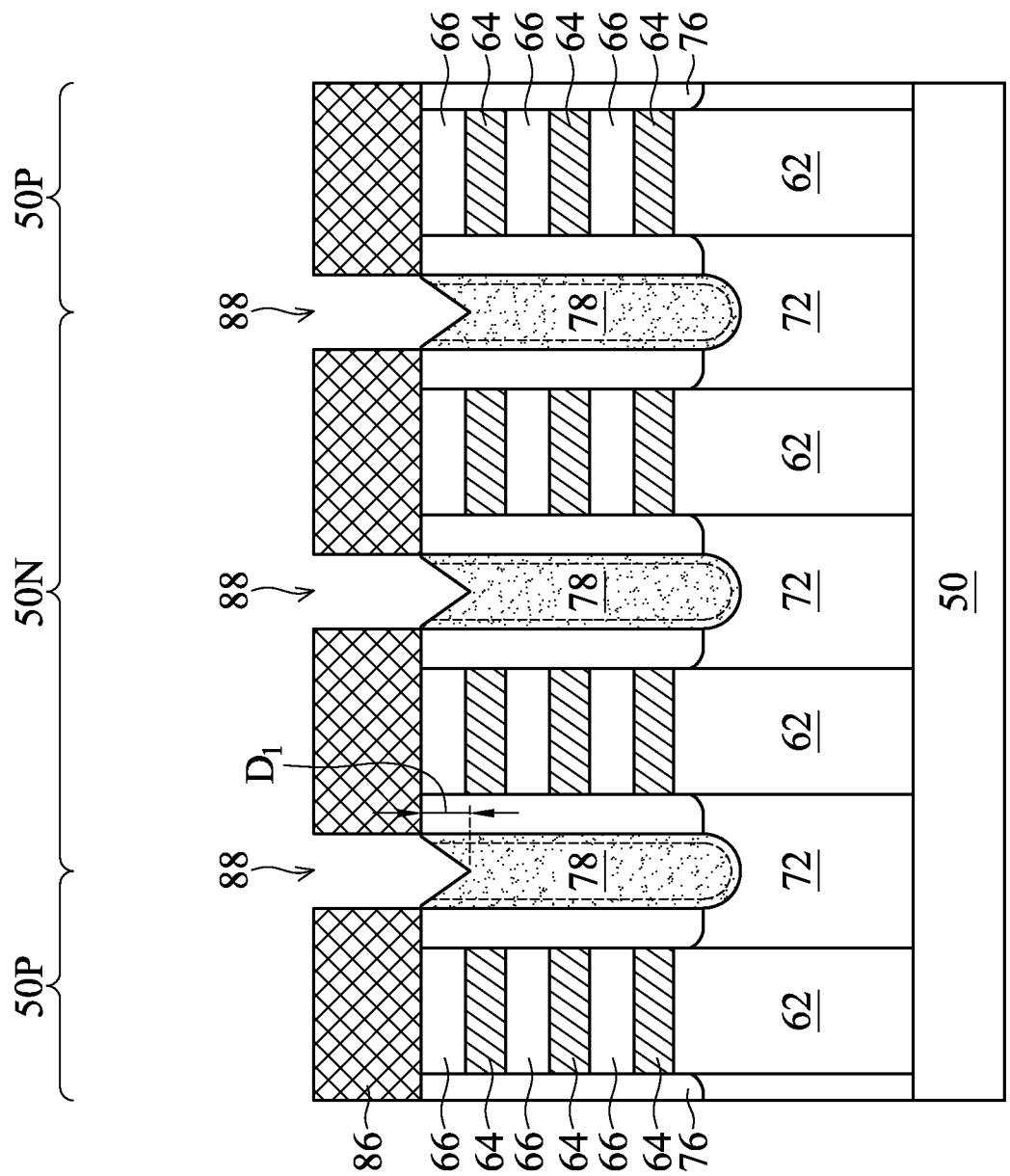

In FIG. 9, the insulating layer(s) 78 are optionally recessed. After the recessing, top surfaces of the insulating layer(s) 78 are below top surfaces of the sacrificial spacers 76. The insulating layer(s) 78 may be recessed by any acceptable etching process using the mask 86 as an etching mask. The etching process may be selective to the insulating layer(s) 78 (e.g., selectively etches the material(s) of the insulating layer(s) 78 at a faster rate than the material of the sacrificial spacers 76). The etching may be isotropic. For example, the etching process may be a dry etch performed using fluoromethane ($CH_3F$) and oxygen ($O_2$) gas as etchants while generating a plasma. Before the recessing, the top surfaces of the insulating layer(s) 78 are flat, and after the recessing, the top surfaces of the insulating layer(s) 78 are concave. The shape of the top surfaces of the insulating layer(s) 78 will be subsequently described in greater detail (for FIGS. 30A-31C).

The top surfaces of the insulating layer(s) 78 are recessed so that their lowest points are disposed a distance Di below the bottom surfaces of the uppermost nanostructures 66. In some embodiments, the distance Di is in the range of 0 nm to 10 nm. Device performance may be reduced if the lowest points of the top surfaces of the insulating layer(s) 78 are not recessed below the bottom surfaces of the uppermost nanostructures 66.

Figure 10:
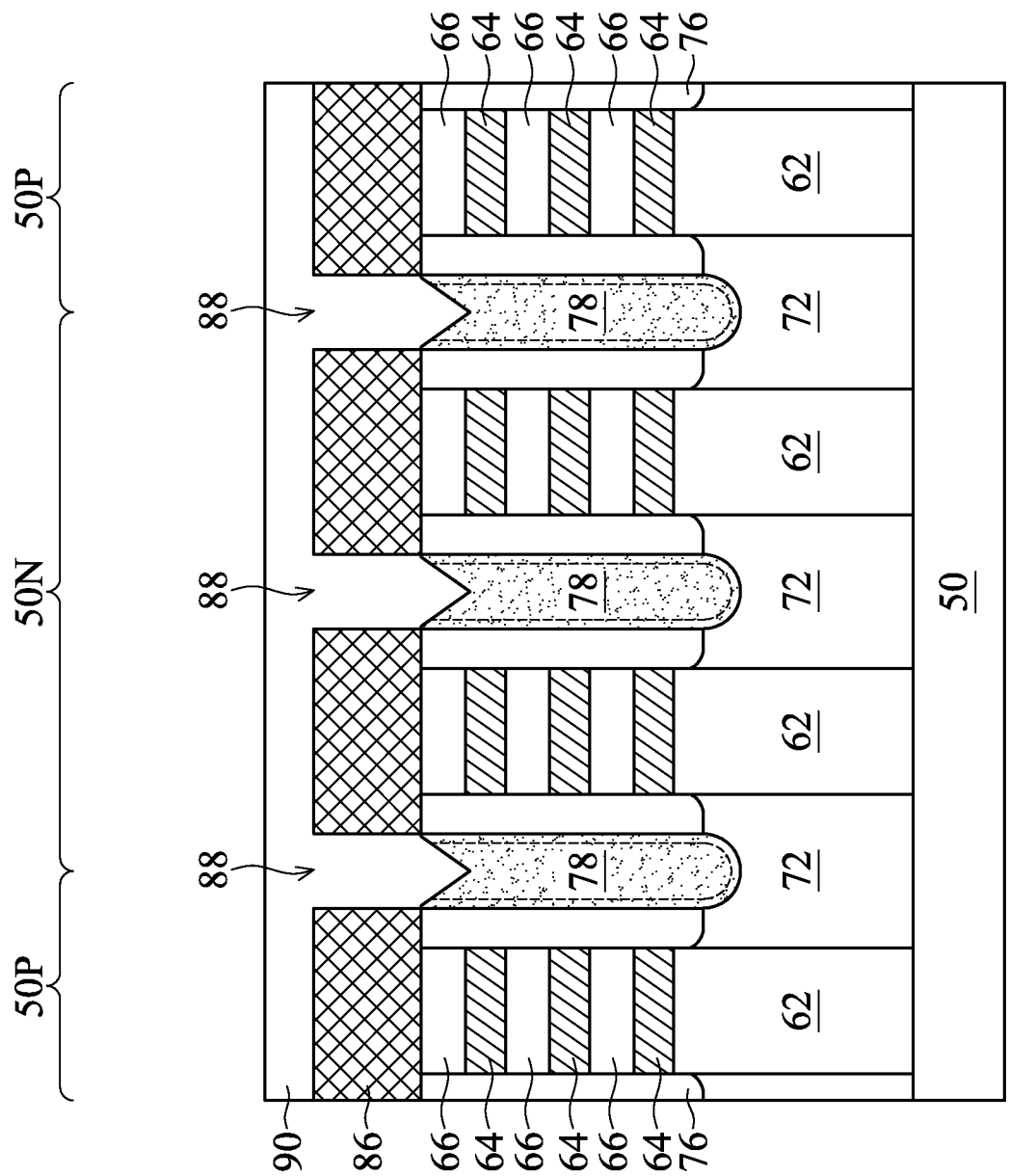

In FIG. 10, one or more insulating layer(s) 90 for upper portions of insulating fins are formed in the openings 88. The insulating layer(s) 90 are conformally formed over exposed surfaces of the mask 86 and the insulating layer(s) 78, so that the insulating layer(s) 90 fill the openings 88 and any recesses which may have been formed in the insulating layer(s) 78. The insulating layer(s) 90 may be formed of one or more dielectric material(s) having a high etching selectivity from the etching of the semiconductor fins 62, the nanostructures 64, 66, the sacrificial spacers 76, and the insulating layer(s) 78. For example, some or all of the insulating layer(s) 90 may be formed of high-k dielectric materials such as hafnium oxide, zirconium oxide, zirconium aluminum oxide, hafnium aluminum oxide, hafnium silicon oxide, aluminum oxide, the like, or combinations thereof, which may be formed by any acceptable deposition process such as ALD, CVD, PVD, or the like. As will be subsequently described in greater detail (for FIGS. 30A-30C), the insulating layer(s) 90 may be single-layered or multi-layered, and include different dielectric materials. The insulating layer(s) 90 may form the upper portions of the insulating fins 92 (see FIG. 11) to insulate subsequently formed source/drain regions (see FIG. 20C) from each other.

Figure 11:
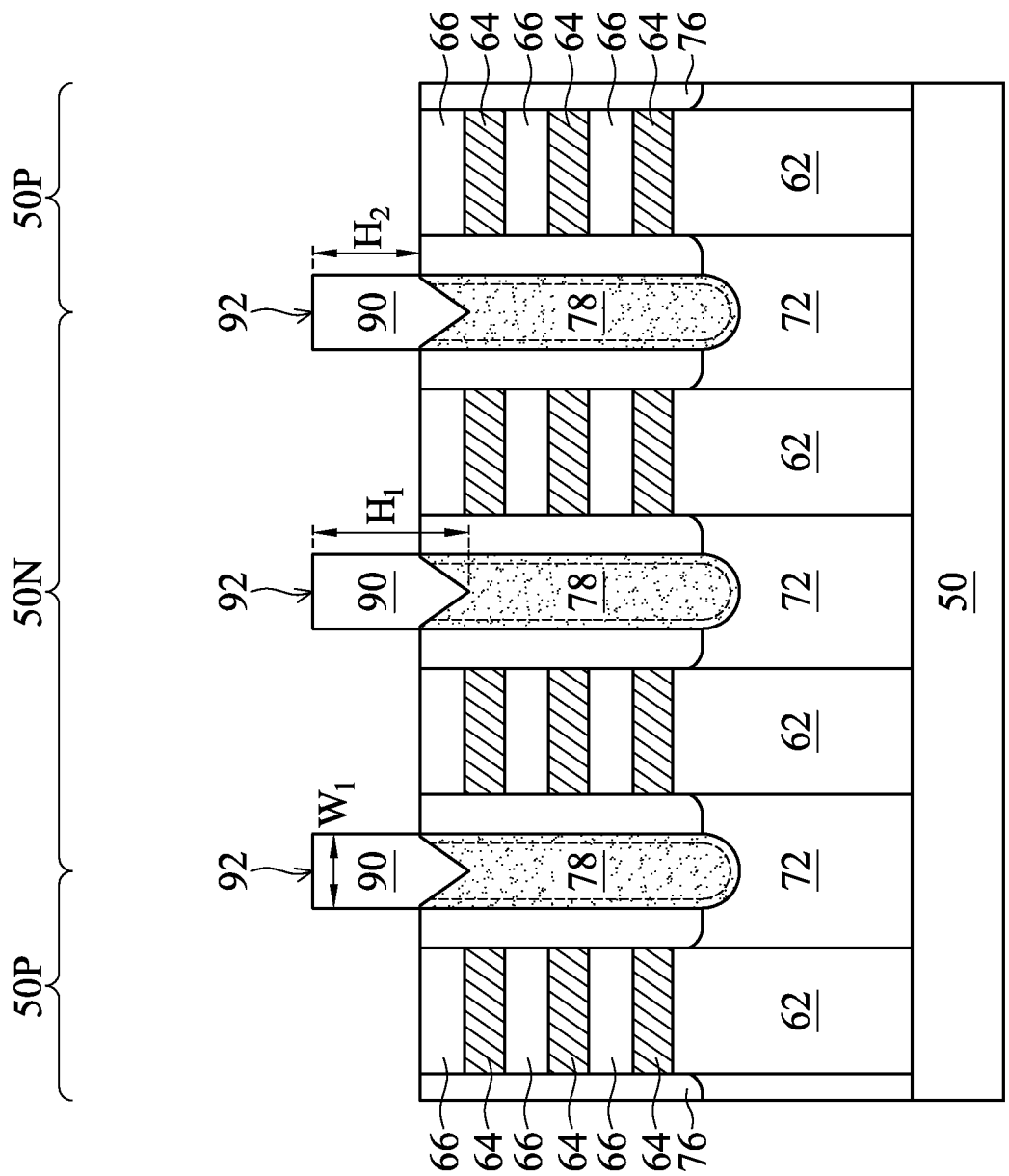

In FIG. 11, a removal process is applied to the insulating layer(s) 90 to remove excess portions of the insulating layer(s) 90 outside of the openings 88, which excess portions are over the mask 86. A planarization process such as a chemical mechanical polish (CMP), an etching process, combinations thereof, or the like may be utilized. After the planarization process, top surfaces of the mask 86 and the insulating layer(s) 90 may be coplanar (within process variations). In some embodiments, the remaining portions of the insulating layer(s) 90 have a height $H_1$ in the range of 15 nm to 33 nm. Further, the mask 86 is removed. When the mask 86 includes a photoresist, the photoresist can be removed by, e.g., any acceptable ashing process. When the mask 86 includes other layers (e.g., a BARC layer, a nitride layer, etc), accepting etching processes can be used to remove the layers. In the illustrated embodiment, after the removal process(es), the top surfaces of the insulating layer(s) 90 are flat. As will be subsequently described in greater detail (for FIGS. 30A-31C), after the removal process(es), the top surfaces of the insulating layer(s) 90 may be convex or flat.

As a result, insulating fins 92 are formed between and contacting the sacrificial spacers 76. The insulating fins 92 include the insulating layer(s) 78 and the insulating layer(s) 90. The insulating layer(s) 78 form the lower portions of the insulating fins 92, and the insulating layer(s) 90 form the upper portions of the insulating fins 92. The sacrificial spacers 76 space the insulating fins 92 apart from the nanostructures 64, 66, and a size of the insulating fins 92 may be adjusted by adjusting a thickness of the sacrificial spacers 76.

After they are initially formed, the insulating fins 92 protrude above and from between adjacent sacrificial spacers 76. Thus, the insulating fins 92 extend above the nanostructures 64, 66 and the sacrificial spacers 76. In some embodiments, the insulating fins 92 have a height $H_2$ above the nanostructures 64, 66 and the sacrificial spacers 76 in the range of 16 nm to 28 nm. In some embodiments, the insulating fins 92 have a width $W_1$ above the nanostructures 64, 66 and the sacrificial spacers 76 in the range of 12 nm to 29 nm. The width $W_1$ is controlled to be less than the height $H_1$ and the height $H_2$, which may help reduce damage to underlying features during a subsequent process for recessing some of the insulating fins 92.

FIGS. 12-15 illustrate a recessing of a subset of the insulating fins 92. Specifically, a first subset of the insulating fins 92R will be recessed to have a smaller height than a second subset of the insulating fins 92N which are not recessed. In some embodiments where SRAM cells are formed, the insulating fins 92R disposed at boundaries of the n-type regions 50N and the p-type regions 50P are recessed, and the insulating fins 92N within the n-type regions 50N are not recessed. Recessing an insulating fin 92R at a boundary of an n-type region 50N and a p-type region 50P allows a subsequently formed conductive layer to extend over the insulating fin 92R and connect the gate of an n-type transistor in the n-type region 50N to the gate of a p-type transistor in the p-type region 50P, thereby forming a CMOS inverter of an SRAM cell.

Figure 12:
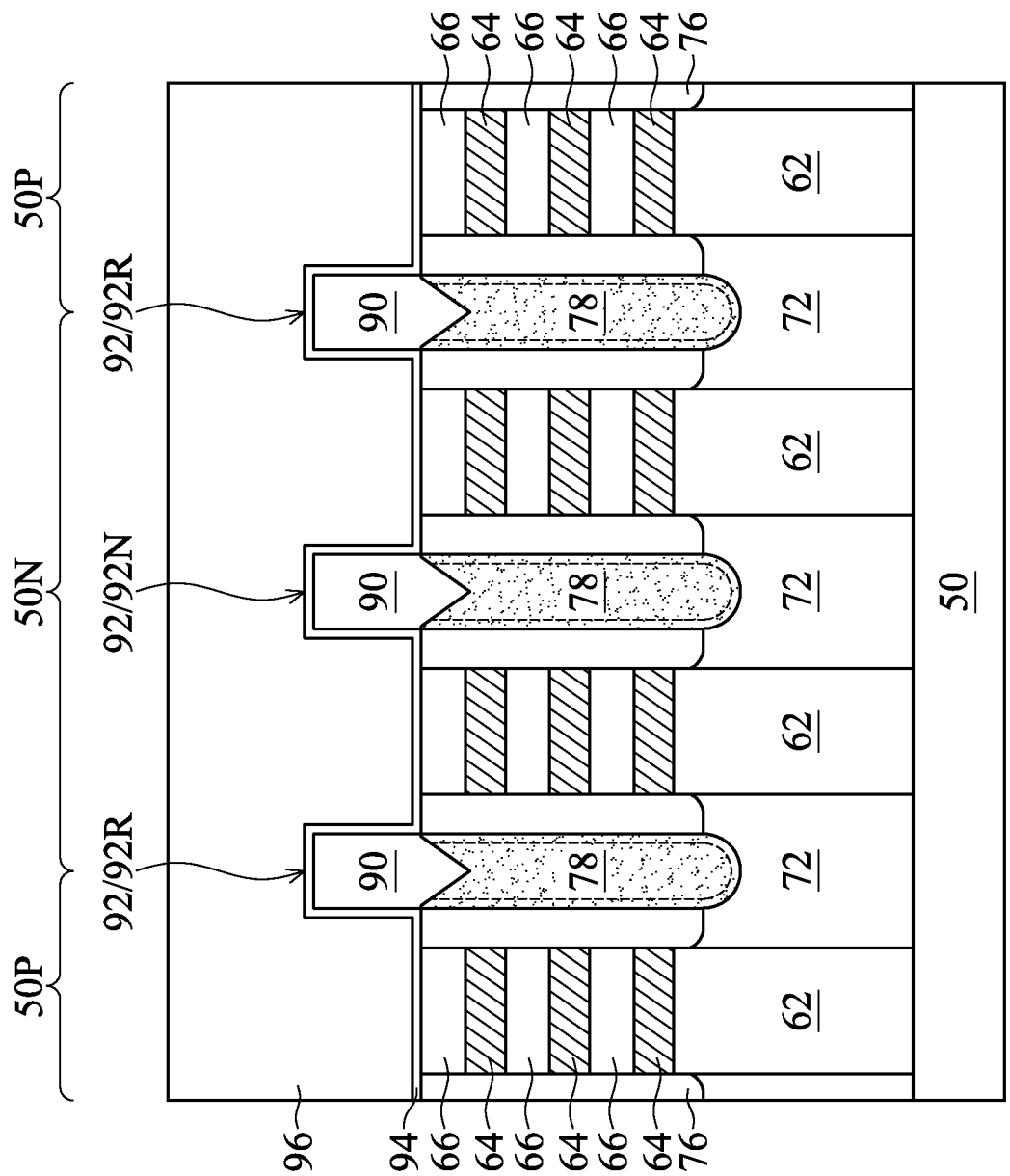

In FIG. 12, an etch stop layer 94 is conformally formed over exposed surfaces of the nanostructures 64, 66, the sacrificial spacers 76, and the insulating fins 92. A mask layer 96 is then formed over the etch stop layer 94. As will be subsequently described in greater detail, the mask layer 96 and the etch stop layer 94 will be patterned and utilized as an etching mask to recess the first subset of the insulating fins 92R, so that the first subset of the insulating fins 92R (which are recessed) have a lesser height than the second subset of the insulating fins 92N (which are not recessed).

The etch stop layer 94 may be formed of a dielectric material such as silicon oxide, silicon nitride, silicon oxynitride, or the like, which may be formed by any acceptable deposition process such as ALD, CVD, PVD, or the like. Other dielectric materials formed by any acceptable process may be used. The dielectric material of the etch stop layer 94 has a high etching selectivity from the etching of the mask layer 96. In some embodiments, the etch stop layer 94 is formed to a thickness in the range of 3 nm to 5 nm.

The mask layer 96 may be formed of a conductive or non-conductive mask material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. Other mask materials formed by any acceptable process may be used. The mask layer 96 may be a single mask layer, or may include multiple mask layers. In some embodiments, the mask layer 96 is formed to a thickness in the range of 33 nm to 45 nm.

Figure 13:
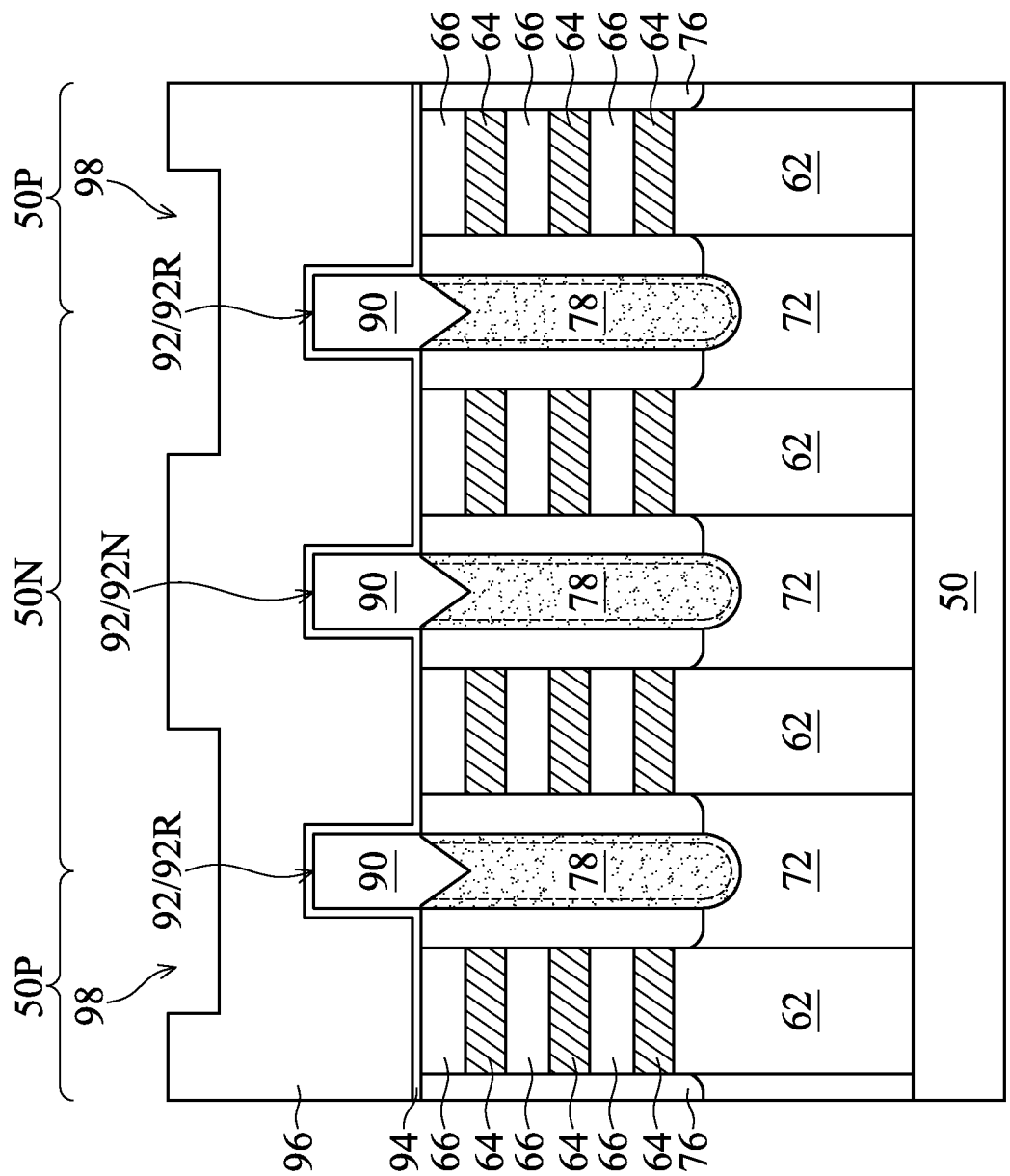

In FIG. 13, recesses 98 are formed in the mask layer 96. The recesses 98 are formed over a subset of the insulating fins 92. Specifically, the recesses 98 are formed over the insulating fins 92R which will be recessed to have a smaller height than the insulating fins 92N which are not recessed. Put another way, the recesses 98 laterally overlap the insulating fins 92R but do not laterally overlap the insulating fins 92N. The recesses 98 may be formed using acceptable photolithography and etching techniques. For example, the etching process may be a wet etch performed using dilute hydrofluoric (dHF) acid, ozonated deionized water ($DIO_3$), or ammonium hydroxide ($NH_4OH$) as an etchant. Timed etching processes may be used to stop the etching of the recesses 98 after the recesses 98 reach a desired depth. In some embodiments, the recesses 98 are patterned to a depth in the range of 3 nm to 12 nm. After the recesses 98 are formed, the mask layer 96 may (or may not) have portions which remain over the insulating fins 92R.

Figure 14:
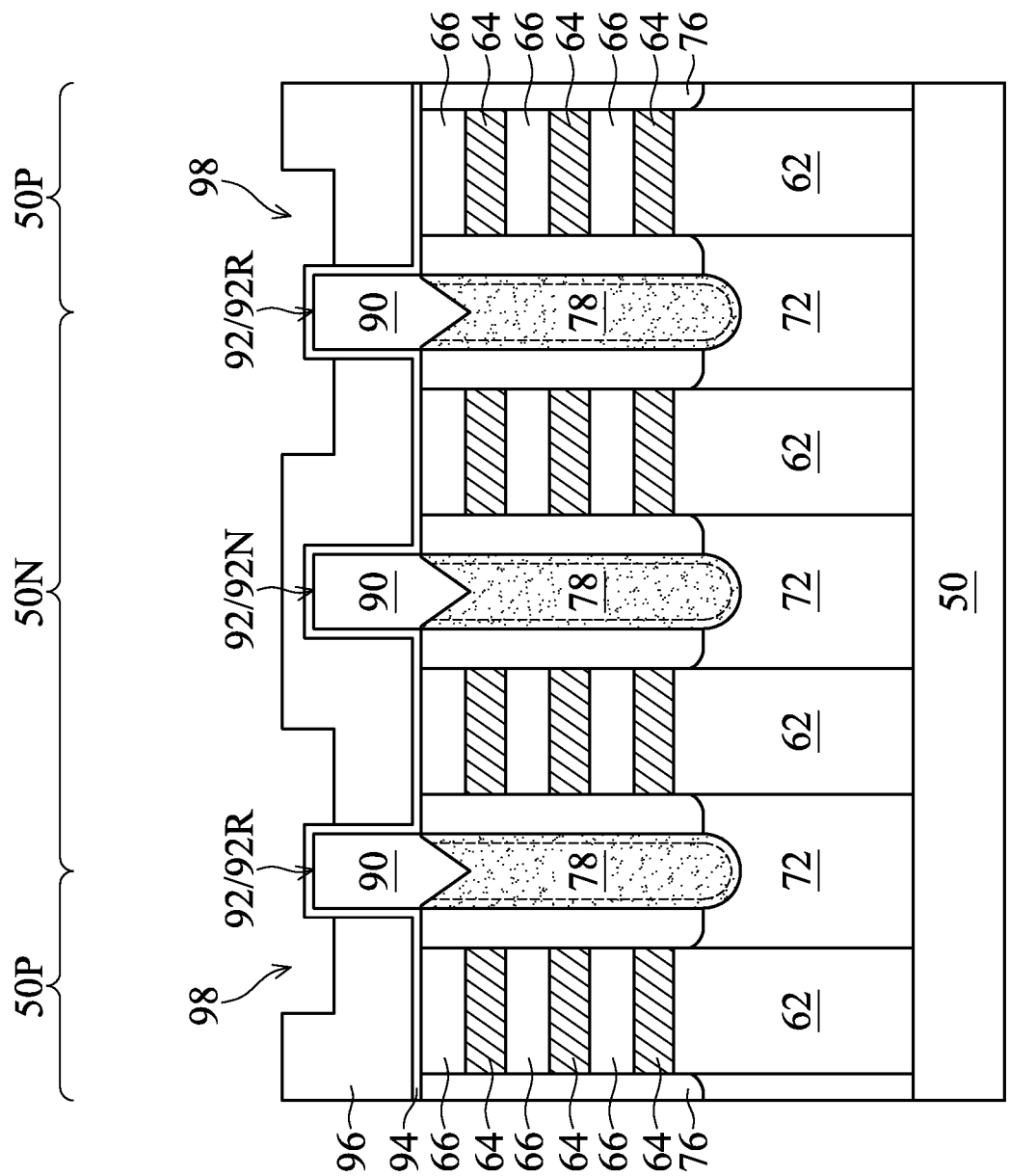

In FIG. 14, the mask layer 96 is thinned until the recesses 98 expose the portions of the etch stop layer 94 over the insulating fins 92R. The mask layer 96 may be thinned by any acceptable etching process. The etching process may be selective to the mask layer 96 (e.g., selectively etches the material(s) of the mask layer 96 at a faster rate than the material of the etch stop layer 94). The etching may be isotropic. For example, the etching process may be a wet etch performed using dilute hydrofluoric (dHF) acid, ozonated deionized water ($DIO_3$), or ammonium hydroxide ($NH_4OH$) as an etchant. Timed etching processes may be used to stop the etching of the mask layer 96 after the mask layer 96 has been thinned by a desired amount. In some embodiments, the mask layer 96 is thinned by an amount in the range of 3 nm to 10 nm. After the mask layer 96 is thinned, the portion of the etch stop layer 94 over the nanostructures 64, 66, the sacrificial spacers 76, and the insulating fins 92N remain covered by the mask layer 96. Thus, after the mask layer 96 is patterned and thinned, it forms a mask which has portions covering the insulating fins 92N, and does not have portions covering the insulating fins 92R.

Figure 15:
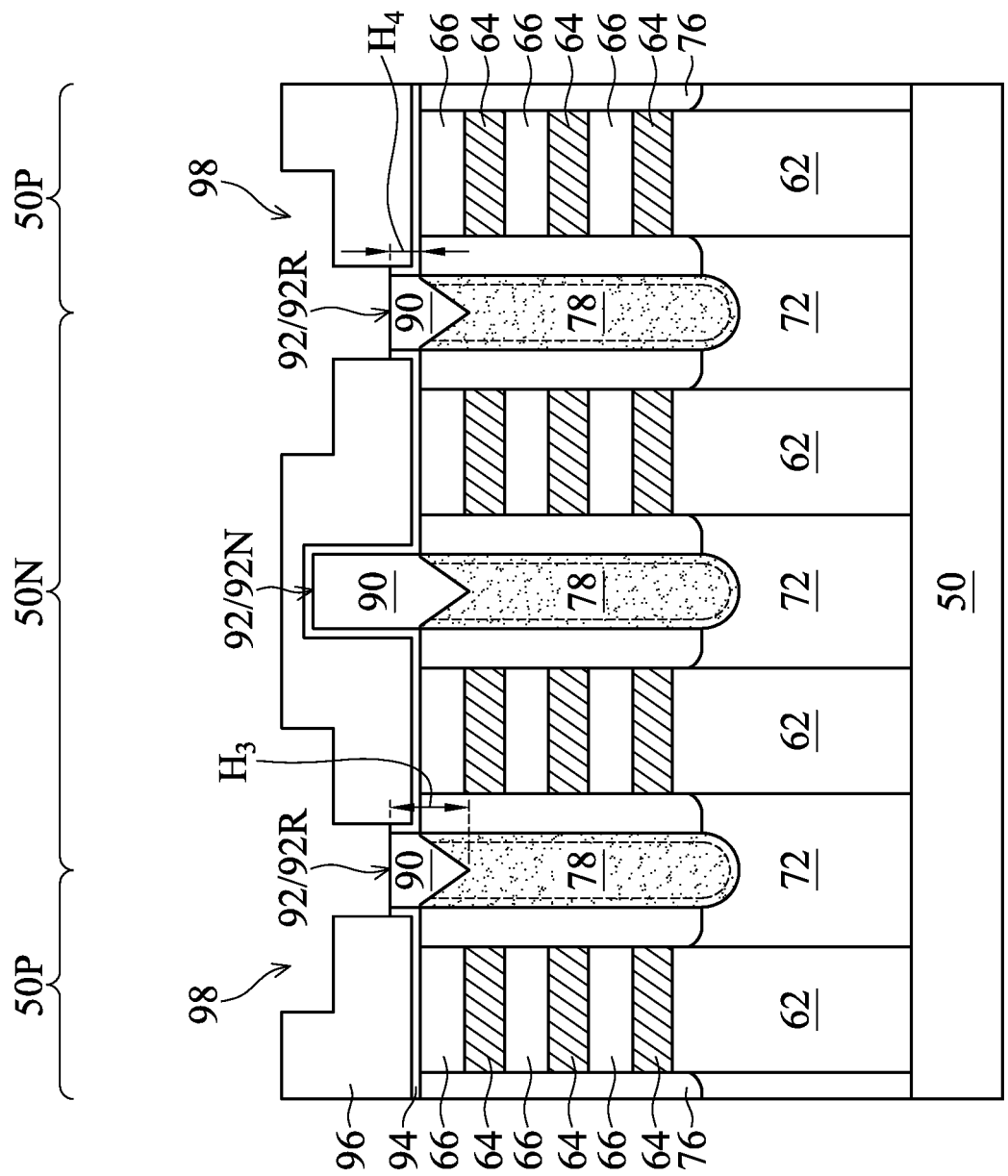

In FIG. 15, the recesses 98 are extended through the exposed portions of the etch stop layer 94. The recesses 98 may be extended by any acceptable etching process. The etching process may be selective to the etch stop layer 94 (e.g., selectively etches the material of the etch stop layer 94 at a faster rate than the materials of the insulating layer(s) 90, the sacrificial spacers 76, and the nanostructures 64, 66). The etching may be anisotropic. For example, the etching process may be a dry etch performed using ammonia ($NH_3$) and nitrogen trifluoride ($NF_3$) gas as etchants while generating a plasma, or a dry etch performed using ammonia ($NH_3$) and hydrogen fluoride (HF) gas as etchants while generating a plasma. After the recesses 98 are extended through the etch stop layer 94, they expose the insulating layer(s) 90 of the insulating fins 92R.

The top surfaces of the insulating layer(s) 90 of the insulating fins 92R are then recessed below the top surfaces of the insulating layer(s) 90 of the insulating fins 92N, so that the insulating fins 92R have a reduced height. The insulating layer(s) 90 of the insulating fins 92R may be recessed by any acceptable etching process using the mask layer 96 as an etching mask. The etching process may be selective to the insulating layer(s) 90 (e.g., selectively etches the material(s) of the insulating layer(s) 90 at a faster rate than the materials of the mask layer 96, the etch stop layer 94, the sacrificial spacers 76, and the nanostructures 64, 66). The etching may be isotropic. For example, the etching process may be a wet etch performed using phosphoric acid ($H_3PO_4$) as an etchant. Timed etching processes may be used to stop the etching of the insulating layer(s) 90 of the insulating fins 92R after they have been recessed by a desired amount. In some embodiments, the insulating layer(s) 90 of the insulating fins 92R are recessed by an amount in the range of 3 nm to 5 nm. In some embodiments, the remaining portions of the insulating layer(s) 90 of the insulating fins 92R have a height $H_3$ in the range of 7 nm to 8.4 nm. The height $H_3$ is controlled to be less than the height $H_2$ (see FIG. 11), which may help reduce over-etching of the nanostructures 64 during the recessing. As a result of the recessing, the insulating fins 92R have a reduced height. In some embodiments, the insulating fins 92R have a height $H_4$ above the nanostructures 64, 66 and the sacrificial spacers 76 in the range of 1 nm to 7 nm. The height $H_3$ and the height $H_4$ are controlled to be less than the width $W_1$ (see FIG. 11A), which may help reduce under-etching of the insulating layer(s) 90 during the recessing.

Figure 16:
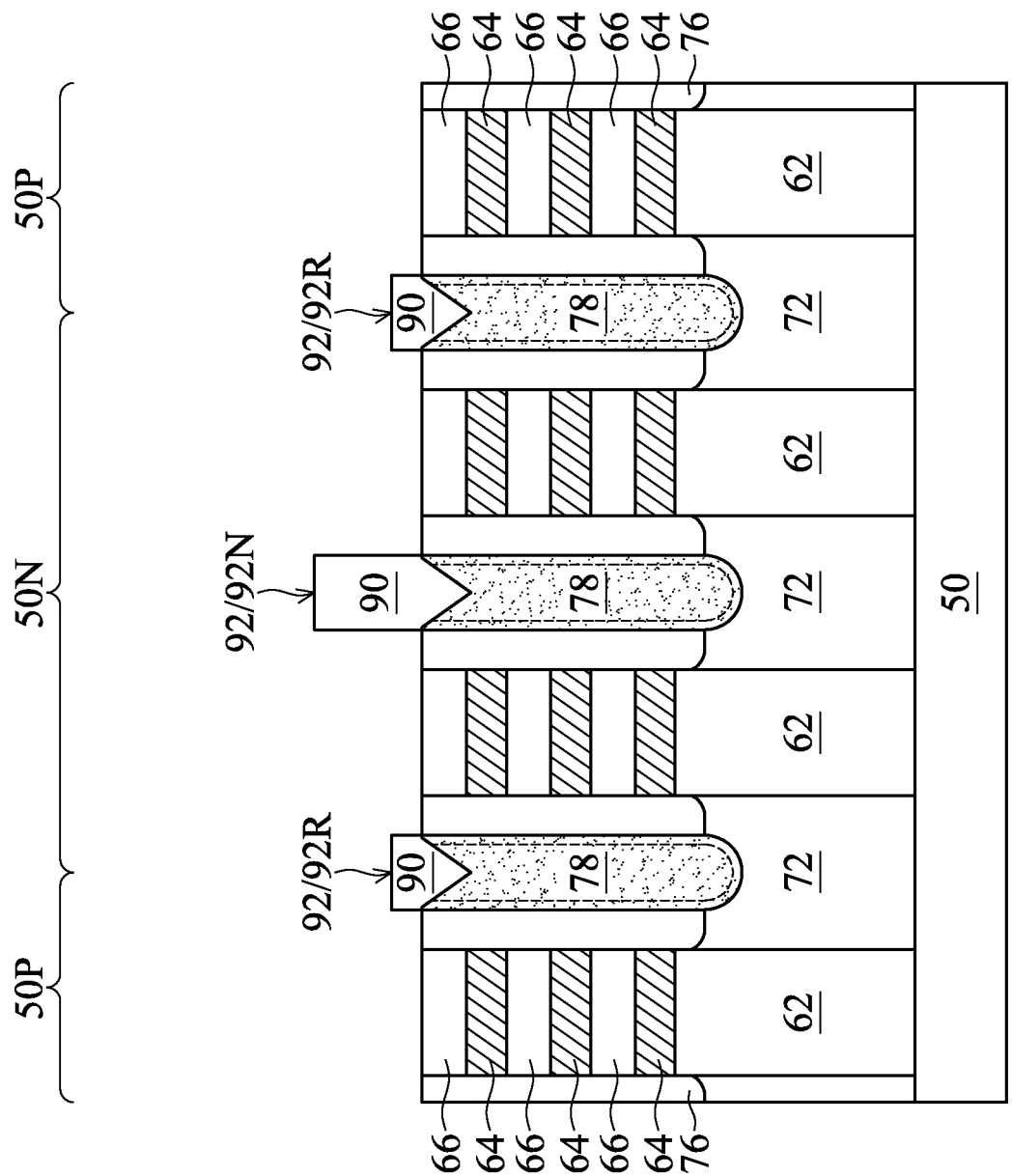

In FIG. 16, the remaining portions of the mask layer 96 and the etch stop layer 94 are removed to expose the insulating fins 92N, the sacrificial spacers 76, and the nanostructures 64, 66. The remaining portions of the mask layer 96 may be removed by any acceptable etching process using the etch stop layer 94 as an etch stop layer. The portions of the etch stop layer 94 may then be removed by any acceptable etching process.

Figure 17A:
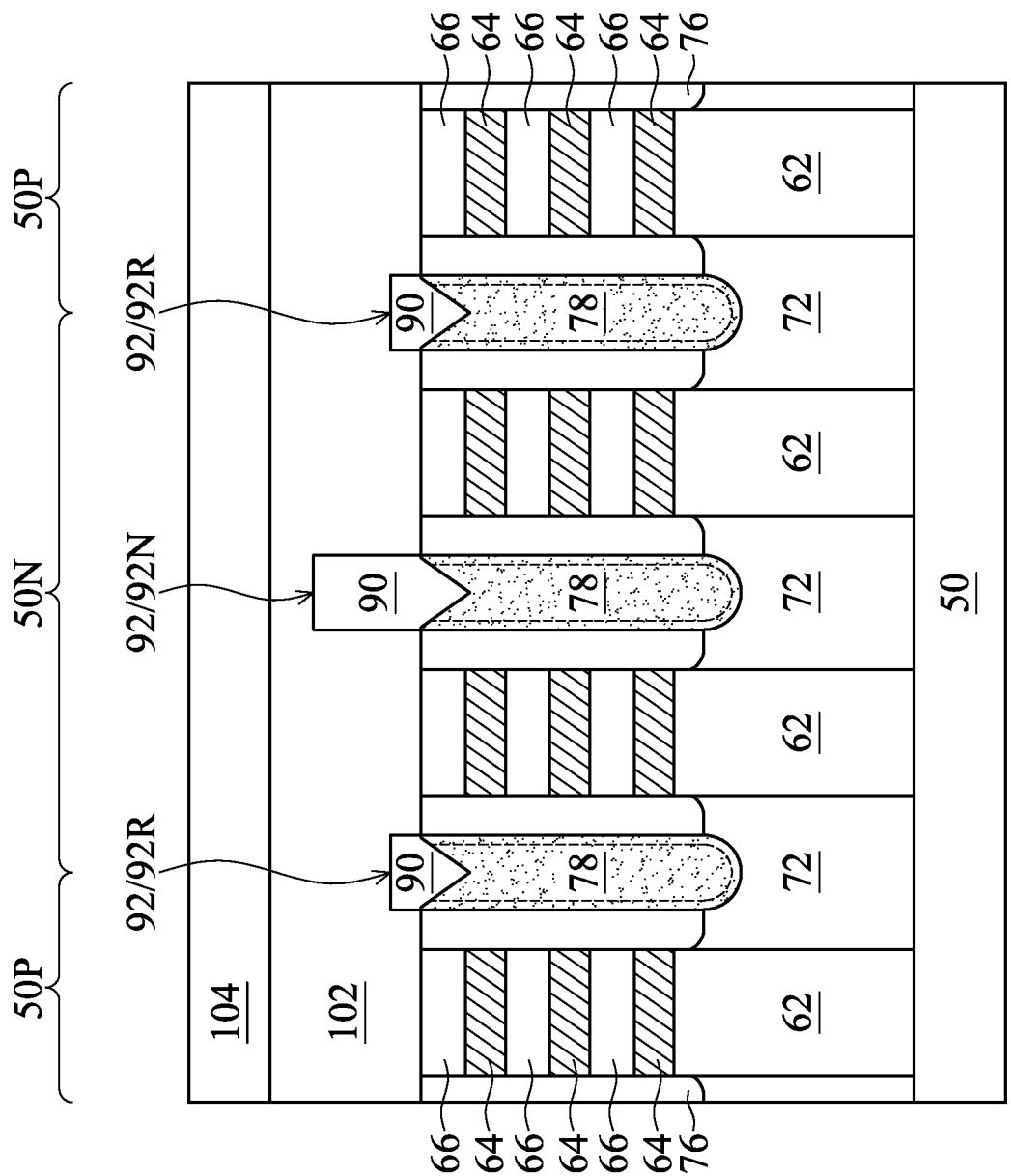
Figure 17B:
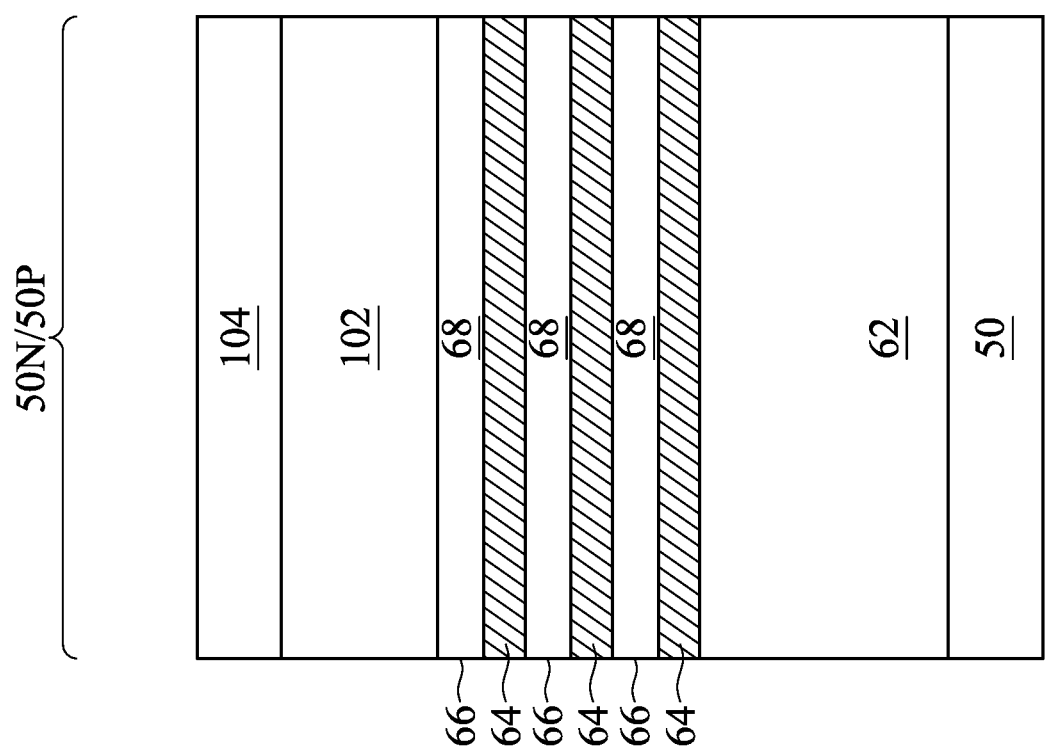

In FIGS. 17A-17B, a dummy gate layer 102 is formed on the insulating fins 92, the sacrificial spacers 76, and the nanostructures 64, 66. Because top surfaces of the nanostructures 64, 66 and the sacrificial spacers 76 are disposed beneath top surfaces of the insulating fins 92, the dummy gate layer 102 may be disposed along exposed sidewalls of the insulating fins 92. The dummy gate layer 102 may be deposited and then planarized, such as by a CMP. The dummy gate layer 102 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 102 may also be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. The dummy gate layer 102 may be formed of material(s) that have a high etching selectivity from the etching of insulation materials, e.g., the insulating fins 92. A mask layer 104 may be deposited over the dummy gate layer 102. The mask layer 104 may be formed of a dielectric material such as silicon nitride, silicon oxynitride, or the like. In this example, a single dummy gate layer 102 and a single mask layer 104 are formed across the n-type regions 50N and the p-type regions 50P.

Figure 18A:
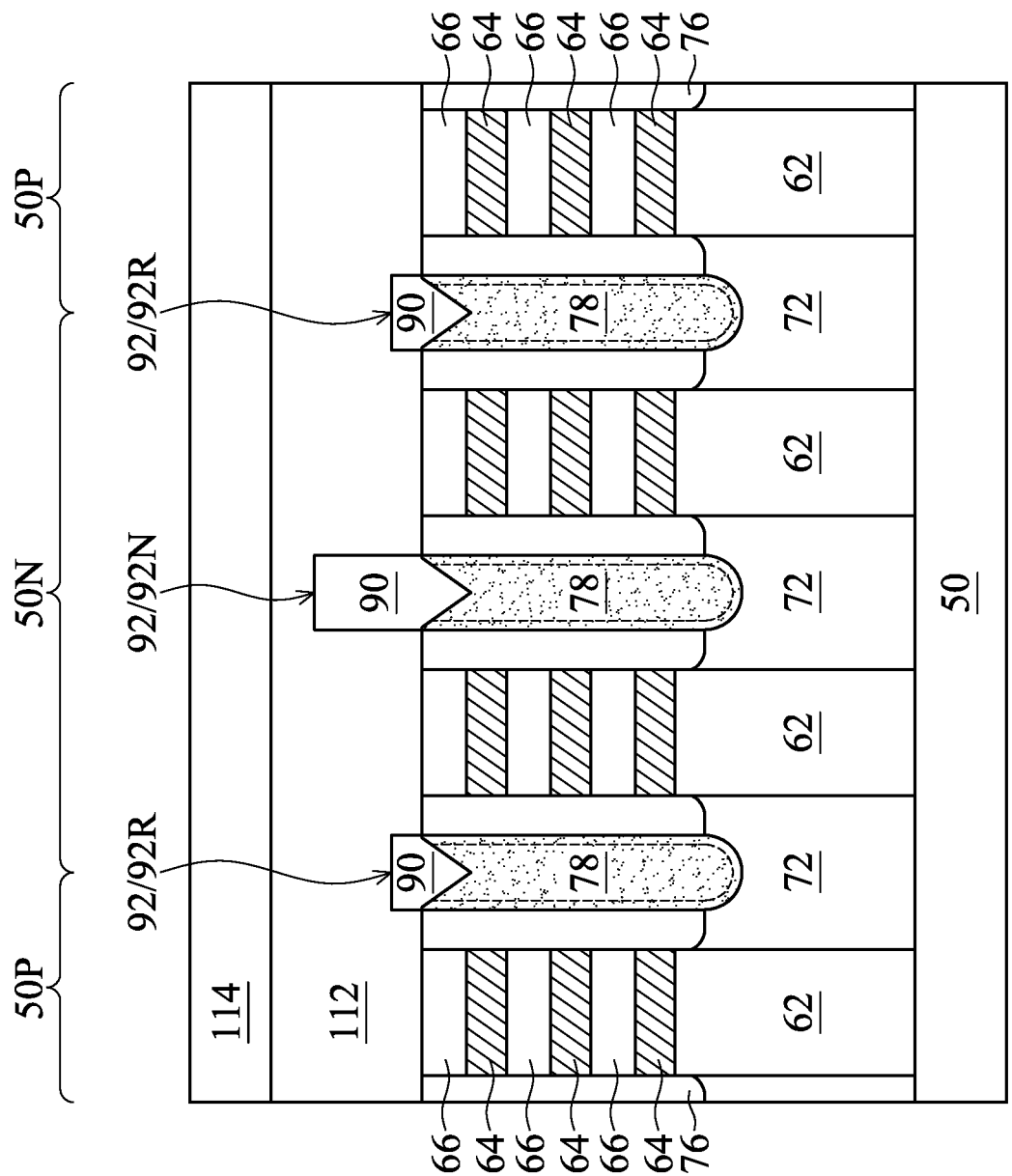
Figure 18B:
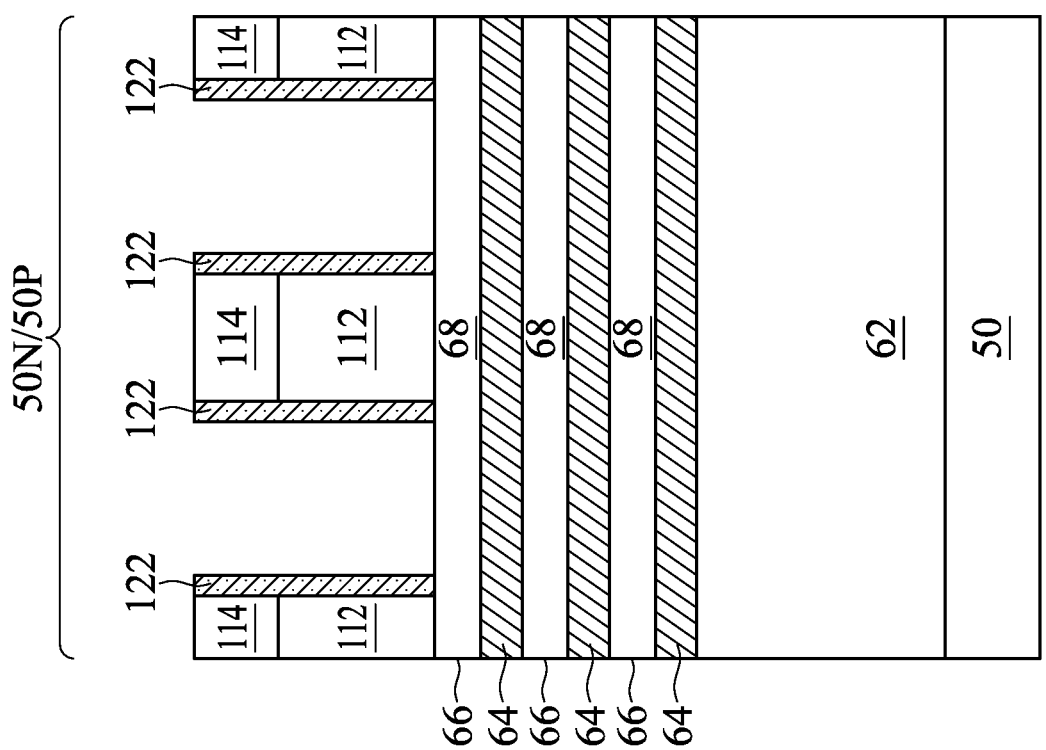

In FIGS. 18A-18B, the mask layer 104 is patterned using acceptable photolithography and etching techniques to form masks 114. The pattern of the masks 114 is then transferred to the dummy gate layer 102 by any acceptable etching technique to form dummy gates 112. The dummy gates 112 cover the top surfaces of the nanostructures 64, 66 that will be exposed in subsequent processing to form channel regions. The pattern of the masks 114 may be used to physically separate adjacent dummy gates 112. The dummy gates 112 may also have lengthwise directions substantially perpendicular (within process variations) to the lengthwise directions of the semiconductor fins 62. The masks 114 can optionally be removed after patterning, such as by any acceptable etching technique.

The dummy gates 112, the sacrificial spacers 76, and the nanostructures 64 collectively extend along the portions of the nanostructures 66 that will be patterned to form channel regions 68. Subsequently formed gate structures will replace the dummy gates 112, the sacrificial spacers 76, and the nanostructures 64. Forming the dummy gates 112 over the sacrificial spacers 76 allows the subsequently formed gate structures to have a greater height.

As noted above, the dummy gates 112 may be formed of a semiconductor material. In such embodiments, the nanostructures 64, the sacrificial spacers 76, and the dummy gates 112 are each formed of semiconductor materials. In some embodiments, the nanostructures 64, the sacrificial spacers 76, and the dummy gates 112 are formed of a same semiconductor material (e.g., silicon germanium), so that during a replacement gate process, the nanostructures 64, the sacrificial spacers 76, and the dummy gates 112 may be removed together in a same etching step. In some embodiments, the nanostructures 64 and the sacrificial spacers 76 are formed of a first semiconductor material (e.g., silicon germanium) and the dummy gates 112 are formed of a second semiconductor material (e.g., silicon), so that during a replacement gate process, the dummy gates 112 may be removed in a first etching step, and the nanostructures 64 and the sacrificial spacers 76 may be removed together in a second etching step. In some embodiments, the nanostructures 64 are formed of a first semiconductor material (e.g., silicon germanium) and the sacrificial spacers 76 and the dummy gates 112 are formed of a second semiconductor material (e.g., silicon), so that during a replacement gate process, the sacrificial spacers 76 and the dummy gates 112 may be removed together in a first etching step, and the nanostructures 64 may be removed in a second etching step.

Gate spacers 122 are formed over the nanostructures 64, 66, and on exposed sidewalls of the masks 114 (if present) and the dummy gates 112. The gate spacers 122 may be formed by conformally depositing one or more dielectric material(s) on the dummy gates 112 and subsequently etching the dielectric material(s). Acceptable dielectric materials may include silicon oxide, silicon nitride, silicon oxynitride, silicon oxycarbonitride, or the like, which may be formed by a conformal deposition process such as CVD, ALD, or the like. Other dielectric materials formed by any acceptable process may be used. Any acceptable etching process, such as a dry etch, a wet etch, the like, or a combination thereof, may be performed to pattern the dielectric material(s). The etching may be anisotropic. The dielectric material(s), when etched, have portions left on the sidewalls of the dummy gates 112 (thus forming the gate spacers 122). After etching, the gate spacers 122 can have curved sidewalls or can have straight sidewalls.

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type regions 50N, while exposing the p-type regions 50P, and appropriate type (e.g., p-type) impurities may be implanted into the semiconductor fins 62 and/or the nanostructures 64, 66 exposed in the p-type regions 50P. The mask may then be removed. Subsequently, a mask (not separately illustrated) such as a photoresist may be formed over the p-type regions 50P while exposing the n-type regions 50N, and appropriate type impurities (e.g., n-type) may be implanted into the semiconductor fins 62 and/or the nanostructures 64, 66 exposed in the n-type regions 50N. The mask may then be removed. The n-type impurities may be any of the n-type impurities previously described, and the p-type impurities may be any of the p-type impurities previously described. During the implanting, the channel regions 68 remain covered by the dummy gates 112, so that the channel regions 68 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 19A:
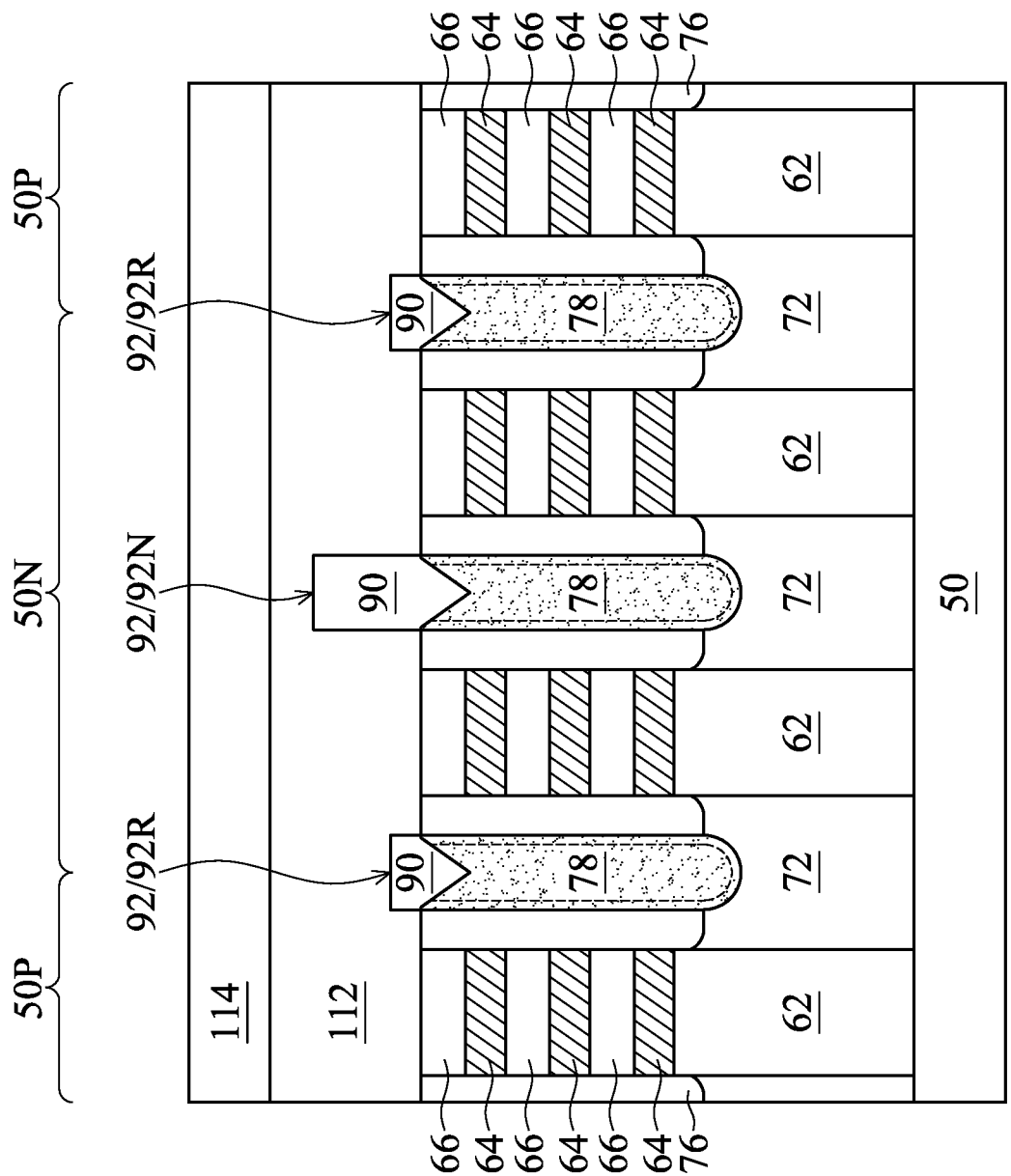
Figure 19B:
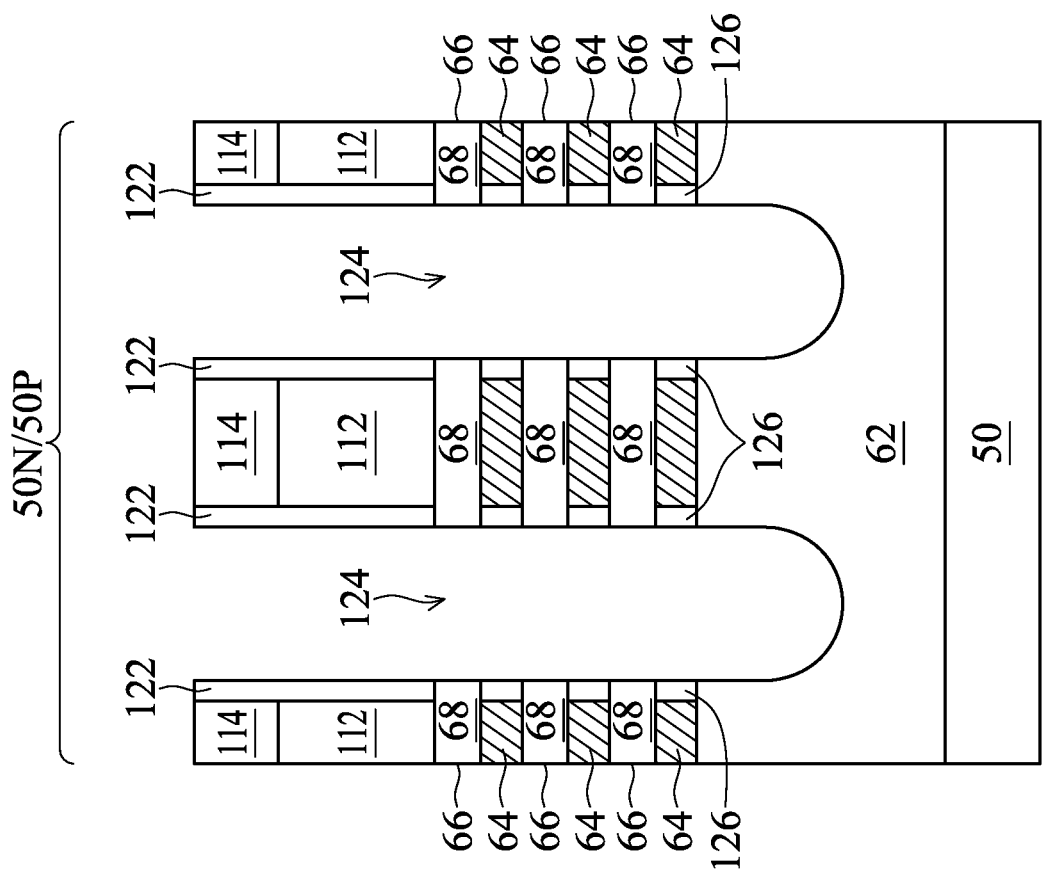

In FIGS. 19A-19B, source/drain recesses 124 are formed in the nanostructures 64, 66 and the sacrificial spacers 76. In the illustrated embodiment, the source/drain recesses 124 extend through the nanostructures 64, 66 and the sacrificial spacers 76 into the semiconductor fins 62. The source/drain recesses 124 may also extend into the substrate 50. In various embodiments, the source/drain recesses 124 may extend to a top surface of the substrate 50 without etching the substrate 50; the semiconductor fins 62 may be etched such that bottom surfaces of the source/drain recesses 124 are disposed below the top surfaces of the STI regions 72; or the like. The source/drain recesses 124 may be formed by etching the nanostructures 64, 66 and the sacrificial spacers 76 using an anisotropic etching process, such as a RIE, a NBE, or the like. The gate spacers 122 and the dummy gates 112 collectively mask portions of the semiconductor fins 62 and/or the nanostructures 64, 66 during the etching processes used to form the source/drain recesses 124. A single etching process may be used to etch each of the nanostructures 64, 66 and the sacrificial spacers 76, or multiple etching processes may be used to etch the nanostructures 64, 66 and the sacrificial spacers 76. Timed etching processes may be used to stop the etching of the source/drain recesses 124 after the source/drain recesses 124 reach a desired depth.

Optionally, inner spacers 126 are formed on the sidewalls of the nanostructures 64, e.g., those sidewalls exposed by the source/drain recesses 124. As will be subsequently described in greater detail, source/drain regions will be subsequently formed in the source/drain recesses 124, and the nanostructures 64 will be subsequently replaced with corresponding gate structures. The inner spacers 126 act as isolation features between the subsequently formed source/drain regions and the subsequently formed gate structures. Further, the inner spacers 126 may be used to substantially prevent damage to the subsequently formed source/drain regions by subsequent etching processes, such as etching processes used to subsequently remove the nanostructures 64.

As an example to form the inner spacers 126, the source/drain recesses 124 can be laterally expanded. Specifically, portions of the sidewalls of the nanostructures 64 exposed by the source/drain recesses 124 may be recessed. Although sidewalls of the nanostructures 64 are illustrated as being straight, the sidewalls may be concave or convex. The sidewalls may be recessed by any acceptable etching process, such as one that is selective to the nanostructures 64 (e.g., selectively etches the materials of the nanostructures 64 at a faster rate than the material of the nanostructures 66). The etching may be isotropic. For example, when the nanostructures 66 are formed of silicon and the nanostructures 64 are formed of silicon germanium, the etching process may be a wet etch performed using tetramethylammonium hydroxide (TMAH), ammonium hydroxide (NH$_4$OH), or the like as an etchant. In another embodiment, the etching process may be a dry etch performed using a fluorine-based gas such as hydrogen fluoride (HF) gas as an etchant while generating a plasma. In some embodiments, the same etching process may be continually performed to both form the source/drain recesses 124 and recess the sidewalls of the nanostructures 64. The inner spacers 126 are then formed on the recessed sidewalls of the nanostructures 64. The inner spacers 126 can be formed by conformally forming an insulating material and subsequently etching the insulating material. The insulating material may be silicon nitride or silicon oxynitride, although any suitable material, such as a low-k dielectric material, may be utilized. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 126 are illustrated as being flush with respect to the sidewalls of the gate spacers 122, the outer sidewalls of the inner spacers 126 may extend beyond or be recessed from the sidewalls of the gate spacers 122. In other words, the inner spacers 126 may partially fill, completely fill, or overfill the sidewall recesses. Moreover, although the sidewalls of the inner spacers 126 are illustrated as being straight, the sidewalls of the inner spacers 126 may be concave or convex.

Figure 20A:
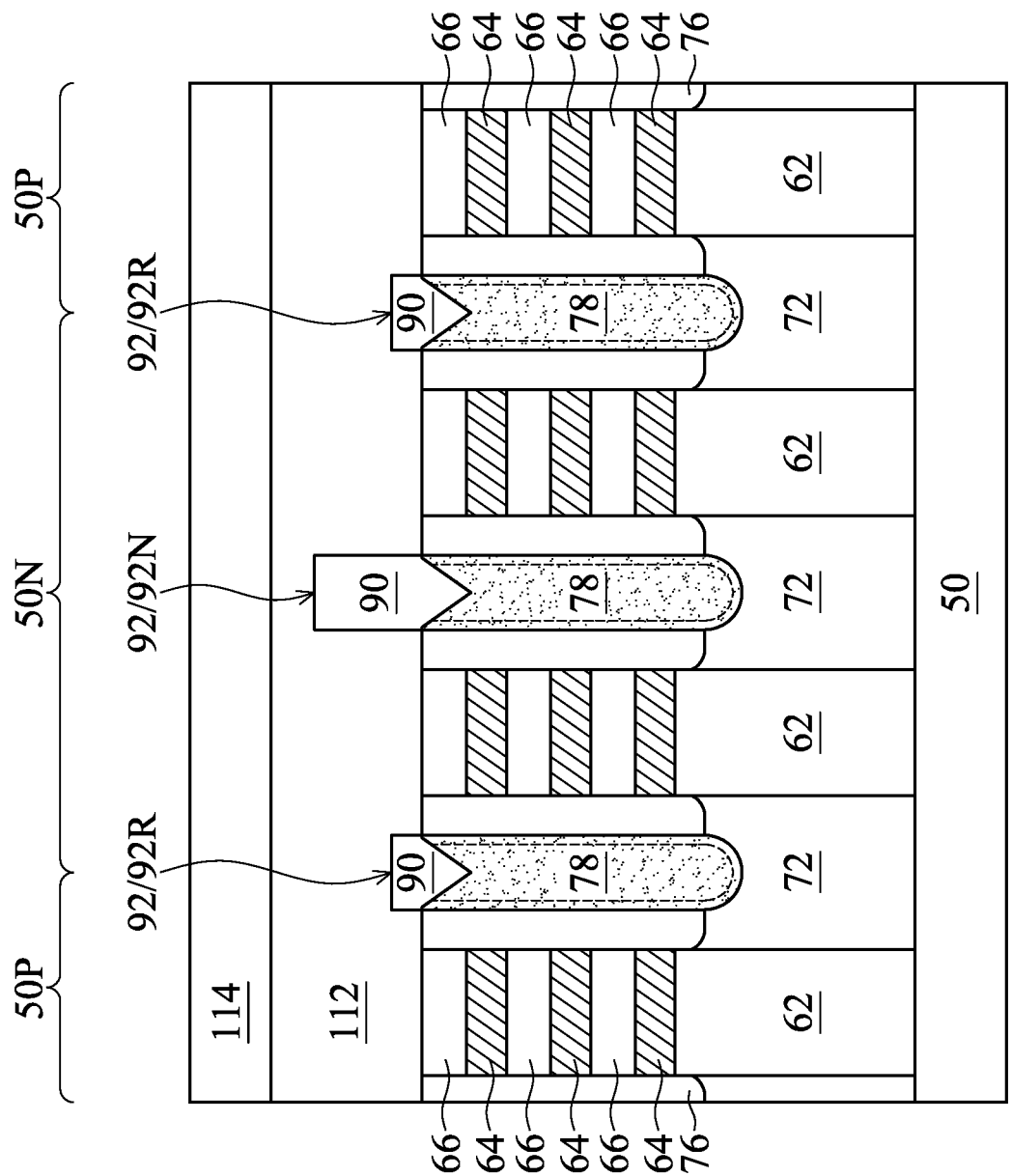
Figure 20B:
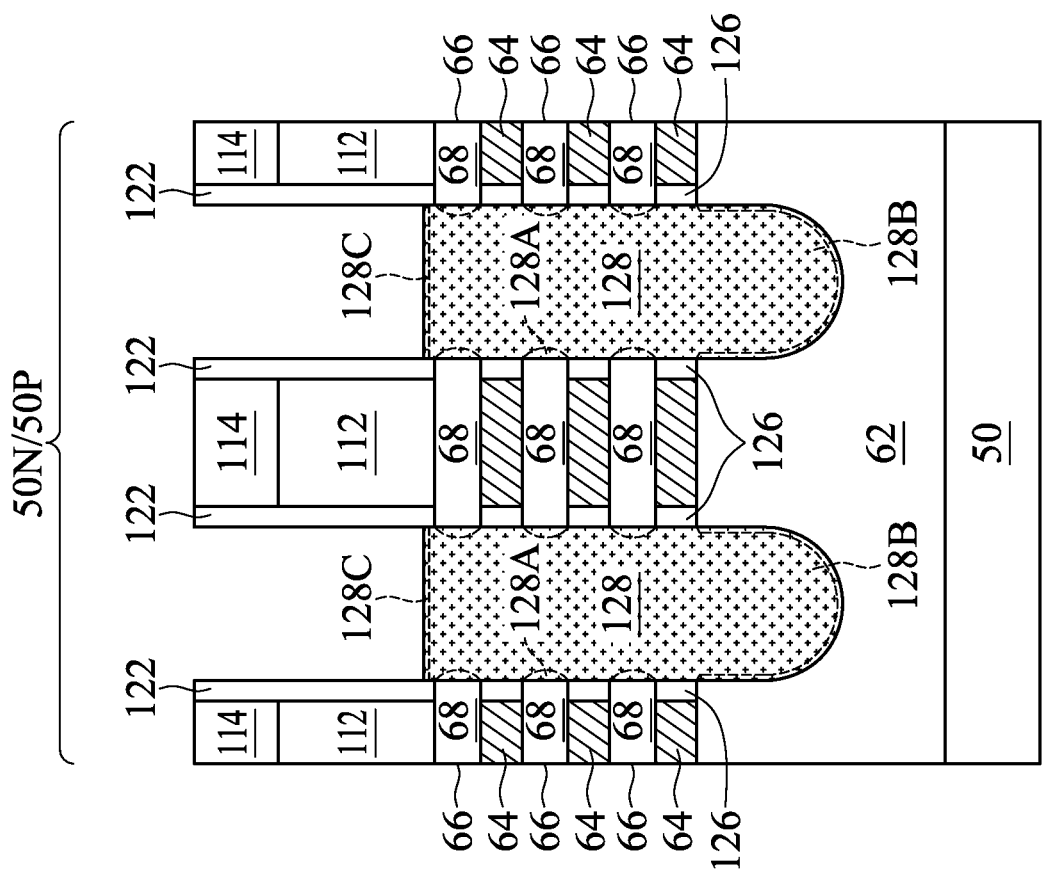
Figure 20C:
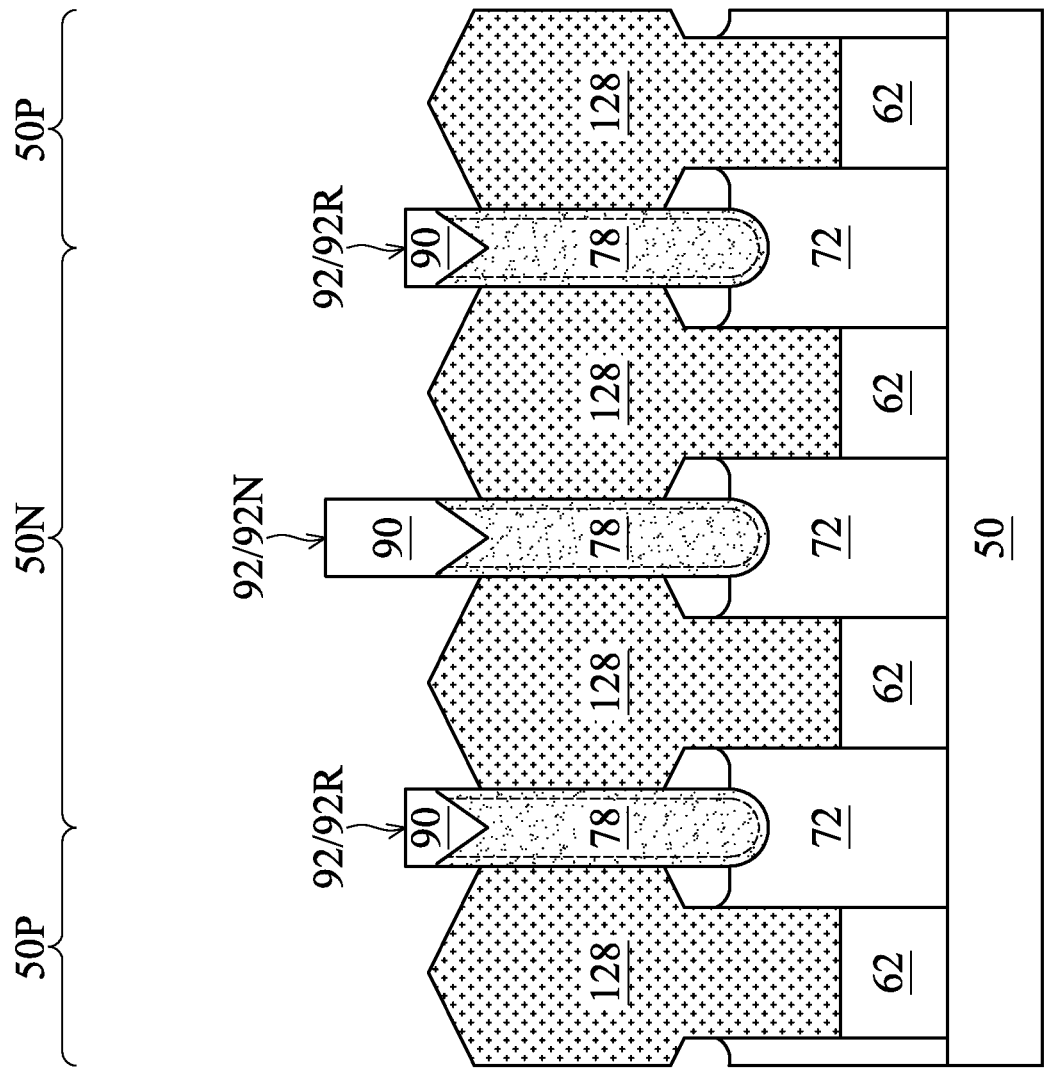

In FIGS. 20A-20B, epitaxial source/drain regions 128 are formed in the source/drain recesses 124. The epitaxial source/drain regions 128 are formed in the source/drain recesses 124 such that each dummy gate 112 (and corresponding channel region 68) is disposed between respective adjacent pairs of the epitaxial source/drain regions 128. In some embodiments, the gate spacers 122 and the inner spacers 126 are used to separate the epitaxial source/drain regions 128 from, respectively, the dummy gates 112 and the nanostructures 64 by an appropriate lateral distance so that the epitaxial source/drain regions 128 do not short out with subsequently formed gates of the resulting nano-FETs. A material of the epitaxial source/drain regions 128 may be selected to exert stress in the respective channel regions 68, thereby improving performance.

The epitaxial source/drain regions 128 in the n-type regions 50N may be formed by masking the p-type regions 50P. Then, the epitaxial source/drain regions 128 in the n-type regions 50N are epitaxially grown in the source/drain recesses 124 in the n-type regions 50N. The epitaxial source/drain regions 128 may include any acceptable material appropriate for n-type devices. For example, if the nanostructures 66 are silicon, the epitaxial source/drain regions 128 in the n-type regions 50N may include materials exerting a tensile strain on the channel regions 68, such as silicon, silicon carbide, phosphorous doped silicon carbide, silicon arsenide, silicon phosphide, or the like. The epitaxial source/drain regions 128 in the n-type regions 50N may be referred to as "n-type source/drain regions." The epitaxial source/drain regions 128 in the n-type regions 50N may have surfaces raised from respective surfaces of the semiconductor fins 62 and the nanostructures 64, 66, and may have facets.

The epitaxial source/drain regions 128 in the p-type regions 50P may be formed by masking the n-type regions 50N. Then, the epitaxial source/drain regions 128 in the p-type regions 50P are epitaxially grown in the source/drain recesses 124 in the p-type regions 50P. The epitaxial source/drain regions 128 may include any acceptable material appropriate for p-type devices. For example, if the nanostructures 66 are silicon, the epitaxial source/drain regions 128 in the p-type regions 50P may include materials exerting a compressive strain on the channel regions 68, such as silicon germanium, boron doped silicon germanium, silicon germanium phosphide, germanium, germanium tin, or the like. The epitaxial source/drain regions 128 in the p-type regions 50P may be referred to as "p-type source/drain regions." The epitaxial source/drain regions 128 in the p-type regions 50P may have surfaces raised from respective surfaces of the semiconductor fins 62 and the nanostructures 64, 66, and may have facets.

The epitaxial source/drain regions 128, the nanostructures 64, 66, and/or the semiconductor fins 62 may be implanted with impurities to form source/drain regions, similar to the process previously described for forming LDD regions, followed by an anneal. The epitaxial source/drain regions 128 may have an impurity concentration in the range of $10^{19}$ $cm^{-3}$ to $10^{21}$ $cm^{-3}$. The n-type and/or p-type impurities for source/drain regions may be any of the impurities previously described. In some embodiments, the epitaxial source/drain regions 128 may be in situ doped during growth.

The epitaxial source/drain regions 128 may include one or more semiconductor material layers. For example, the epitaxial source/drain regions 128 may each include a shielding layer 128A, a main layer 128B, and a capping layer 128C (or more generally, a first semiconductor material layer, a second semiconductor material layer, and a third semiconductor material layer). Any number of semiconductor material layers may be used for the epitaxial source/drain regions 128. Each of the shielding layer 128A, the main layer 128B, and the capping layer 128C may be formed of different semiconductor materials and may be doped to different impurity concentrations. In some embodiments, the shielding layer 128A may have a lesser concentration of impurities than the main layer 128B, and the capping layer 128C may have a greater concentration of impurities than the shielding layer 128A and a lesser concentration of impurities than the main layer 128B. In embodiments in which the epitaxial source/drain regions 128 include three semiconductor material layers, the shielding layers 128A may be grown in the source/drain recesses 124, the main layers 128B may be grown on the shielding layers 128A, and the capping layers 128C may be grown on the main layers 128B.

As a result of the epitaxy processes used to form the epitaxial source/drain regions 128, upper surfaces of the epitaxial source/drain regions have facets which expand laterally outward beyond sidewalls of the semiconductor fins 62 and the nanostructures 64, 66. However, the insulating fins 92 (where present) block the lateral epitaxial growth. Therefore, adjacent epitaxial source/drain regions 128 remain separated after the epitaxy process is completed as illustrated by FIG. 20C. The epitaxial source/drain regions 128 contact the sidewalls of the insulating fins 92. In the illustrated embodiment, the epitaxial source/drain regions 128 are grown so that the upper surfaces of the epitaxial source/drain regions 128 are disposed below the top surfaces of the insulating fins 92. In various embodiments, the upper surfaces of the epitaxial source/drain regions 128 are disposed above the top surfaces of the insulating fins 92; the upper surfaces of the epitaxial source/drain regions 128 have portions disposed above and below the top surfaces of the insulating fins 92; or the like.

Figure 21A:
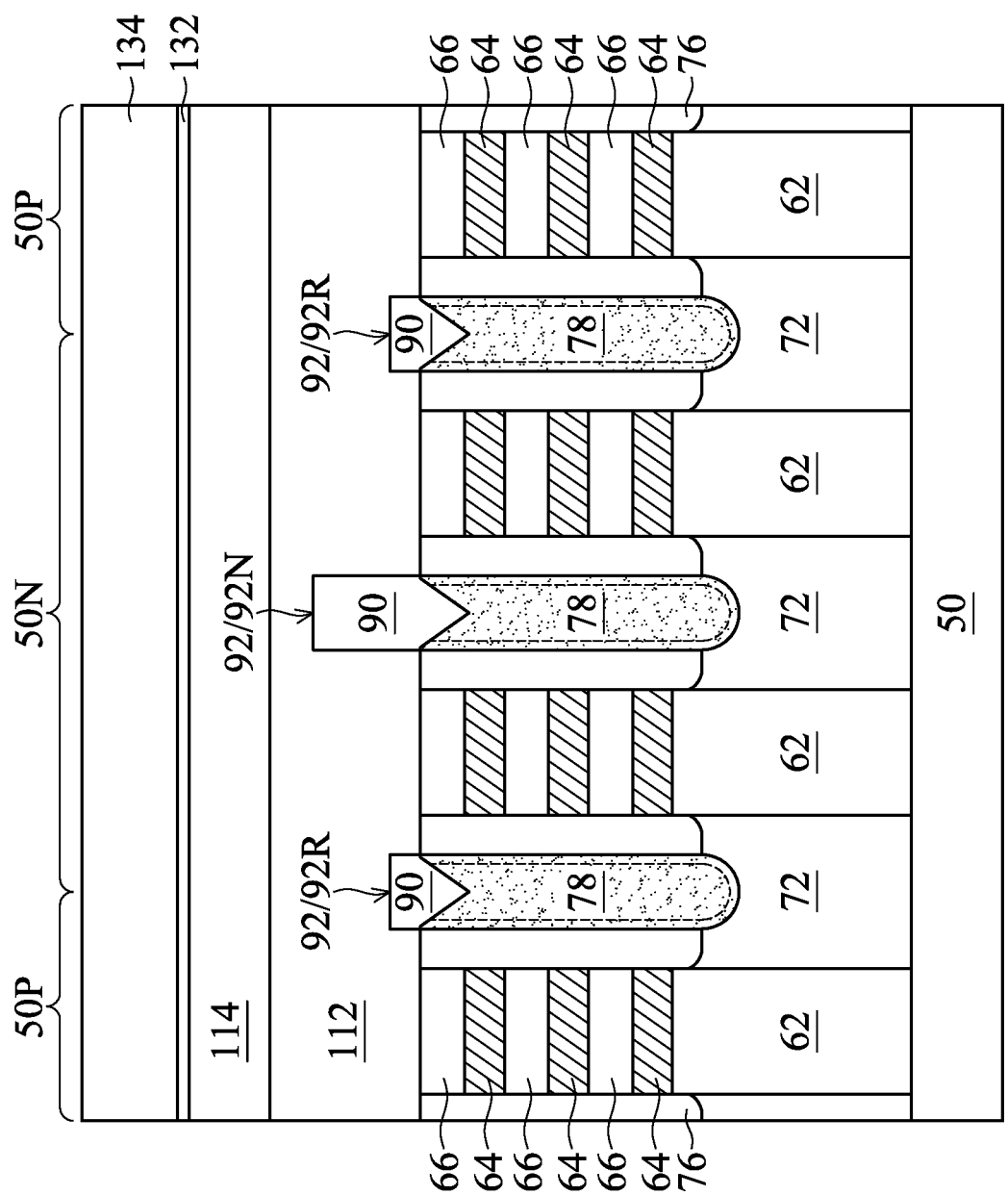
Figure 21B:
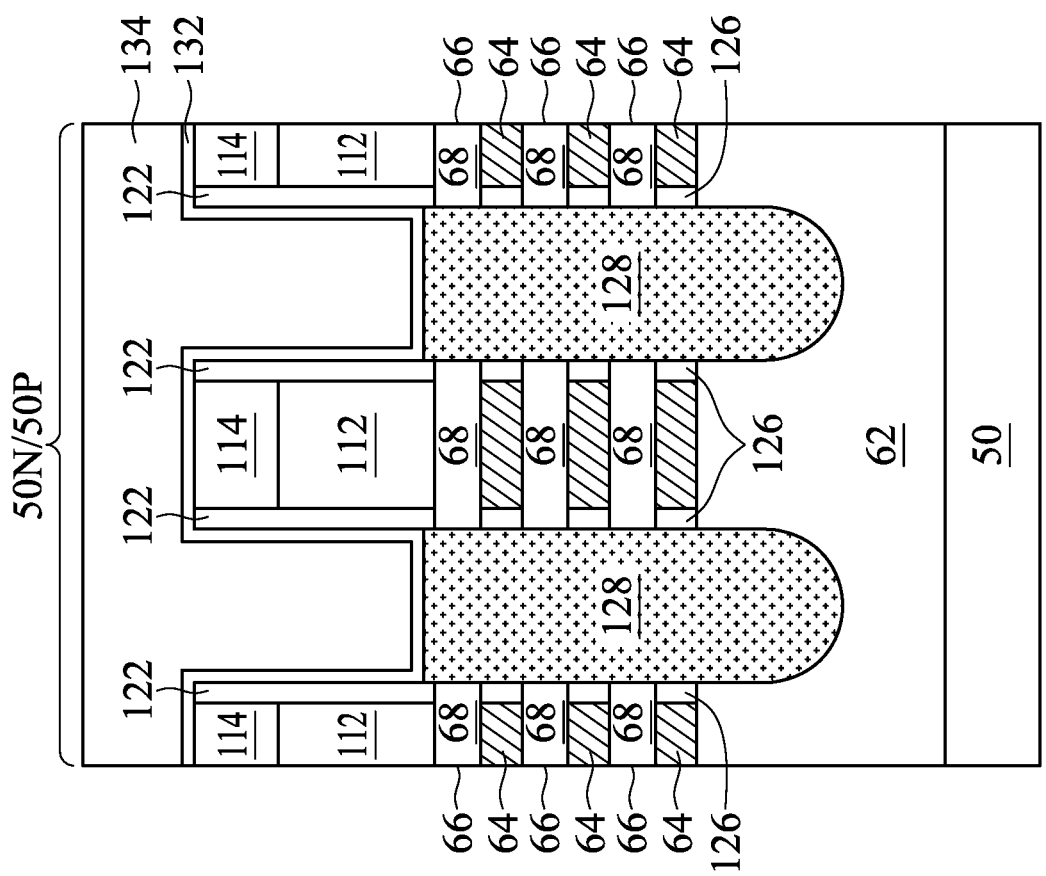

In FIGS. 21A-21B, a first inter-layer dielectric (ILD) 134 is deposited over the epitaxial source/drain regions 128, the gate spacers 122, the masks 114 (if present) or the dummy gates 112. The first ILD 134 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other dielectric materials formed by any acceptable process may be used.

In some embodiments, a contact etch stop layer (CESL) 132 is formed between the first ILD 134 and the epitaxial source/drain regions 128, the gate spacers 122, and the masks 114 (if present) or the dummy gates 112. The CESL 132 may be formed of a dielectric material having a high etching selectivity from the etching of the first ILD 134, such as silicon nitride, silicon oxide, silicon oxynitride, or the like, which may be formed by any suitable method, such as CVD, ALD, or the like.

Figure 22A:
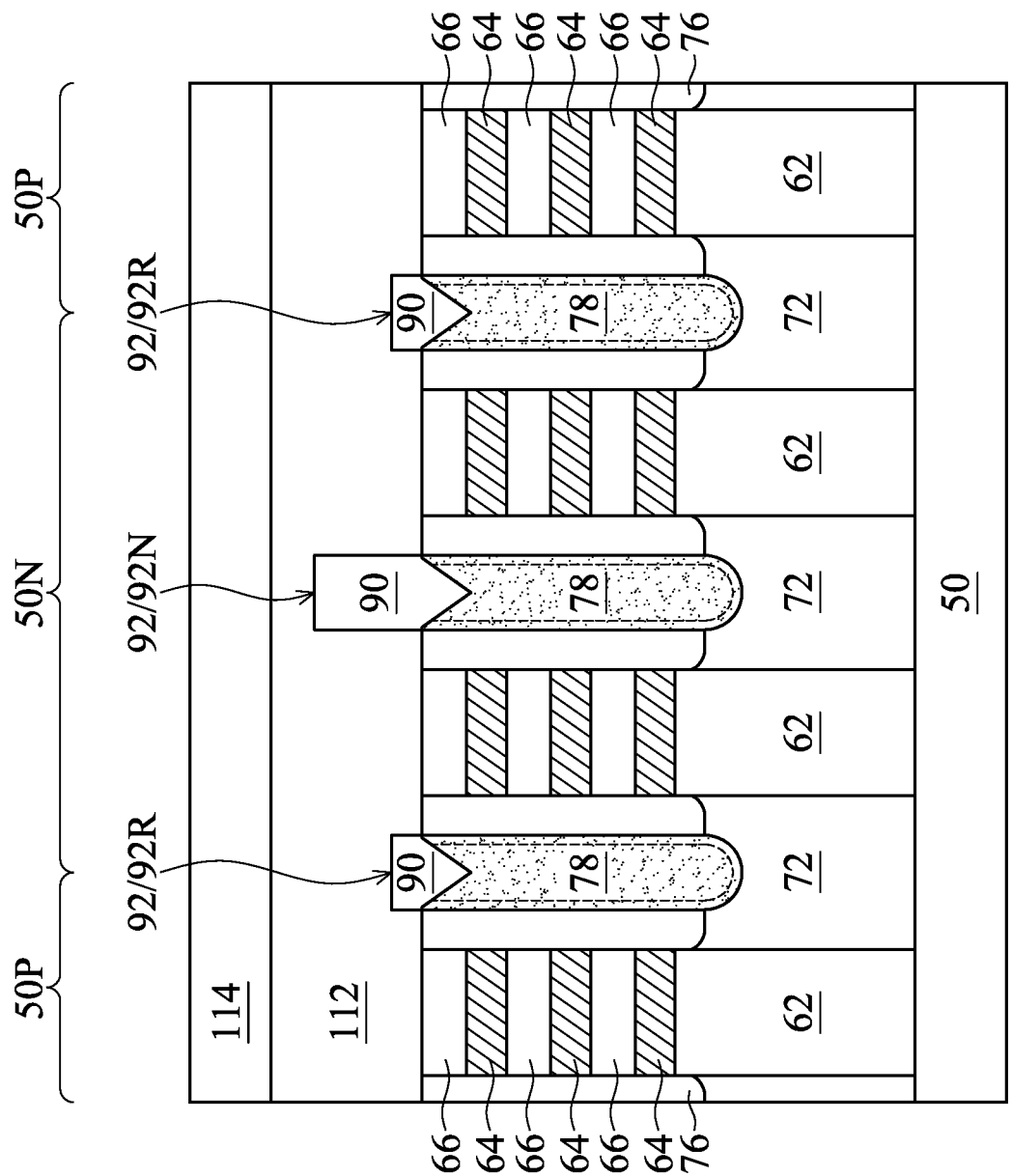
Figure 22B:
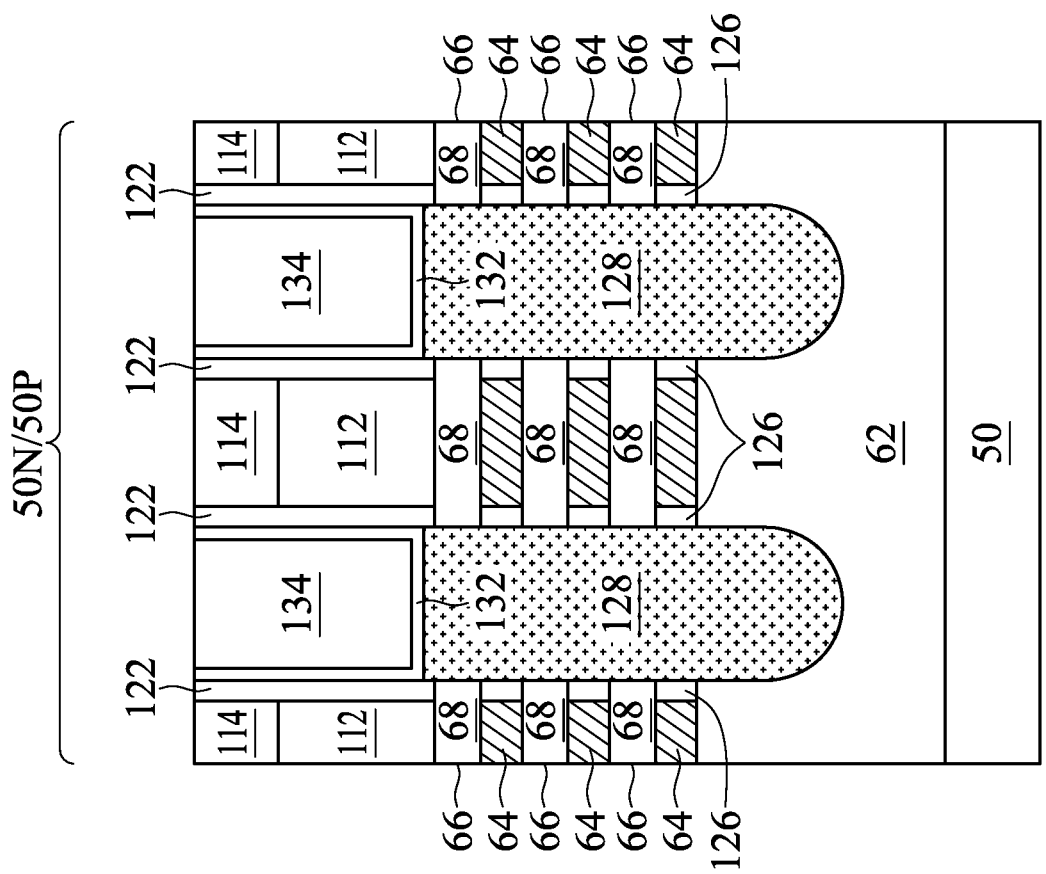

In FIGS. 22A-22B, a removal process is performed to level the top surfaces of the first ILD 134 with the top surfaces of the masks 114 (if present) or the dummy gates 112. In some embodiments, a planarization process such as a chemical mechanical polish (CMP), an etch-back process, combinations thereof, or the like may be utilized. The planarization process may also remove the masks 114 on the dummy gates 112, and portions of the gate spacers 122 along sidewalls of the masks 114. After the planarization process, the top surfaces of the gate spacers 122, the first ILD 134, the CESL 132, and the masks 114 (if present) or the dummy gates 112 are coplanar (within process variations). Accordingly, the top surfaces of the masks 114 (if present) or the dummy gates 112 are exposed through the first ILD 134. In the illustrated embodiment, the masks 114 remain, and the planarization process levels the top surfaces of the first ILD 134 with the top surfaces of the masks 114.

Figure 23A:
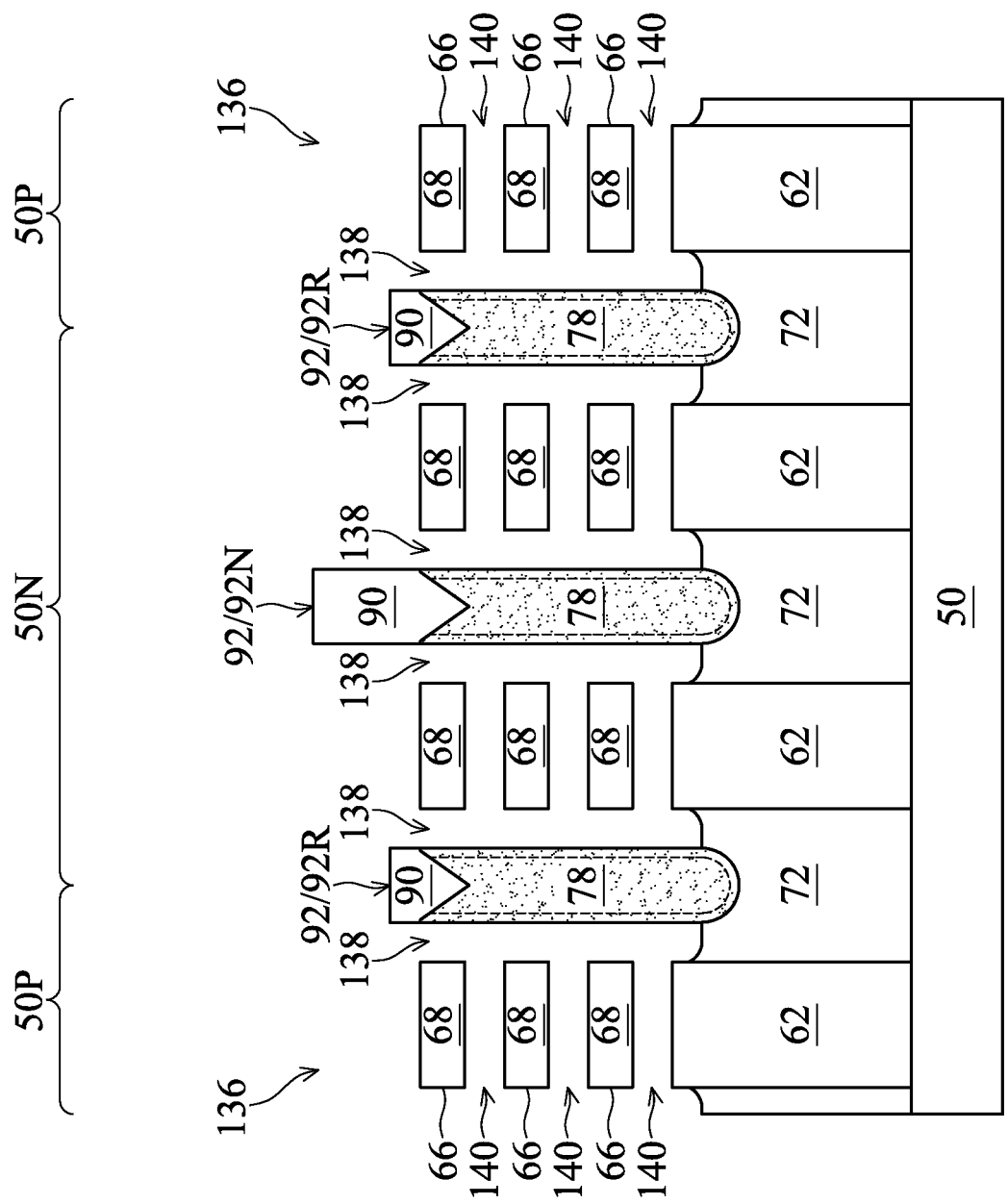
Figure 23B:
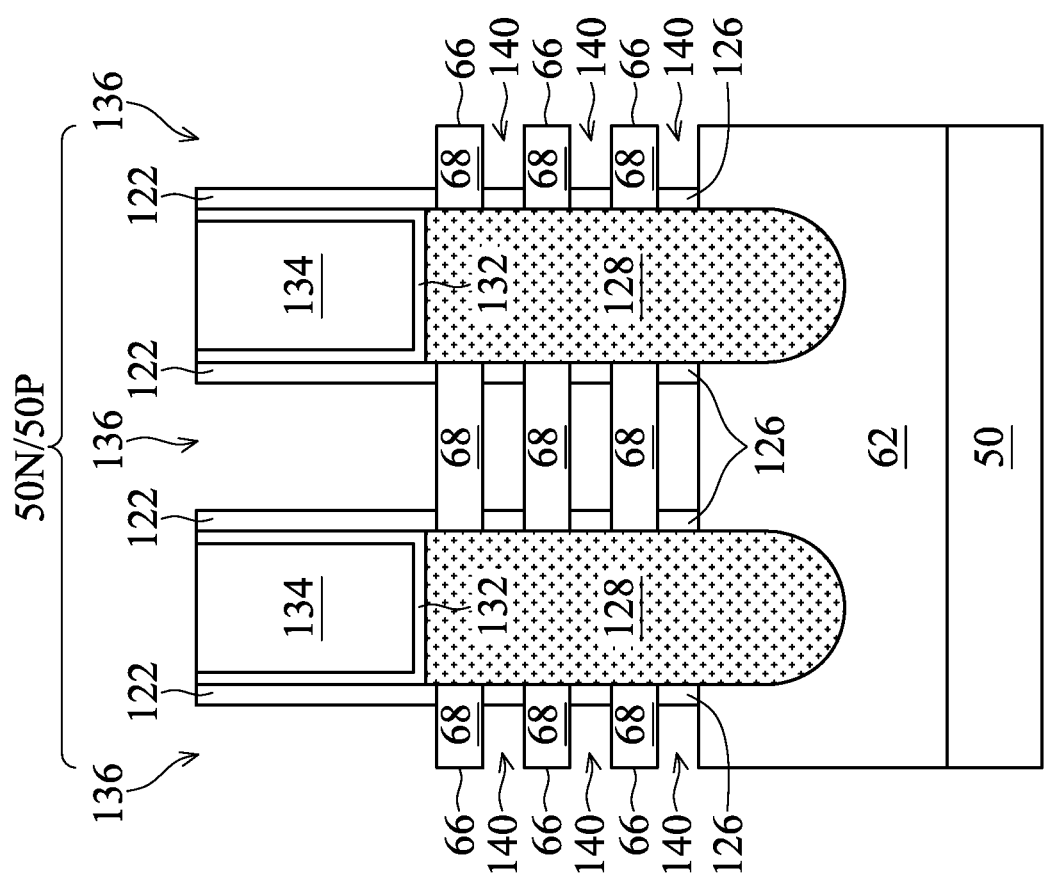

In FIGS. 23A-23B, the masks 114 (if present) and the dummy gates 112 are removed in an etching process, so that recesses 136 are formed. In some embodiments, the dummy gates 112 are removed by an anisotropic etching process. For example, the etching process may include a dry etch performed using reaction gas(es) that selectively etch the dummy gates 112 at a faster rate than the first ILD 134 or the gate spacers 122. Each recess 136 exposes and/or overlies portions of the channel regions 68. Portions of the nanostructures 66 which act as the channel regions 68 are disposed between adjacent pairs of the epitaxial source/drain regions 128.

The remaining portions of the sacrificial spacers 76 are then removed to expand the recesses 136, such that openings 138 are formed in regions between semiconductor fins 62 and the insulating fins 92. The remaining portions of the nanostructures 64 are also removed to expand the recesses 136, such that openings 140 are formed in regions between the nanostructures 66. The remaining portions of the nanostructures 64 and the sacrificial spacers 76 can be removed by any acceptable etching process that selectively etches the material(s) of the nanostructures 64 and the sacrificial spacers 76 at a faster rate than the material of the nanostructures 66. The etching may be isotropic. For example, when the nanostructures 64 and the sacrificial spacers 76 are formed of silicon germanium and the nanostructures 66 are formed of silicon, the etching process may be a wet etch performed using tetramethylammonium hydroxide (TMAH), ammonium hydroxide ($NH_4OH$), or the like as an etchant. In some embodiments, a trim process (not separately illustrated) is performed to decrease the thicknesses of the exposed portions of the nanostructures 66.

FIGS. 24A-26B illustrate a process in which layers for replacement gates are formed in the recesses 136 and the openings 138, 140 (see FIG. 23A). The resulting replacement gates include gate dielectrics 152 and gate electrodes 154 (see FIGS. 26A-26B). Each respective pair of a gate dielectric 152 and a gate electrode 154 may be collectively referred to as a "gate structure." The gate structures fill the area previously occupied by the nanostructures 64, the sacrificial spacers 76, and the dummy gates 112. Each gate structure wraps around a channel region 68 of the nanostructures 66, such that the gate structure extends along the top surfaces, the sidewalls, and the bottom surfaces of the channel region 68 of the nanostructures 66. The gate structures further extend along the sidewalls of the insulating fins 92. As will be subsequently described in greater detail, some of the gate structures further extend along the top surfaces of the insulating fins 92R so as to connect the channel structures 68 of some n-type transistors in the n-type regions 50N to the channel structures 68 of some p-type transistors in the p-type regions 50P.

Figure 24A:
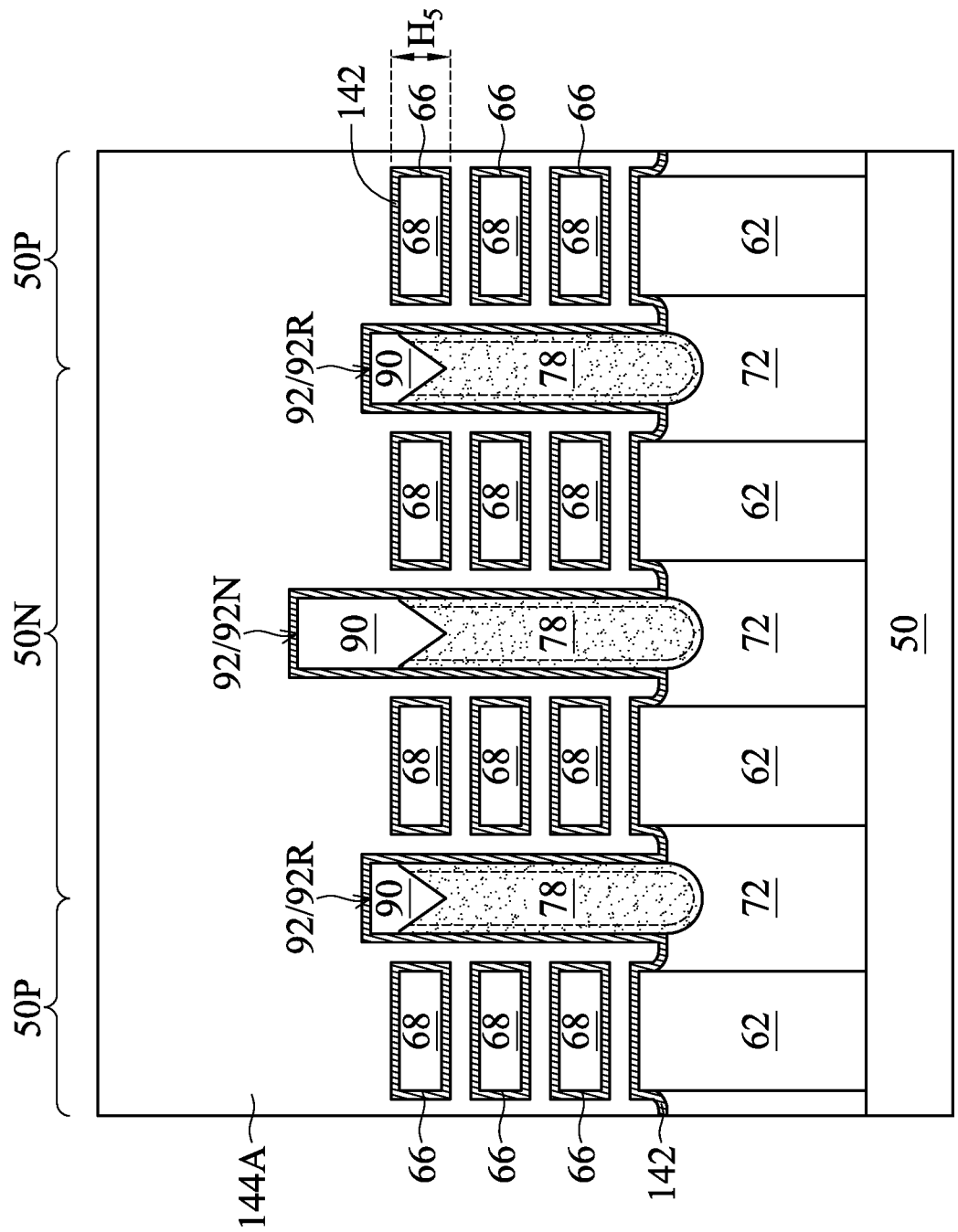
Figure 24B:
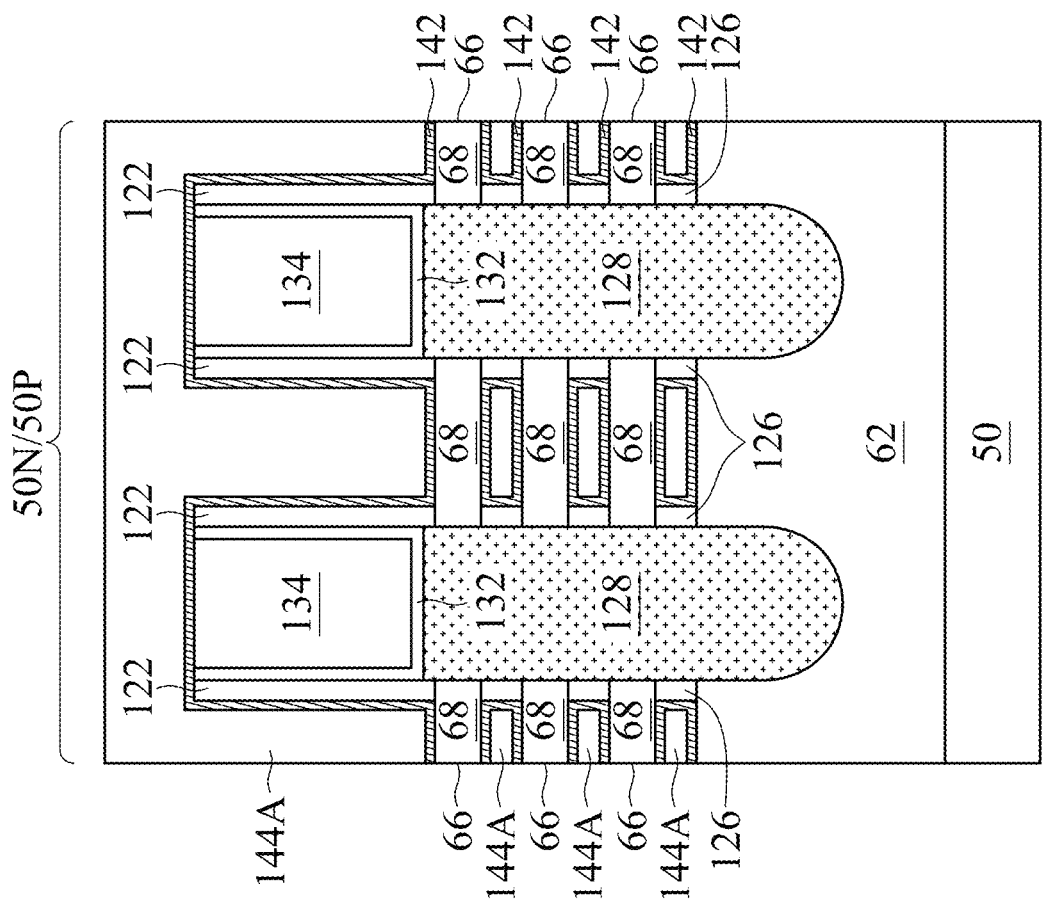

In FIGS. 24A-24B, a gate dielectric layer 142 is deposited in the recesses 136 and the openings 138, 140 (see FIG. 23A). The gate dielectric layer 142 is deposited on the sidewalls and/or the top surfaces of the semiconductor fins 62; on the top surfaces, the sidewalls, and the bottom surfaces of the nanostructures 66; on the sidewalls of the inner spacers 126 adjacent the epitaxial source/drain regions 128; on the sidewalls of the gate spacers 122; and on the sidewalls of the insulating fins 92. The gate dielectric layer 142 may also be deposited on the top surfaces of the first ILD 134, the CESL 132, the gate spacers 122, and the insulating fins 92. The gate dielectric layer 142 may include an oxide such as silicon oxide or a metal oxide, a silicate such as a metal silicate, combinations thereof, multi-layers thereof, or the like. The gate dielectric layer 142 may include a high-k dielectric material (e.g., a dielectric material having a k-value greater than about 7.0), such as a metal oxide or a silicate of hafnium, aluminum, zirconium, lanthanum, manganese, barium, titanium, lead, and combinations thereof. The dielectric material(s) of the gate dielectric layer 142 may be formed by molecular-beam deposition (MBD), ALD, PECVD, or the like. Although single-layered gate dielectric layer 142 are illustrated, the gate dielectric layer 142 may include any number of interfacial layers and any number of main layers. For example, the gate dielectric layer 142 may include an interfacial layer and an overlying high-k dielectric layer. In some embodiments, each nanostructure 66 and the portion of the gate dielectric layer 142 wrapping around the nanostructure 66 have a combined height $H_5$ in the range of 6 nm to 10 nm.

One or more work function tuning layer(s) 144A are then formed on the gate dielectric layer 142. The work function tuning layer(s) 144A may fill the remaining portions of the recesses 136 and the openings 138, 140 (see FIG. 23A). The work function tuning layer(s) 144A are formed of one or more work function materials that are acceptable to tune a work function of a nano-FET to a desired amount given the application of the device to be formed, and may be deposited using any acceptable deposition process. Acceptable work function materials include titanium nitride, tantalum nitride, titanium aluminum, titanium aluminum carbide, tantalum aluminum, tantalum carbide, combinations thereof, or the like, which may be deposited by ALD, CVD, PVD, or the like.

Figure 25A:
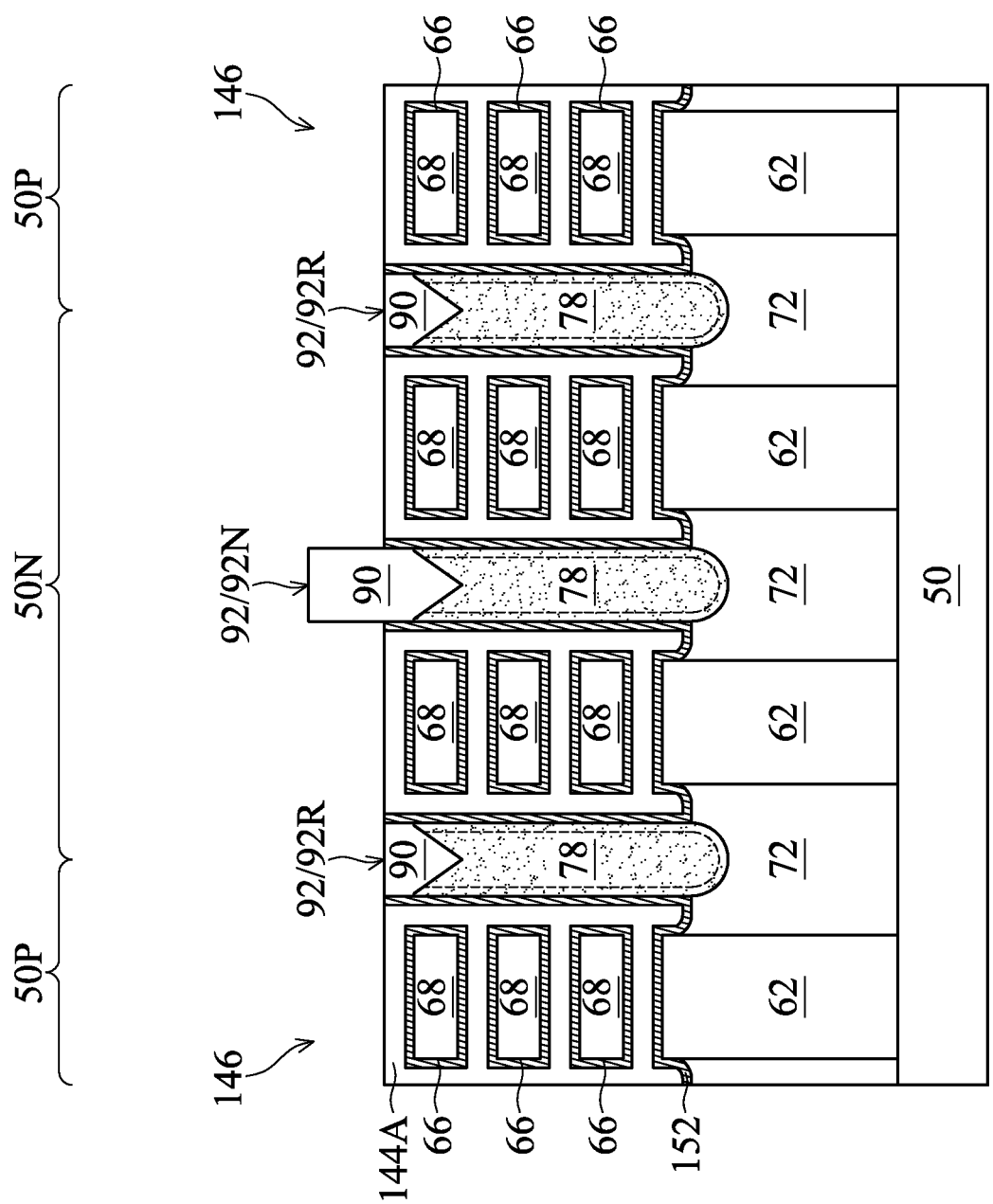
Figure 25B:
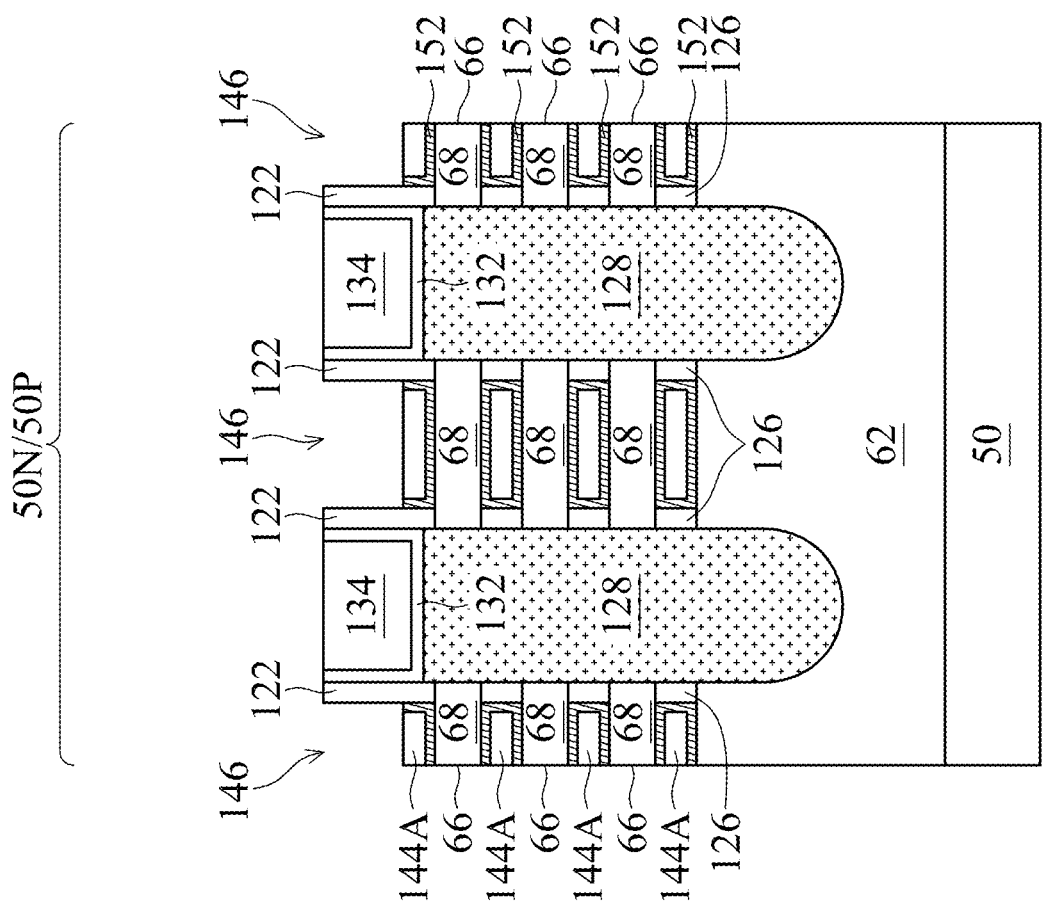

In FIGS. 25A-25B, the work function tuning layer(s) 144A are recessed to form recess 146 (which are reform portions of the recesses 136). Specifically, the top surfaces of the work function tuning layer(s) 144A are recessed below the top surfaces of the insulating fins 92N. The work function tuning layer(s) 144A, when recessed, have portions left in the openings 138, 140 (see FIG. 23A). After the recessing, the top surfaces of the work function tuning layer(s) 144A are disposed beneath the top surfaces of the insulating fins 92N. Although the top surfaces of the work function tuning layer(s) 144A are illustrated as being flush with the top surfaces of the insulating fins 92R, the top surfaces of the work function tuning layer(s) 144A may be disposed above or below the top surfaces of the insulating fins 92R.

The work function tuning layer(s) 144A may be recessed by a chemical mechanical polish (CMP) process, an etching process, combinations thereof, or the like. In some embodiments, a CMP process is performed until the top surfaces of the work function tuning layer(s) 144A, the first ILD 134, the CESL 132, the gate spacers 122, and the insulating fins 92N are coplanar (within process variation), and then an etching process is performed until the top surfaces of the work function tuning layer(s) 144A are disposed beneath the top surfaces of the first ILD 134, the CESL 132, the gate spacers 122, and the insulating fins 92N. The etching process may be selective to the work function tuning layer(s) 144A (e.g., selectively etches the material(s) of the work function tuning layer(s) 144A at a faster rate than the materials of the insulating fins 92, the gate spacers 122, the CESL 132, the first ILD 134, and the gate dielectric layer 142). The etching may be anisotropic. For example, the etching process may be a dry etch performed using nitrogen ($N_2$), hydrogen ($H_2$), and helium (He) gas as etchants while generating a plasma; a dry etch performed using hydrogen bromide (HBr), chlorine ($Cl_2$), boron trichloride ($BCl_3$), and methane ($CH_4$) gas as etchants while generating a plasma; a dry etch performed using chlorine ($Cl_2$), a nitrogen-containing functional group (NR), and oxygen ($O_2$) gas as etchants while generating a plasma; or a dry etch performed using nitrogen ($N_2$), hydrogen ($H_2$), methane ($CH_4$), and argon (Ar) gas as etchants while generating a plasma. Timed etching processes may be used to stop the etching of the work function tuning layer(s) 144A after the work function tuning layer(s) 144A have been recessed by a desired amount.

The gate dielectric layer 142 may also be recessed during the recessing of the work function tuning layer(s) 144A. The gate dielectric layer 142 may be recessed concurrently with the work function tuning layer(s) 144A, or may be separately recessed after the work function tuning layer(s) 144A are recessed. The gate dielectric layer 142, when recessed, has portions left in the openings 138, 140 (thus forming the gate dielectrics 152).

Figure 26A:
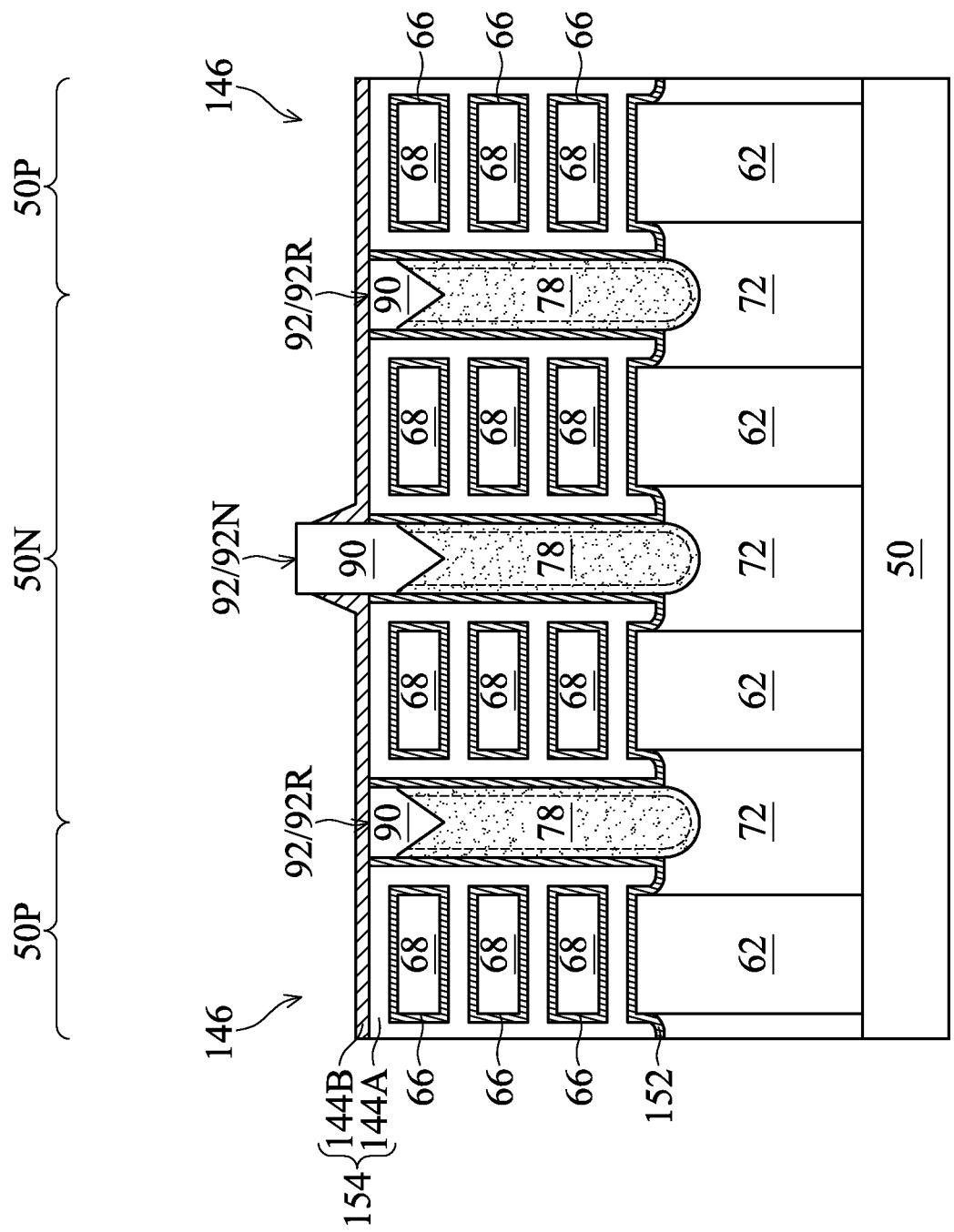
Figure 26B:
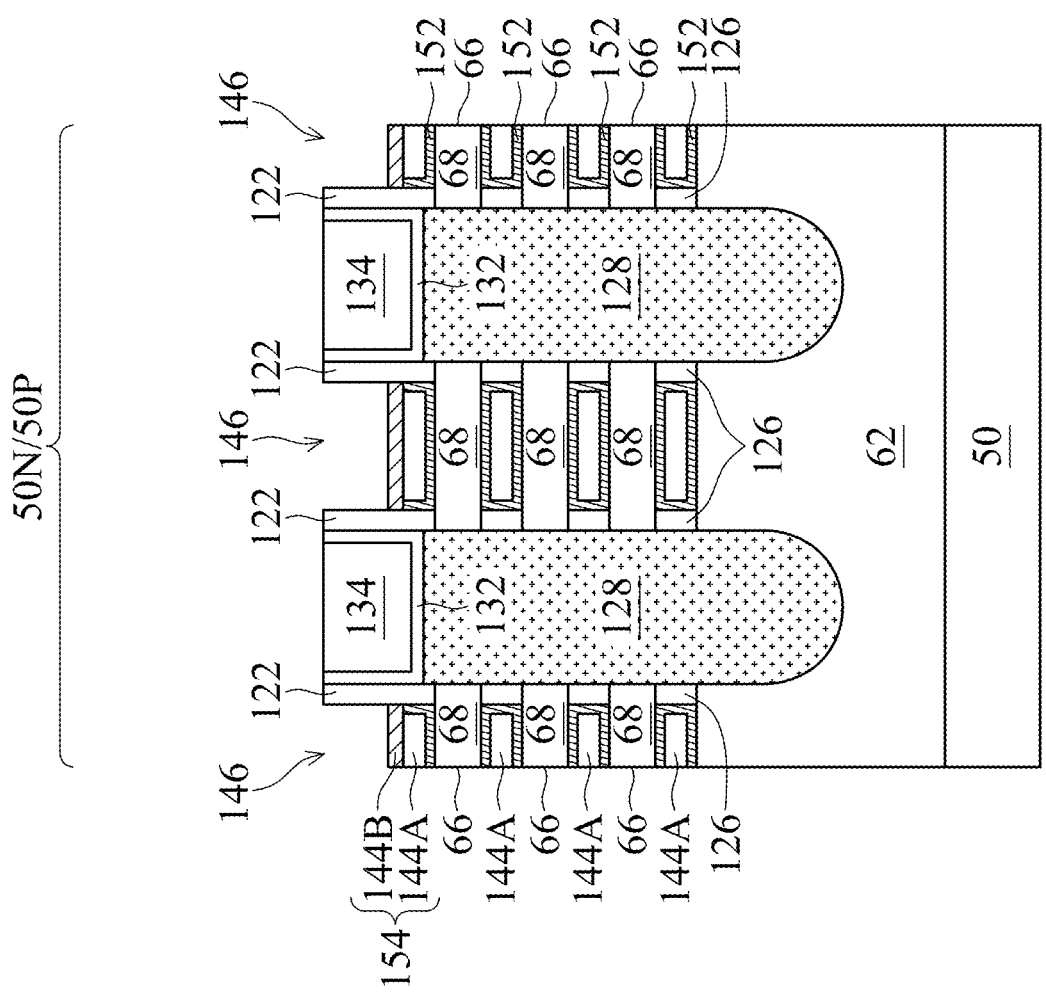

In FIGS. 26A-26B, fill layers 144B are formed on the work function tuning layer(s) 144A (and the gate dielectrics 152) to complete the formation of the gate electrodes 154. The gate electrodes 154 include the work function tuning layer(s) 144A and the fill layers 144B. Although not separately illustrated, the gate electrodes 154 may also include any number of barrier layers and any number of glue layers. In the illustrated embodiment, the fill layers 144B fill the lower portions of the recesses 146, so that gate masks may be subsequently formed in the upper portions of the recesses 146. Thus, the top surfaces of the fill layers 144B are disposed beneath the top surfaces of the insulating fins 92N. In another embodiment (subsequently described for FIGS. 32A-32B), gate masks are omitted and the fill layers 144B fill the lower and upper portions of the recesses 146.

The fill layers 144B may be formed of a conductive material, such as a metal, such as tungsten, ruthenium, cobalt, copper, molybdenum, nickel, combinations thereof, or the like, which may be deposited by ALD, CVD, PVD, or the like. In some embodiments, the fill layers 144B are formed of tungsten, such as fluorine-free tungsten, which is deposited by a selective deposition process, such as a selective ALD process or a selective PEALD process. Fluorine-free tungsten is tungsten that is free of fluorine, and is deposited with a fluorine-free tungsten source precursor, e.g., a tungsten source precursor that is free of fluorine. Depositing tungsten with a fluorine-free tungsten source precursor avoids the undesired production of corrosive fluoride byproducts during deposition, which may increase manufacturing yield. The selective deposition process may be performed to selectively deposit the fill layers 144B on conductive materials (e.g., the work function tuning layer(s) 144A) without depositing the fill layers 144B on insulating materials (e.g., the first ILD 134, the gate spacers 122, and the insulating fins 92). In some embodiments, the fill layers 144B are formed of a material having a high etching selectivity from the etching of insulation materials, so they can act as etch stop layers when subsequently forming contacts to the resulting gate structures.

In some embodiments, the fill layers 144B is a fluorine-free tungsten layer, which is formed by selectively depositing fluorine-free tungsten with an atomic layer deposition (ALD) process. The ALD process is performed by placing the substrate 50 in a deposition chamber and cyclically dispensing multiple source precursors into the deposition chamber, thus exposing the surfaces of the work function tuning layer(s) 144A to the source precursors. The source precursors include a first precursor and a second precursor, which are any acceptable precursors capable of reacting to deposit the conductive material of the fill layers 144B. In some embodiments, the first precursor is a fluorine-free tungsten-containing precursor and the second precursor is a hydrogen-containing precursor. Acceptable fluorine-free tungsten-containing precursors for depositing fluorine-free tungsten include tungsten (V) chloride ($WCl_5$) and the like. Acceptable hydrogen-containing precursors for depositing fluorine-free tungsten include hydrogen ($H_2$) and the like. Other acceptable precursors may be used. A first pulse of an ALD cycle is performed by dispensing the first precursor (e.g., a fluorine-free tungsten-containing precursor such as tungsten (V) chloride) into the deposition chamber. The first precursor is kept in the deposition chamber until the first precursor has reacted with the available reactive sites on the surfaces of the work function tuning layer(s) 144A. The first precursor is then purged from the deposition chamber, such as by any acceptable vacuuming process and/or by flowing an inert gas into the deposition chamber. A second pulse of the ALD cycle is performed by dispensing the second precursor (e.g., a hydrogen-containing precursor such as water) into the deposition chamber. The second precursor is kept in the deposition chamber until the second precursor has reacted with the available reactive sites formed by the first precursor. The second precursor is then purged from the deposition chamber, such as by any acceptable vacuuming process and/or by flowing an inert gas into the deposition chamber. Each ALD cycle results in the deposition of an atomic layer (sometimes called a monolayer) of the conductive material of the fill layers 144B. The ALD cycle is repeated a number of times, until the conductive material of the fill layers 144B is deposited to a desired thickness.

As noted above, the insulating fins 92R are recessed below the insulating fins 92N. During selective deposition of the fill layers 144B, the material of some adjacent fill layers 144B may merge in areas over the insulating fins 92R, so that a subset of the fill layers 144B extend over the insulating fins 92R. As a result, a subset of the resulting gate structures are shared between multiple transistors. Specifically, a fill layer 144B may extend continuously across top surfaces of first work function tuning layer(s) 144A of a first transistor, an insulating fin 92R, and second work function tuning layer(s) 144A of a second transistor, thereby interconnecting the gates of the first transistor and the second transistor. The fill layers 144B are formed of a low-resistance conductive material, and interconnecting the gates of transistors with the fill layers 144B can reduce short channel effects and leakage in the resulting devices, particularly during sub-threshold operation, increasing device performance. As also noted above, in some embodiments where SRAM cells are formed, the insulating fins 92R are disposed at boundaries of the n-type regions 50N and the p-type regions 50P. In such embodiments, a fill layer 144B may connect work function tuning layer(s) 144A of an n-type transistor in an n-type region 50N to work function tuning layer(s) 144A of a p-type transistor in a p-type region 50P, thereby forming a CMOS inverter of an SRAM cell. The insulating fins 92N are tall enough that adjacent fill layers 144B may extend up along portions of the sidewalls of the insulating fins 92N, but may not merge in areas over the insulating fins 92N, thereby preventing the shorting of the gates of adjacent CMOS inverters. Thus, a top surface of a resulting gate structure (e.g., a top surface of a fill layer 144B) is disposed above a top surface of an insulating fin 92R and below a top surface of an insulating fin 92N.

The formation of the gate dielectrics 152 in the n-type regions 50N and the p-type regions 50P may occur simultaneously such that the gate dielectrics 152 in each type of region are formed of the same material(s), and the formation of the gate electrodes 154 in the n-type regions 50N and the p-type regions 50P may occur simultaneously such that the gate electrodes 154 in each type of region are formed of the same material(s). In some embodiments, the gate dielectrics 152 in each type of region may be formed by distinct processes, such that the gate dielectrics 152 may include different materials and/or have a different number of layers, and/or the gate electrodes 154 in each type of region may be formed by distinct processes, such that the gate electrodes 154 may include different materials and/or have a different number of layers. Various masking steps may be used to mask and expose appropriate regions when using distinct processes. In some embodiments, the work function tuning layer(s) 144A in the n-type regions 50N and the p-type regions 50P are formed by distinct processes such that the work function tuning layer(s) 144A in the regions may include different materials and/or have a different number of layers, but the fill layers 144B in the n-type regions 50N and the p-type regions 50P are formed simultaneously such that the fill layers 144B in the regions are formed of the same material.

Figure 27A:
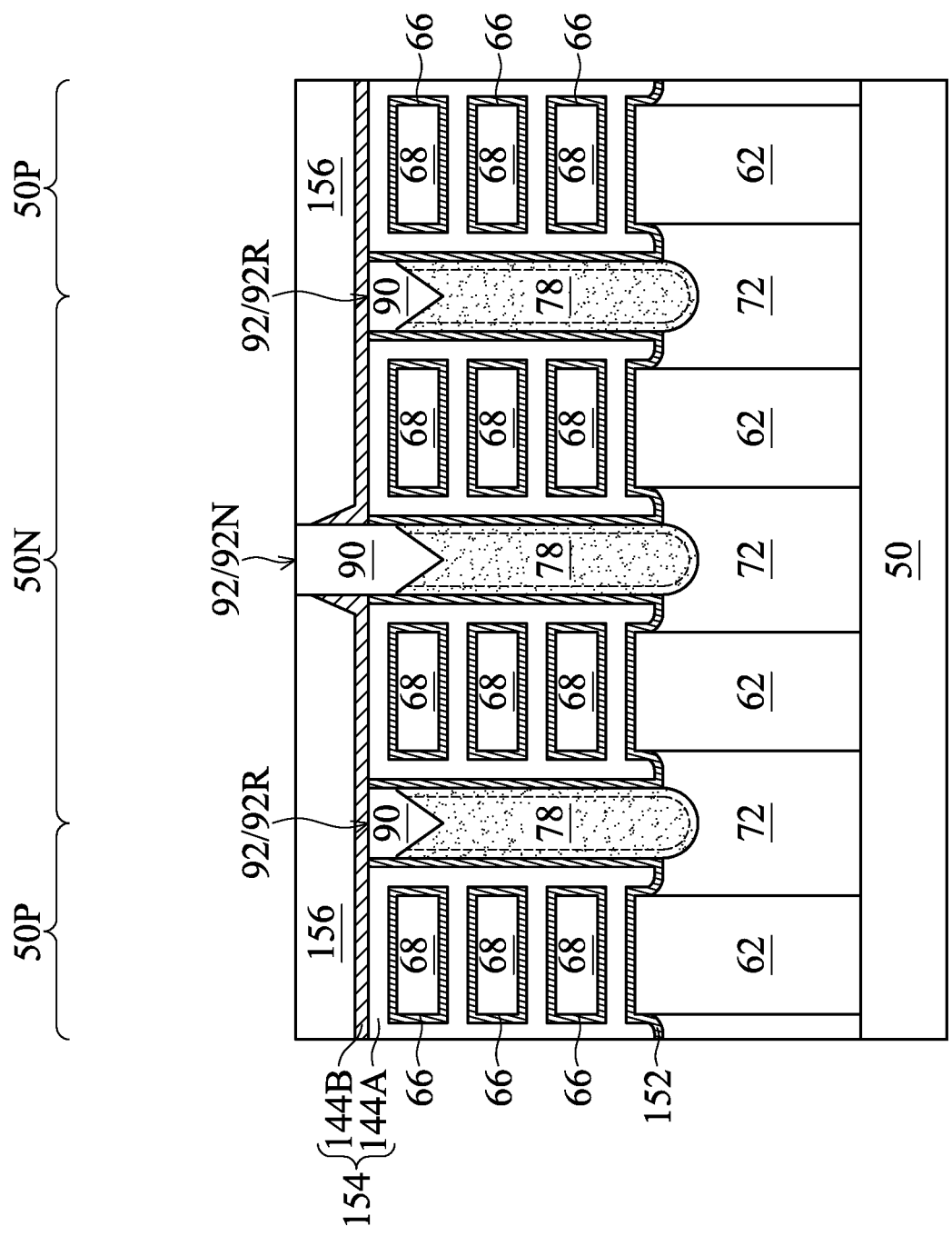
Figure 27B:
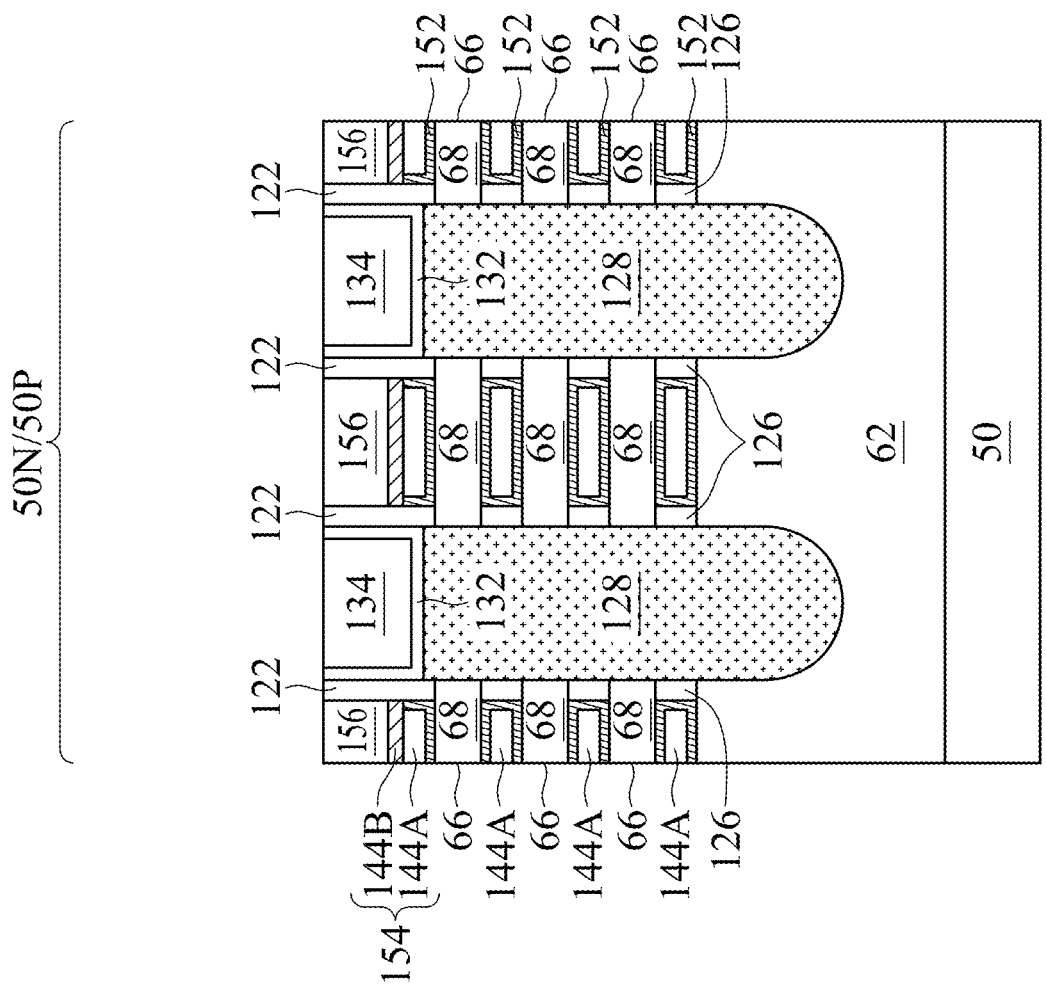

In FIGS. 27A-27B, gate masks 156 are formed over each gate structure, e.g., on the gate electrodes 154. Each gate mask 156 is thus disposed between opposing portions of the gate spacers 122. In some embodiments, forming the gate masks 156 includes forming a dielectric material in the recesses 146 and then performing a planarization process to remove excess portions of the dielectric material extending over the first ILD 134. Acceptable dielectric materials may include silicon oxide, silicon nitride, silicon oxynitride, silicon oxycarbonitride, or the like, which may be formed by a conformal deposition process such as CVD, ALD, or the like. After the planarization process, the top surfaces of the gate spacers 122, the CESL 132, the first ILD 134, and the gate masks 156 are coplanar (within process variations).

Figure 28A:
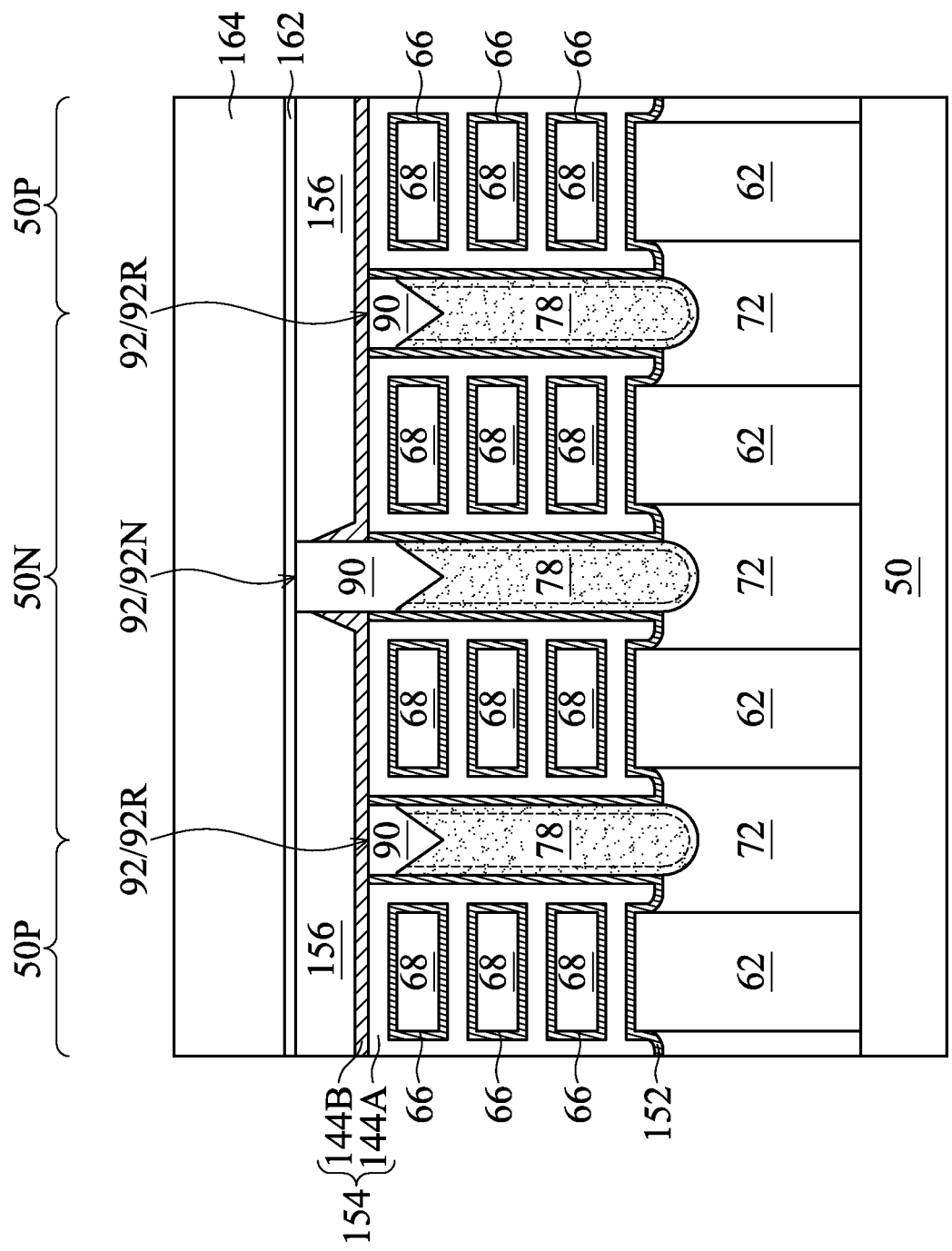
Figure 28B:
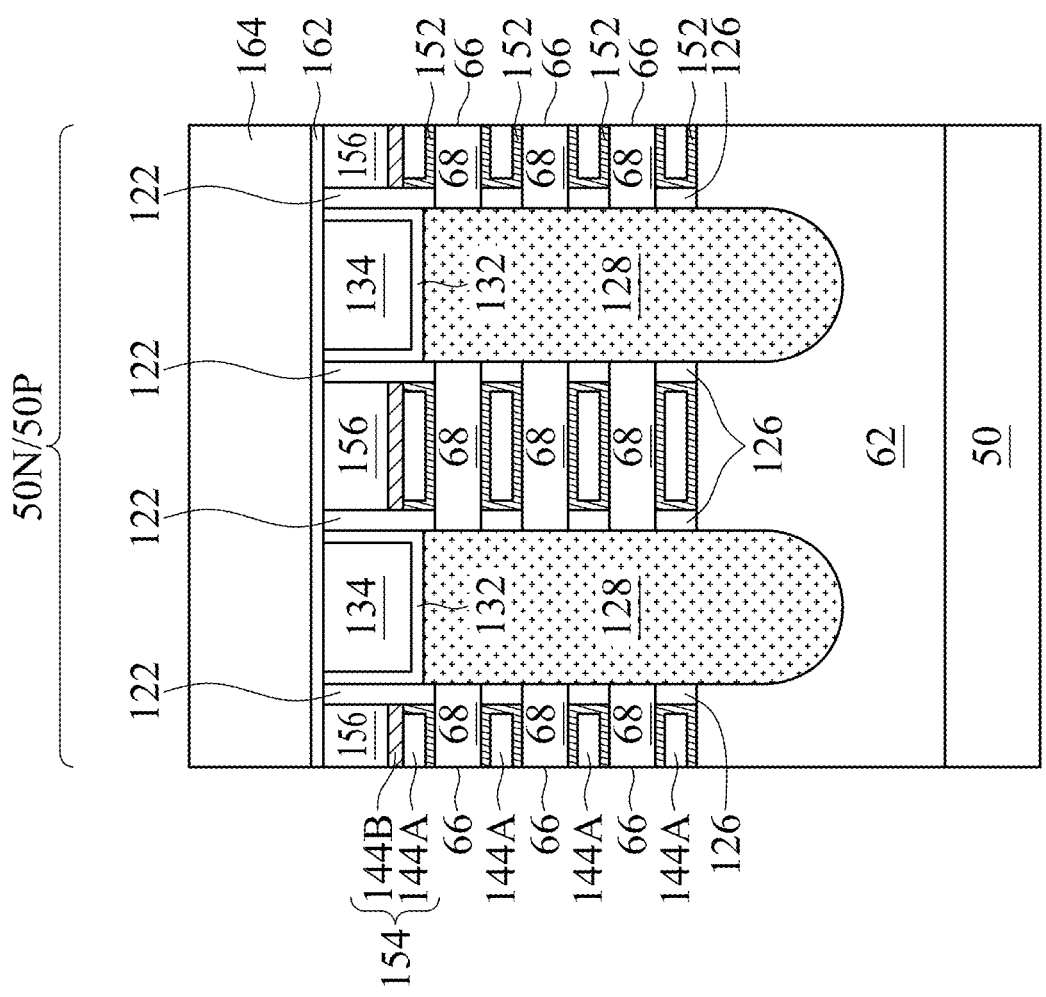

In FIGS. 28A-28B, a second ILD 164 is deposited over the gate spacers 122, the CESL 132, the first ILD 134, and the gate masks 156. In some embodiments, the second ILD 164 is a flowable film formed by a flowable CVD method. In some embodiments, the second ILD 164 is formed of a dielectric material such as PSG, BSG, BPSG, USG, or the like, which may be deposited by any suitable method, such as CVD, PECVD, or the like.

In some embodiments, an etch stop layer (ESL) 162 is formed between the second ILD 164 and the gate spacers 122, the CESL 132, the first ILD 134, and the gate masks 156. The ESL 162 may include a dielectric material, such as silicon nitride, silicon oxide, silicon oxynitride, or the like, having a high etching selectivity from the etching of the second ILD 164.

Figure 29A:
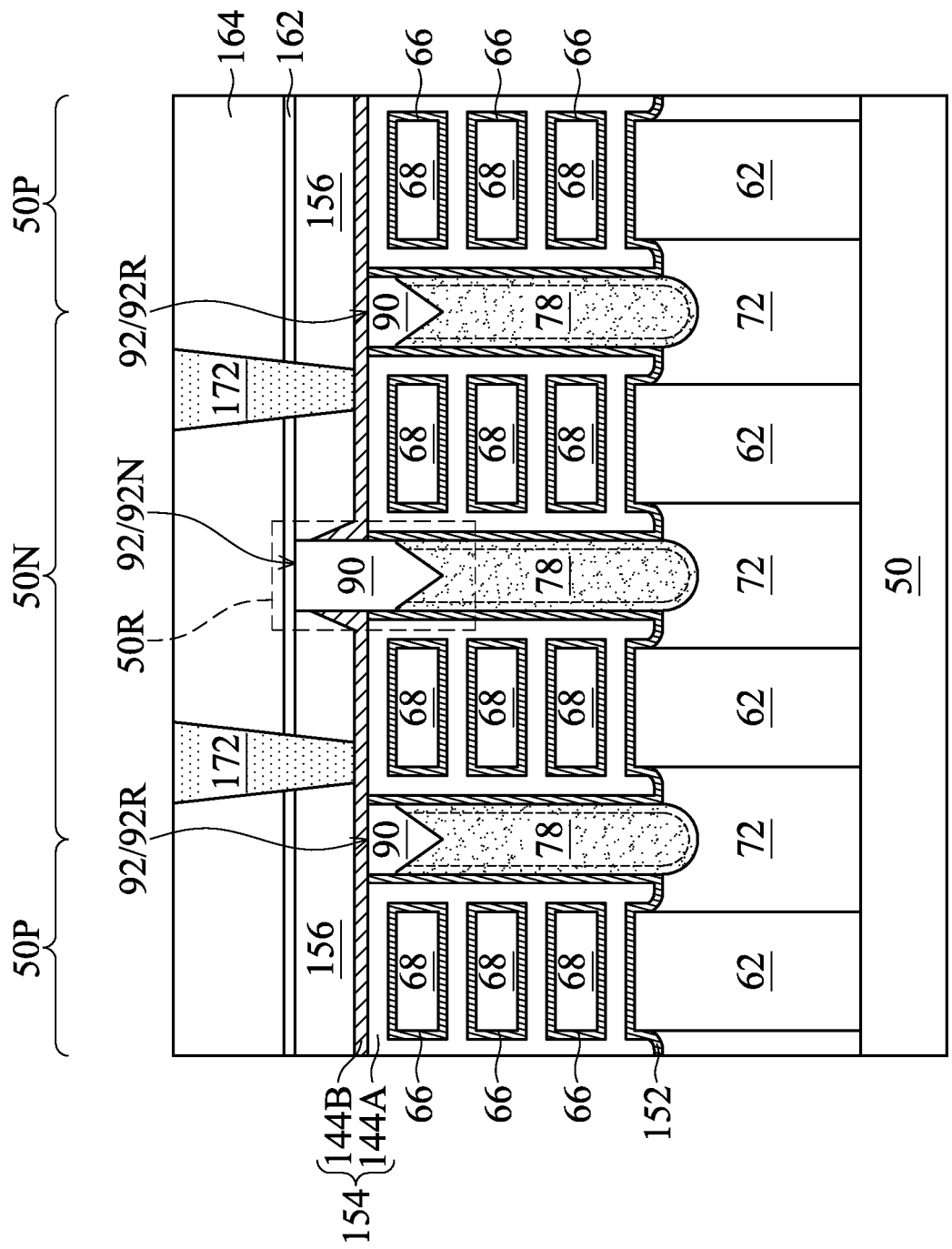
Figure 29B:
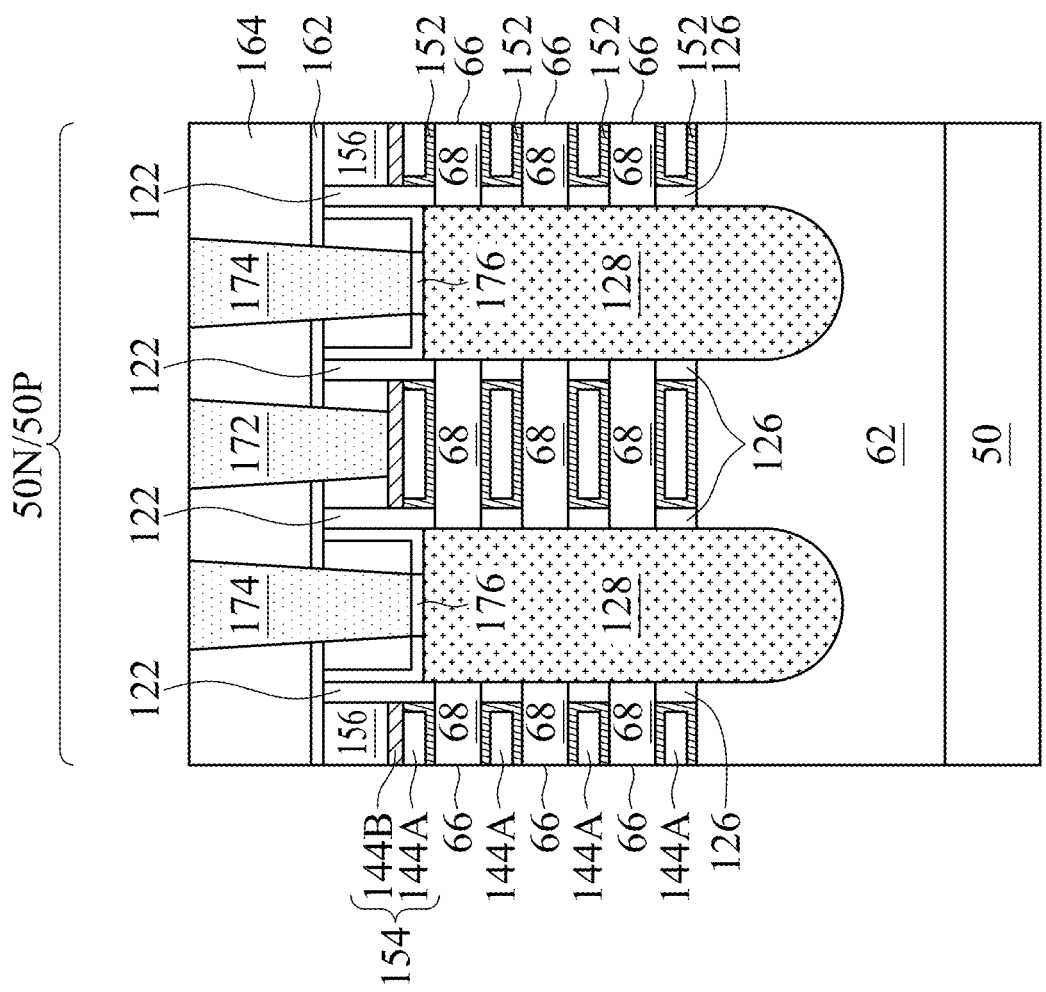

In FIGS. 29A-29B, gate contacts 172 and source/drain contacts 174 are formed to contact, respectively, gate electrodes 154 and the epitaxial source/drain regions 128. The gate contacts 172 are physically and electrically coupled to the gate electrodes 154. The source/drain contacts 174 are physically and electrically coupled to the epitaxial source/drain regions 128.

As an example to form the gate contacts 172 and the source/drain contacts 174, openings for the gate contacts 172 are formed through the second ILD 164, the ESL 162, and the gate masks 156, and openings for the source/drain contacts 174 are formed through the second ILD 164, the ESL 162, the first ILD 134 (see FIG. 28B), and the CESL 132 (see FIG. 28B). The openings may be formed using acceptable photolithography and etching techniques. A liner (not separately illustrated), such as a diffusion barrier layer, an adhesion layer, or the like, and a conductive material may be formed in the openings. The liner may include titanium, titanium nitride, tantalum, tantalum nitride, or the like. The conductive material may be copper, a copper alloy, silver, gold, tungsten, cobalt, aluminum, nickel, or the like. In some embodiments, the conductive material is tungsten, which may be deposited by CVD using tungsten fluoride ($WF_6$) as a precursor. A planarization process, such as a CMP, may be performed to remove excess material from a surface of the second ILD 164. The remaining liner and conductive material form the gate contacts 172 and the source/drain contacts 174 in the openings. In some embodiments, the gate contacts 172 and the source/drain contacts 174 are formed by a barrier-less filling process, in which the liner is omitted. The gate contacts 172 and the source/drain contacts 174 may be formed in distinct processes, or may be formed in the same process. Although shown as being formed in the same cross-sections, it should be appreciated that each of the gate contacts 172 and the source/drain contacts 174 may be formed in different cross-sections, which may avoid shorting of the contacts.

The gate contacts 172 land on and are in direct contact with the fill layers 144B of the gate electrodes 154, such that the fill layers 144B separate the gate contacts 172 from the work function tuning layer(s) 144A and the insulating fins 92R. The gate contacts 172 may partially overlap the insulating fins 92R, but do not completely overlap the insulating fins 92R. Specifically, the area of the overlap between a gate contact 172 and the work function tuning layer(s) 144A is greater than the area of the overlap between the gate contact 172 and an insulating fin 92R, which may help reduce mis-landing of the gate contacts 172. Forming the gate contacts 172 in direct contact with the fill layers 144B and avoiding mis-landing of the gate contacts 172 can help reduce device defects.

Optionally, metal-semiconductor alloy regions 176 are formed at the interfaces between the epitaxial source/drain regions 128 and the source/drain contacts 174. The metal-semiconductor alloy regions 176 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 176 can be formed before the material(s) of the source/drain contacts 174 by depositing a metal in the openings for the source/drain contacts 174 and then performing a thermal anneal process. The metal can be any metal capable of reacting with the semiconductor materials (e.g., silicon, silicon-germanium, germanium, etc.) of the epitaxial source/drain regions 128 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. After the thermal anneal process, a cleaning process, such as a wet clean, may be performed to remove any residual metal from the openings for the source/drain contacts 174, such as from surfaces of the metal-semiconductor alloy regions 176. The material(s) of the source/drain contacts 174 can then be formed on the metal-semiconductor alloy regions 176.

FIGS. 30A-31C are detailed views of insulating fins 92, in accordance with some embodiments. Specifically, cross-sectional views of insulating fins 92 in a similar region as region 50R in FIG. 28A are shown. Various material configuration and shapes of the insulating fins 92 are shown. As noted above, the top surfaces of the insulating layer(s) 78 may be concave or flat and the top surfaces of the insulating layer(s) 90 may be convex or flat. As also noted above, the insulating layer(s) 90 of the insulating fins 92 may be single-layered or multi-layered, may include different dielectric materials.

Figure 30C:
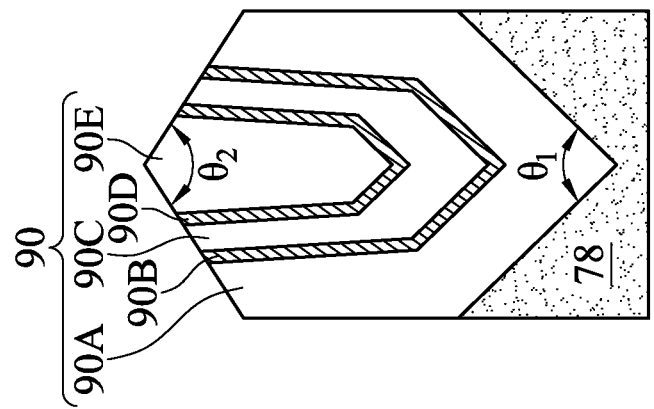
FIGS. 30A, 30B, 30C, 31A, 31B, and 31C, are detailed views of insulating fins, in accordance with some embodiments.
Figure 30B:
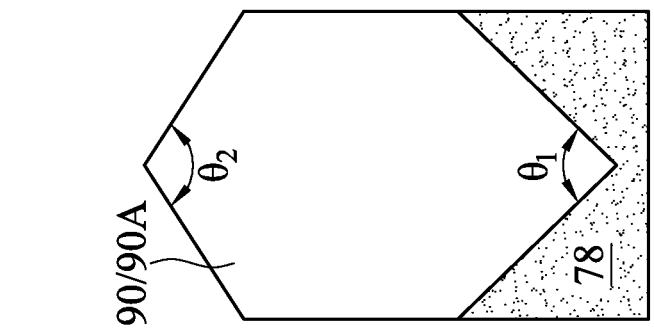
Figure 30A:
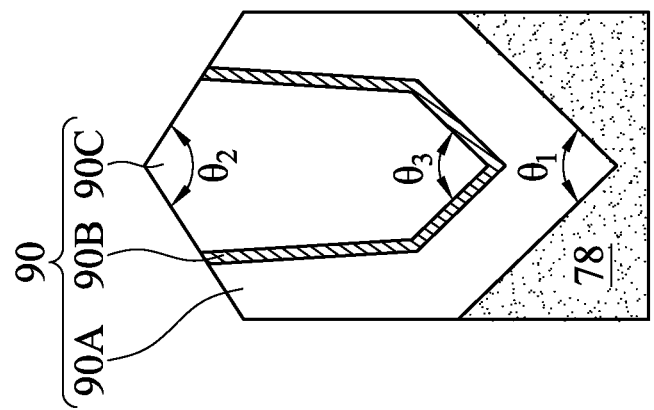

In some embodiments, the top surfaces of the insulating layer(s) 78 are concave, as illustrated by FIGS. 30A-30C. The insulating layer(s) 78 may be formed with concave top surfaces as a result of performing the recessing of the insulating layer(s) 78 described for FIG. 9. In the illustrated embodiment, the concave top surfaces of the insulating layer(s) 78 are V-shaped top surfaces which form an acute angle $\theta_1$ at the lowest points of the V-shaped top surfaces. In some embodiments, the angle $\theta_1$ is in the range of 34 degrees to 65 degrees. As a result of the insulating layer(s) 78 having concave top surfaces, the insulating layer(s) 90 fill the recesses defined by the concave top surfaces, such that they have an inverted spike shape. Accordingly, the insulating layer(s) 90 extend into the upper portions of the insulating layer(s) 78, thereby grounding the insulating layer(s) 90 and increasing the stability of the insulating fins 92.

Figure 31C:
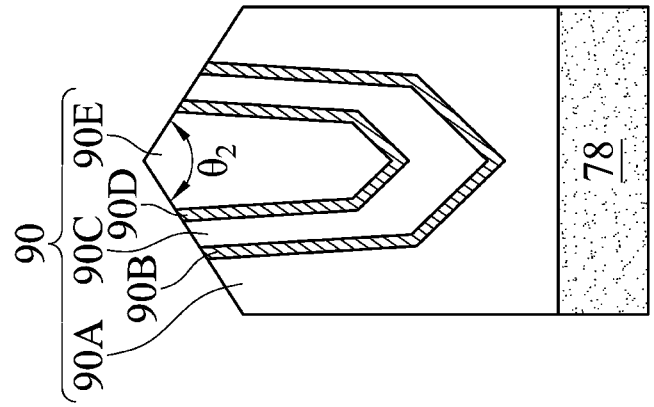
Figure 31B:
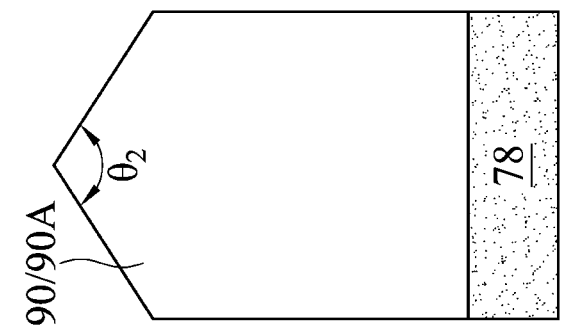
Figure 31A:
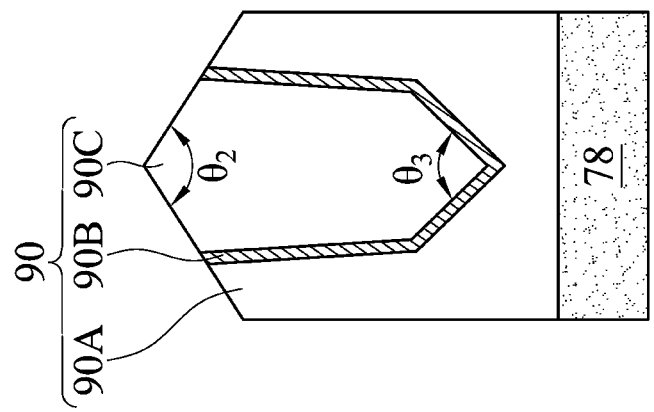

In some embodiments, the top surfaces of the insulating layer(s) 78 are flat, as illustrated by FIGS. 31A-31C. The insulating layer(s) 78 may be formed with flat top surfaces as a result of omitting the recessing of the insulating layer(s) 78 described for FIG. 9. Omitting the recessing of the insulating layer(s) 78 may reduce manufacturing costs.

In some embodiments, the top surfaces of the insulating layer(s) 90 are convex, as illustrated by FIGS. 30A-31C. In the illustrated embodiment, the convex top surfaces of the insulating layer(s) 90 are A-shaped top surfaces which form an acute angle $\theta_2$ at the highest points of the A-shaped top surfaces. In some embodiments, the angle $\theta_2$ is in the range of 10 degrees to 40 degrees. The angle $\theta_2$ may be less than the angle $\theta_1$. The insulating layer(s) 90 may be formed with convex top surfaces as a result of high losses (e.g., etching losses) during the removal process(es) that are applied to the mask 86 (see FIG. 11) and/or the excess portions of the insulating layer(s) 90 over the mask 86.

In some embodiments, the insulating layer(s) 90 include a first insulating layer 90A, a second insulating layer 90B, and a third insulating layer 90C, as illustrated by FIGS. 30A and 31A. The second insulating layer 90B is formed of a different dielectric material than the first insulating layer 90A and the third insulating layer 90C. The first insulating layer 90A and the third insulating layer 90C may be formed of the same dielectric material, or may include different dielectric materials. In some embodiments, the first insulating layer 90A and the third insulating layer 90C are formed of a high-k dielectric material such as hafnium oxide, and the second insulating layer 90B is formed of a low-k dielectric material such as silicon oxide. When the top surfaces of the insulating layer(s) 78 are concave (see FIGS. 30A-30C), the bottom surface of the first insulating layer 90A is a V-shaped bottom surface which forms the angle $\theta_1$ (previously described), and the bottom surface of the third insulating layer 90C is a V-shaped bottom surface which forms an acute angle $\theta_3$. In some embodiments, the angle $\theta_3$ is in the range of 43 degrees to 71 degrees. The angle $\theta_3$ may be greater than the angle $\theta_2$ and the angle $\theta_1$. The bottom surface of the first insulating layer 90A is on the concave/flat top surface of the underlying insulating layer(s) 78.

In some embodiments, the insulating layer(s) 90 include a single insulating layer 90A, as illustrated by FIGS. 30B and 31B. In some embodiments, the single insulating layer 90A is formed of a high-k dielectric material such as hafnium oxide.

In some embodiments, the insulating layer(s) 90 include a first insulating layer 90A, a second insulating layer 90B, a third insulating layer 90C, a fourth insulating layer 90D, and a fifth insulating layer 90E, as illustrated by FIGS. 30C and 31C. The second insulating layer 90B and the fourth insulating layer 90D are formed of different dielectric materials than the first insulating layer 90A, the third insulating layer 90C, and the fifth insulating layer 90E. The first insulating layer 90A, the third insulating layer 90C, and the fifth insulating layer 90E may be formed of the same dielectric material, or may include different dielectric materials. The second insulating layer 90B and the fourth insulating layer 90D may be formed of the same dielectric material, or may include different dielectric materials. In some embodiments, the first insulating layer 90A, the third insulating layer 90C, and the fifth insulating layer 90E are formed of a high-k dielectric material such as hafnium oxide, and the second insulating layer 90B and the fourth insulating layer 90D are formed of a low-k dielectric material such as silicon oxide. The insulating layers that are formed of a low-k dielectric material (e.g., the second insulating layer 90B and the fourth insulating layer 90D) may be formed to a smaller thickness than the insulating layers that are formed of a high-k dielectric material (e.g., the first insulating layer 90A, the third insulating layer 90C, and the fifth insulating layer 90E).

During their formation, the insulating layer(s) 90 may each be conformally deposited in the openings 88 (see FIG. 10). As a result, when the insulating layer(s) 90 are multi-layered, the uppermost insulating layer is a fill layer, and the insulating layers that underly the fill layer are conformal layers and are U-shaped. For example, in the embodiments of FIGS. 30A and 31A, the first insulating layer 90A and the second insulating layer 90B are conformal layers, while the third insulating layer 90C is a fill layer. Similarly, in the embodiments of FIGS. 30C and 31C, the first insulating layer 90A, the second insulating layer 90B, the third insulating layer 90C, and the fourth insulating layer 90D are conformal layers, while the fifth insulating layer 90E is a fill layer.

Figure 32A:
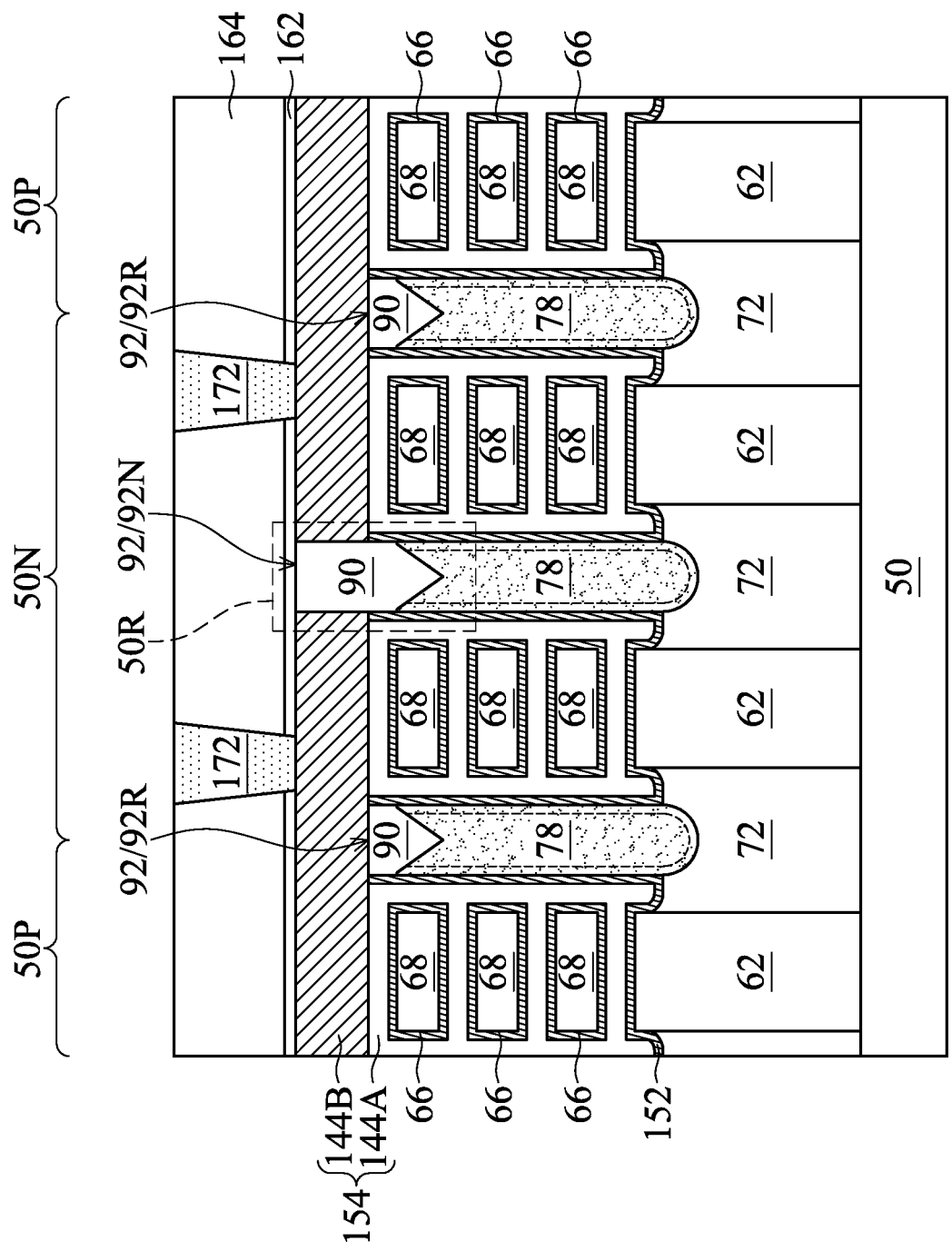
FIGS. 32A and 32B are cross-sectional views of nano-FETs, in accordance with some embodiments.
Figure 32B:
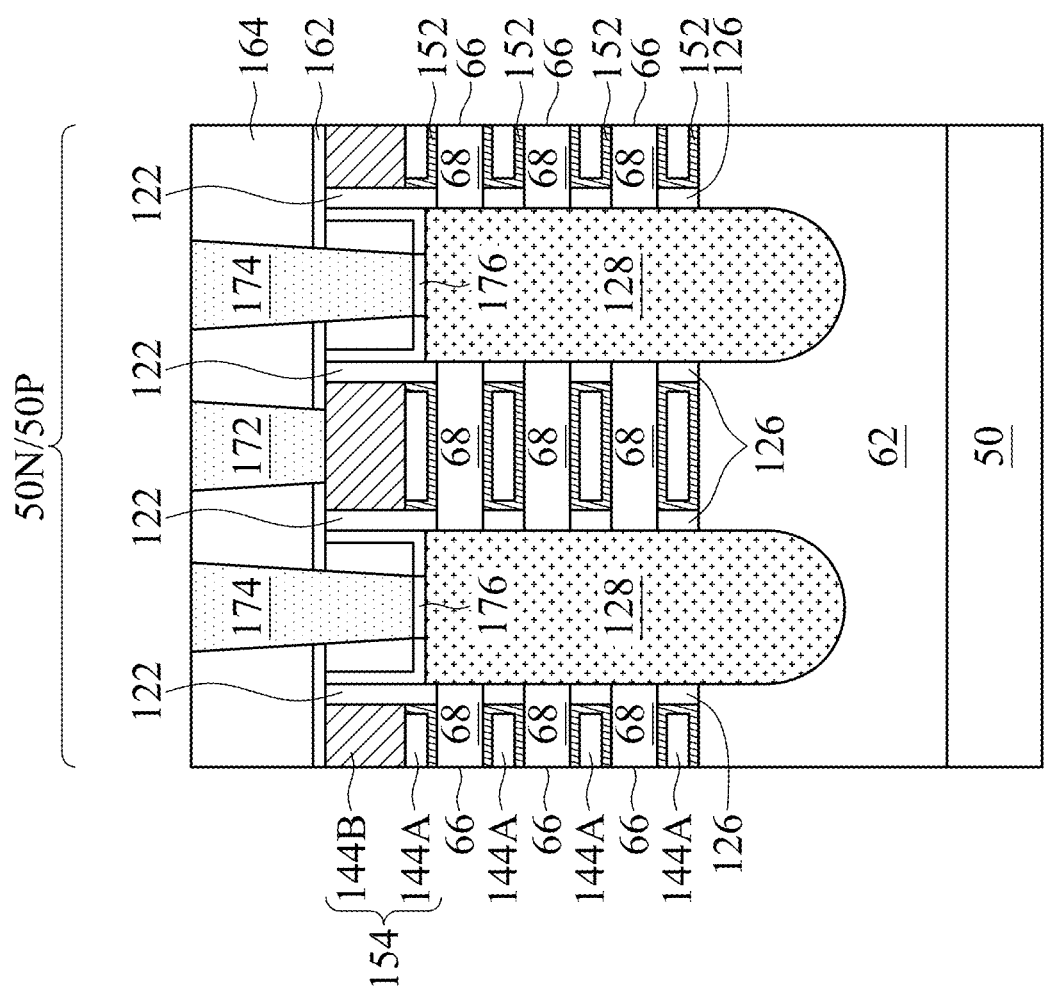

Embodiments may achieve advantages. Recessing the insulating fins 92 so that the insulating fins 92R have a lesser height than the insulating fins 92N allows some of the gate structures 150 to be formed over the insulating fins 92R but not over the insulating fins 92N. The gate structures 150 may thus be shared gates between adjacent nano-FETs. Some embodiments may be applied to SRAM cells. For example, a gate structure 150 may be formed over an insulating fin 92R at a boundary of an n-type region 50N and a p-type region 50P, such that the gate structure 150 connects the channel region of an n-type transistor in the n-type region 50N to the channel region of a p-type transistor in the p-type region 50P, thereby forming a CMOS inverter of an SRAM cell. Utilizing the gate structures 150 to connect the gates of the nano-FETs in lieu of overlying interconnects may allow for a reduction in the quantity of interconnects. Further, the portions of the gate structures 150 used to connect the adjacent nano-FETs (e.g., the fill layers 144B) may be formed of a low-resistance conductive material, which can reduce short channel effects and leakage in the resulting devices, particularly during subthreshold operation, increasing device performance FIGS. 32A-32B are cross-sectional views of nano-FETs, in accordance with some other embodiments. This embodiment is similar to the embodiment of FIGS. 29A-29B, except the gate masks 156 are omitted. Thus, the fill layers 144B of the gate electrodes 154 fill the lower and upper portions of the recesses 146 (see FIGS. 25A-25B). Thus, the top surfaces of the gate spacers 122, the CESL 132, the first ILD 134, and the fill layers 144B are coplanar (within process variations).

Figure 33:
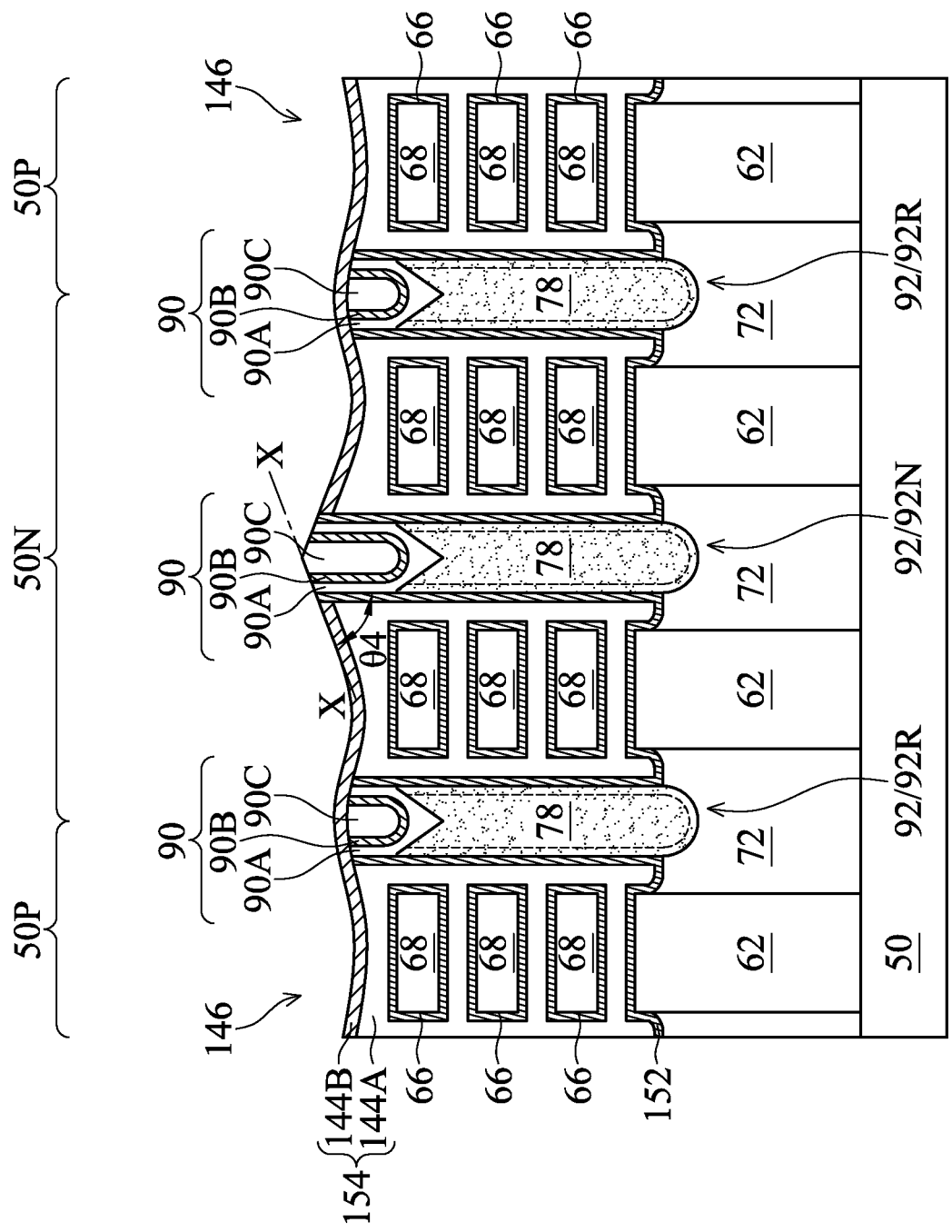
FIG. 33 is a view of an intermediate stage in the manufacturing of nano-FETs, in accordance with some embodiments.

FIG. 33 is a view of an intermediate stage in the manufacturing of nano-FETs, in accordance with some embodiments. FIG. 33 shows a similar intermediate stage of manufacture as FIG. 26A. Additionally, FIG. 33 shows the first insulating layer 90A, the second insulating layer 90B, and the third insulating layer 90C of the insulating fins 92. This embodiment is similar to the embodiment described for FIGS. 26A-26B, except the top surfaces of the gate electrodes 154 and the insulating fins 92 are contoured (e.g., not coplanar), such that the insulating layer(s) 90 have convex top surfaces as described for FIGS. 30A-31C. Similar to the previously described embodiments, the insulating fins 92N are tall enough that adjacent fill layers 144B may extend up along portions of the sidewalls of the insulating fins 92N, but may not merge in areas over the insulating fins 92N. In some embodiments, a top surface of a fill layer 144B may be substantially aligned (within process variations) with the top surfaces of the insulating layer(s) 90 of an insulating fin 92N. Those top surfaces are aligned in a plane (illustrated by a line X-X') that forms an angle $\theta_4$ with a sidewall of the insulating fin 92N. In some embodiments, the angle $\theta_4$ is in the range of 10 degrees to 40 degrees. After the structure of FIG. 33 is formed, appropriate further processing steps as previously described may be performed to complete formation of the nano-FETs.

In an embodiment, a device includes: a first insulating fin; a second insulating fin; a nanostructure between the first insulating fin and the second insulating fin; and a gate structure wrapping around the nanostructure, a top surface of the gate structure disposed above a top surface of the first insulating fin, the top surface of the gate structure disposed below a top surface of the second insulating fin. In some embodiments of the device, the first insulating fin has a first height above the nanostructure, the second insulating fin has a second height above the nanostructure, and the second height is greater than the first height. In some embodiments of the device, the gate structure includes: a work function tuning layer around the nanostructure; and a fill layer on the work function tuning layer, the fill layer extending continuously across a top surface of the work function tuning layer and the top surface of the first insulating fin, a top surface of the fill layer disposed below the top surface of the second insulating fin. In some embodiments of the device, the fill layer is disposed on a sidewall of the second insulating fin. In some embodiments, the device further includes: a gate mask on the fill layer; and a contact extending through the gate mask to contact the fill layer. In some embodiments of the device, the first insulating fin has a first upper portion and a first lower portion, the first lower portion having a first concave top surface, a first lowest point of the first concave top surface being below a bottom surface of the nanostructure, and the second insulating fin has a second upper portion and a second lower portion, the second lower portion having a second concave top surface, a second lowest point of the second concave top surface being below the bottom surface of the nanostructure.

In an embodiment, a device includes: a first nanostructure; a second nanostructure; an insulating fin between the first nanostructure and the second nanostructure; and a gate structure including: a first work function tuning layer around the first nanostructure; a second work function tuning layer around the second nanostructure; and a fill layer connecting the first work function tuning layer to the second work function tuning layer, the fill layer extending continuously across a top surface of the first work function tuning layer, a top surface of the second work function tuning layer, and a top surface of the insulating fin. In some embodiments of the device, the insulating fin includes: a lower insulating layer having a concave top surface; and an upper insulating layer on the concave top surface of the lower insulating layer. In some embodiments of the device, the insulating fin includes: a lower insulating layer having a flat top surface; and an upper insulating layer on the flat top surface of the lower insulating layer. In some embodiments of the device, the insulating fin includes: a lower insulating layer; and an upper insulating layer on the lower insulating layer, the upper insulating layer including: a first high-k dielectric layer; a low-k dielectric layer on the first high-k dielectric layer; and a second high-k dielectric layer on the low-k dielectric layer. In some embodiments of the device, the insulating fin includes: a lower insulating layer; and an upper insulating layer on the lower insulating layer, the upper insulating layer including a single high-k dielectric layer. In some embodiments of the device, the insulating fin includes: a lower insulating layer; and an upper insulating layer on the lower insulating layer, a lowest point of a bottom surface of the upper insulating layer being disposed beneath a bottom surface of the first nanostructure and a bottom surface of the second nanostructure.

In an embodiment, a method includes: forming a nanostructure; forming a first insulating fin and a second insulating fin adjacent to the nanostructure; recessing a first top surface of the first insulating fin below a second top surface of the second insulating fin; and forming a gate structure on the first top surface of the first insulating fin and around the nanostructure. In some embodiments of the method, forming the gate structure includes: forming a work function tuning layer on the first insulating fin, on the second insulating fin, and around the nanostructure; recessing a third top surface of the work function tuning layer below the second top surface of the second insulating fin; and depositing a fill layer on the third top surface of the work function tuning layer and on the first top surface of the first insulating fin. In some embodiments of the method, the third top surface of the work function tuning layer is recessed to be flush with the first top surface of the first insulating fin. In some embodiments of the method, the third top surface of the work function tuning layer is recessed below the first top surface of the first insulating fin. In some embodiments of the method, depositing the fill layer includes selectively depositing fluorine-free tungsten on the work function tuning layer. In some embodiments of the method, recessing the first top surface of the first insulating fin below the second top surface of the second insulating fin includes: depositing a mask layer on the first insulating fin and the second insulating fin; patterning the mask layer to have a portion covering the second insulating fin and to not have portions covering the first insulating fin; and etching the first insulating fin using the mask layer as an etching mask. In some embodiments of the method, patterning the mask layer includes: patterning a recess in the mask layer, the recess overlapping the first insulating fin; and thinning the mask layer. In some embodiments, the method further includes: forming a source/drain region adjacent a channel region of the nanostructure, the source/drain region contacting a sidewall of the first insulating fin and a sidewall of the second insulating fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a nanostructure;
   forming a first insulating fin and a second insulating fin adjacent to the nanostructure;
   recessing a first top surface of the first insulating fin below a second top surface of the second insulating fin; and
   forming a gate structure on the first top surface of the first insulating fin and around the nanostructure.

2. The method of claim 1, wherein forming the gate structure comprises:
   forming a work function tuning layer on the first insulating fin, on the second insulating fin, and around the nanostructure;
   recessing a third top surface of the work function tuning layer below the second top surface of the second insulating fin; and
   depositing a fill layer on the third top surface of the work function tuning layer and on the first top surface of the first insulating fin.

3. The method of claim 2, wherein the third top surface of the work function tuning layer is recessed to be flush with the first top surface of the first insulating fin.

4. The method of claim 2, wherein the third top surface of the work function tuning layer is recessed below the first top surface of the first insulating fin.

5. The method of claim 2, wherein depositing the fill layer comprises selectively depositing fluorine-free tungsten on the work function tuning layer.

6. The method of claim 1, wherein recessing the first top surface of the first insulating fin below the second top surface of the second insulating fin comprises:
   depositing a mask layer on the first insulating fin and the second insulating fin;
   patterning the mask layer to have a portion covering the second insulating fin and to not have portions covering the first insulating fin; and
   etching the first insulating fin using the mask layer as an etching mask.

7. The method of claim 6, wherein patterning the mask layer comprises:
   patterning a recess in the mask layer, the recess overlapping the first insulating fin; and
   thinning the mask layer.

8. The method of claim 1 further comprising:
   forming a source/drain region adjacent a channel region of the nanostructure, the source/drain region contacting a sidewall of the first insulating fin and a sidewall of the second insulating fin.

9. A method comprising:
   forming a first nanostructure and a second nanostructure;
   forming a first insulating fin between the first nanostructure and the second nanostructure;
   recessing the first insulating fin;
   growing a p-type source/drain region and an n-type source/drain region adjacent the first nanostructure and the second nanostructure, respectively, the first insulating fin disposed between the p-type source/drain region and the n-type source/drain region; and
   forming a gate structure on the first insulating fin, around the first nanostructure, and around the second nanostructure.

10. The method of claim 9, wherein forming the gate structure comprises:
    depositing a first work function material around the first nanostructure;
    depositing a second work function material around the second nanostructure, the second work function material being different from the first work function material; and
    depositing a fill layer on the first work function material and the second work function material.

11. The method of claim 9, further comprising:
    forming a third nanostructure; and
    forming a second insulating fin between the second nanostructure and the third nanostructure, wherein the first insulating fin is recessed to have a lesser height than the second insulating fin.

12. The method of claim 11, further comprising:
    planarizing a top surface of the gate structure to be coplanar with a top surface of the second insulating fin.

13. The method of claim 9, wherein the first insulating fin comprises a first layer and a second layer on the first layer, the first layer comprising a first dielectric material, the second layer comprising a second dielectric material.

14. The method of claim 13, wherein recessing the first insulating fin comprises recessing the second layer with an etching process that selectively etches the second dielectric material.

15. The method of claim 13, wherein the second dielectric material has a higher k-value than the first dielectric material.

16. A method comprising:
    forming a first nanostructure, a second nanostructure, and a third nanostructure;
    forming a first insulating fin and a second insulating fin, the first insulating fin formed between the first nanostructure and the second nanostructure, the second insulating fin formed between the second nanostructure and the third nanostructure;
    forming a mask covering the first insulating fin and exposing the second insulating fin;
    etching the second insulating fin using the mask, wherein after the etching the first insulating fin has a first height and the second insulating fin has a second height that is less than the first height; and
    removing the mask.

17. The method of claim 16, wherein the first insulating fin and the second insulating fin each comprise a first insulating layer and a second insulating layer on the first insulating layer, and wherein etching the second insulating fin comprises etching the second insulating layer of the second insulating fin.

18. The method of claim 17, wherein the second insulating layer has a higher dielectric constant than the first insulating layer.

19. The method of claim 16, wherein forming the mask comprises:
    depositing a mask layer over the first insulating fin and the second insulating fin;
    forming a recess in the mask layer over the second insulating fin by performing a first etching process, the recess extending only partially through the mask layer; and after forming the recess, thinning the mask layer until the recess exposes the second insulating fin by performing a second etching process, the second etching process being different from the first etching process.

20. The method of claim 16, further comprising:
forming a first gate structure and a second gate structure, the first gate structure disposed around the first nanostructure, the second gate structure disposed around the second nanostructure and the third nanostructure, the first gate structure separated from the second gate structure by the first insulating fin, the second gate structure extending over the second insulating fin.

\* \* \* \* \*